United States Patent
Hino et al.

(10) Patent No.: US 12,527,224 B2
(45) Date of Patent: Jan. 13, 2026

(54) PIEZOELECTRIC DEVICE

(71) Applicant: Murata Manufacturing Co., Ltd., Nagaokakyo (JP)

(72) Inventors: Ryunosuke Hino, Nagaokakyo (JP); Shinsuke Ikeuchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 730 days.

(21) Appl. No.: 17/986,941

(22) Filed: Nov. 15, 2022

(65) Prior Publication Data

US 2023/0106579 A1 Apr. 6, 2023

Related U.S. Application Data

(63) Continuation of application No. PCT/JP2021/021019, filed on Jun. 2, 2021.

(30) Foreign Application Priority Data

Jun. 4, 2020 (JP) ................................ 2020-097552

(51) Int. Cl.
*H10N 30/00* (2023.01)
*H10N 30/85* (2023.01)
*H10N 30/87* (2023.01)

(52) U.S. Cl.
CPC ......... *H10N 30/708* (2024.05); *H10N 30/852* (2023.02); *H10N 30/877* (2023.02)

(58) Field of Classification Search
CPC ............. H01L 27/3202; H01L 27/3204; H01L 27/3244–3279; H01L 51/0097; H01L 51/5237; H01L 21/566; H01L 27/1266
See application file for complete search history.

(56) References Cited

U.S. PATENT DOCUMENTS

2009/0322186 A1* 12/2009 Iwashita ............ H03H 9/02086
                                                           310/348
2021/0143315 A1* 5/2021 Kishimoto ............. H10N 30/87

FOREIGN PATENT DOCUMENTS

WO   2008/032543 A1   3/2008
WO   2017/218299 A1   12/2017
WO   2020/059200 A1   3/2020

OTHER PUBLICATIONS

Official Communication issued in International Patent Application No. PCT/JP2021/021019, mailed on Aug. 31, 2021.

* cited by examiner

*Primary Examiner* — Shafiq Mian
(74) *Attorney, Agent, or Firm* — Keating & Bennett, LLP

(57) ABSTRACT

A piezoelectric device includes a membrane portion including a through slot extending through the membrane portion in an up-down direction. A width of the through slot in a single crystal piezoelectric material layer becomes narrower as the through slot extends downward. In the single crystal piezoelectric material layer and a reinforcing layer, a maximum width of the through slot in a layer located on a bottom side is smaller than a minimum width of the through slot in a layer located on a top side.

20 Claims, 29 Drawing Sheets

PIEZOELECTRIC DEVICE

CROSS REFERENCE TO RELATED APPLICATIONS

This application claims the benefit of priority to Japanese Patent Application No. 2020-097552 filed on Jun. 4, 2020 and is a Continuation Application of PCT Application No. PCT/JP2021/021019 filed on Jun. 2, 2021. The entire contents of each application are hereby incorporated herein by reference.

BACKGROUND OF THE INVENTION

1. Field of the Invention

The present invention relates to a piezoelectric device.

2. Description of the Related Art

WO 2017/218299 A discloses a configuration of a piezoelectric device. A piezoelectric device described in WO 2017/218299 A includes a substrate and a membrane portion. The substrate has an opening that passes through the substrate. The membrane portion is formed from at least one elastic layer and at least one piezoelectric layer sandwiched between a top electrode layer and a bottom electrode layer. The membrane portion is attached to the substrate over the opening. The membrane portion proximate to an edge of the opening has through slots formed by etching.

When viscous drag of fluid passing through the through slots is large upon up-and-down vibration of the membrane portion, the excitation efficiency of the piezoelectric device decreases.

SUMMARY OF THE INVENTION

Preferred embodiments of the present invention provide piezoelectric devices each having high excitation efficiency.

A piezoelectric device according to a preferred embodiment of the present invention includes a base portion and a multilayer portion. The base portion includes a first principal surface and a second principal surface located on an opposite side of the first principal surface, and includes an opening extending through the base portion from the first principal surface to the second principal surface. The multilayer portion is laminated on a side of the first principal surface of the base portion, and covers the opening from above. The multilayer portion includes, at least above the opening, a single crystal piezoelectric material layer, a top electrode layer on a top side of the single crystal piezoelectric material layer, a bottom electrode layer that faces at least a portion of the top electrode layer with the single crystal piezoelectric material layer sandwiched between the bottom electrode layer and the top electrode layer, and a reinforcing layer that sandwiches the top electrode layer or the bottom electrode layer with the single crystal piezoelectric material layer, and includes a membrane portion, the membrane portion being a portion covering the opening. The membrane portion includes a through slot that passes through the membrane portion in an up-down direction. A width of the through slot in the single crystal piezoelectric material layer becomes narrower as the through slot extends downward. In the single crystal piezoelectric material layer and the reinforcing layer, a maximum width of the through slot in a layer located on a bottom side is smaller than a minimum width of the through slot in a layer located on a top side.

According to preferred embodiments of the present invention, the excitation efficiency of the piezoelectric devices is able to be increased.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
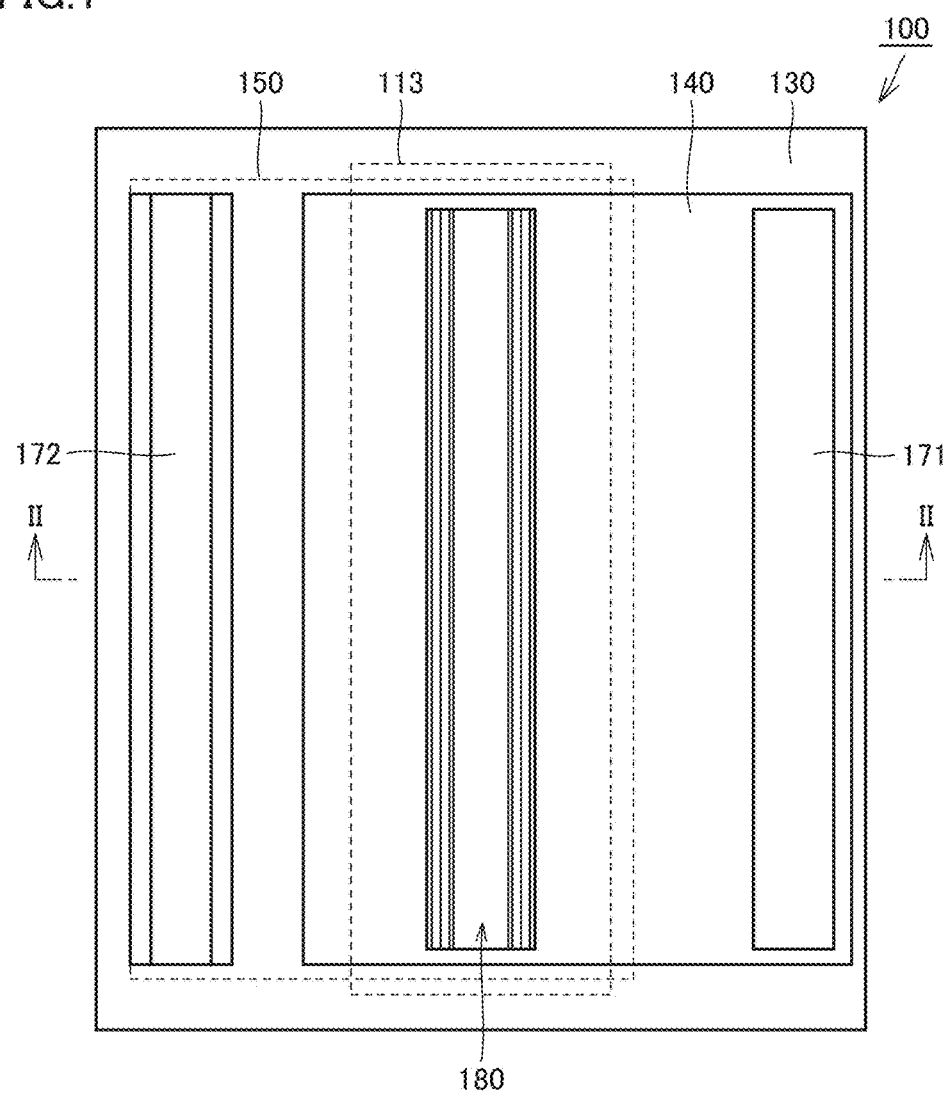
FIG. 1 is a plan view of a piezoelectric device according to a first preferred embodiment of the present invention.

Piezoelectric devices according to preferred embodiments of the present invention will be described below with reference to the drawings. In the following description of the preferred embodiments, the same or corresponding portions in the drawings are given the same reference signs and description thereof is not repeated.

First Preferred Embodiment

Figure 2:
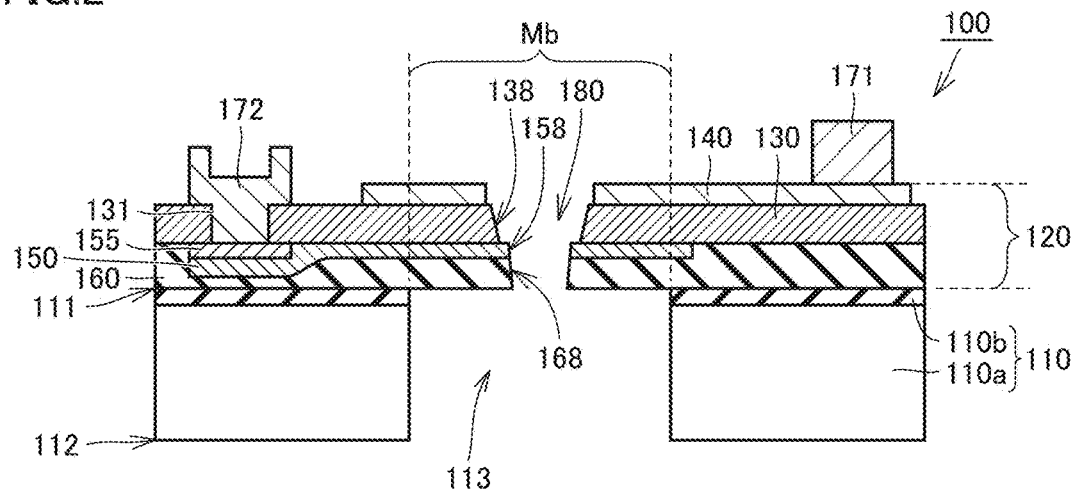
FIG. 2 is a cross-sectional view of the piezoelectric device of FIG. 1 when viewed in an arrow direction indicated by line II-II.

FIG. 1 is a plan view of a piezoelectric device according to a first preferred embodiment of the present invention. FIG. 2 is a cross-sectional view of the piezoelectric device of FIG. 1 when viewed in an arrow direction indicated by line II-II. In FIG. 1, components inside the piezoelectric device are indicated by dotted lines. As shown in FIGS. 1 and 2, a piezoelectric device 100 according to the first preferred embodiment of the present invention includes a base portion 110 and a multilayer portion 120.

Base portion 110 includes a first principal surface 111 and a second principal surface 112 located on an opposite side of first principal surface 111. Base portion 110 includes an opening 113 that passes therethrough from first principal surface 111 to second principal surface 112. Opening 113 is covered from above with multilayer portion 120 laminated on a first principal surface 111 side of base portion 110.

In the present preferred embodiment, base portion 110 includes a body base portion 110a and a surface base portion 110b that covers a top surface of body base portion 110a. In the present preferred embodiment, for example, body base portion 110a is made of Si and surface base portion 110b is made of $SiO_2$. However, a material of body base portion 110a is not limited to Si, and a material of surface base portion 110b is not limited to $SiO_2$.

Multilayer portion 120 includes, at least above opening 113, a single crystal piezoelectric material layer 130, a top electrode layer 140, a bottom electrode layer 150, and a reinforcing layer 160.

Multilayer portion 120 includes a membrane portion Mb which is a portion that covers opening 113. Membrane portion Mb is a portion of multilayer portion 120 located on an inner side of an opening edge of opening 113 when viewed in a direction orthogonal or substantially orthogonal to one principal surface 111. Membrane portion Mb is provided with a through slot 180 that passes through membrane portion Mb in an up-down direction.

Single crystal piezoelectric material layer 130 is located closer to a top side than base portion 110. A portion of single crystal piezoelectric material layer 130 is located above opening 113. Each of a top surface and a bottom surface of single crystal piezoelectric material layer 130 is flat.

Single crystal piezoelectric material layer 130 includes a hole 131. Hole 131 passes through single crystal piezoelectric material layer 130 from top to bottom. In the present preferred embodiment, hole 131 is located above one principal surface 111 of base portion 110 and is not located above opening 113.

Single crystal piezoelectric material layer 130 is made of, for example, lithium tantalate or lithium niobate. Single crystal piezoelectric material layer 130 made of lithium tantalate or lithium niobate has a uniform polarization state.

Top electrode layer 140 is disposed on a top side of single crystal piezoelectric material layer 130. A portion of top electrode layer 140 is located above opening 113. In the present preferred embodiment, top electrode layer 140 is disposed on a top side of a portion of single crystal piezoelectric material layer 130. Top electrode layer 140 is made of, for example, a metal such as Al or Pt. An adhesion layer made of, for example, Ti or the like may be disposed between top electrode layer 140 and single crystal piezoelectric material layer 130.

Bottom electrode layer 150 faces at least a portion of top electrode layer 140 with single crystal piezoelectric material layer 130 sandwiched therebetween. In the present preferred embodiment, a portion of bottom electrode layer 150 faces a portion of top electrode layer 140 with single crystal piezoelectric material layer 130 sandwiched therebetween. The portion of bottom electrode layer 150 is located above opening 113.

Another portion of bottom electrode layer 150 is located below hole 131 in single crystal piezoelectric material layer 130. In the present preferred embodiment, another portion of bottom electrode layer 150 is connected to single crystal piezoelectric material layer 130 with an adhesion layer 155 interposed therebetween. Adhesion layer 155 covers hole 131 of single crystal piezoelectric material layer 130 from below. Adhesion layer 155 does not necessarily need to be provided. When adhesion layer 155 is not provided, another portion of bottom electrode layer 150 directly covers hole 131 from below.

Bottom electrode layer 150 is made of, for example, a metal such as Al or Pt. A material of adhesion layer 155 is not particularly limited as long as the material has conductivity and adhesion. Adhesion layer 155 is made of, for example, Ti, Cr, Ni, or NiCr.

Reinforcing layer 160 sandwiches top electrode layer 140 or bottom electrode layer 150 with single crystal piezoelectric material layer 130. In the present preferred embodiment, reinforcing layer 160 is closer to the bottom than single crystal piezoelectric material layer 130. Reinforcing layer 160 sandwiches bottom electrode layer 150 with single crystal piezoelectric material layer 130. Reinforcing layer 160 is in contact with each of a bottom surface of bottom electrode layer 150 and a portion of the bottom surface of single crystal piezoelectric material layer 130 that is not covered with bottom electrode layer 150.

A portion of reinforcing layer 160 is located above opening 113. The portion of reinforcing layer 160 covers opening 113. A portion of reinforcing layer 160 that does not cover opening 113 and base portion 110 are directly connected to each other. The portion of reinforcing layer 160 that does not cover opening 113 and base portion 110 may not be directly connected to each other. The portion of reinforcing layer 160 that does not cover opening 113 and base portion 110 may be connected to each other with a metal layer interposed therebetween.

In the present preferred embodiment, reinforcing layer 160 is made of, for example, $Si_3N_4$. A material of reinforcing layer 160 is not limited to $Si_3N_4$ and may be other insulating materials. For example, reinforcing layer 160 may be made of an organic material having electrical insulating properties and thermal insulation properties.

As shown in FIGS. 1 and 2, piezoelectric device 100 further includes a first lead wiring line 171 and a second lead wiring line 172. First lead wiring line 171 is laminated on a top side of a portion of top electrode layer 140. Second lead wiring line 172 is laminated on a top side of each of a portion of single crystal piezoelectric material layer 130 and adhesion layer 155. In hole 131, second lead wiring line 172 is laminated on a top side of bottom electrode layer 150 with adhesion layer 155 interposed therebetween.

As such, multilayer portion 120 includes, at least above opening 113, single crystal piezoelectric material layer 130, top electrode layer 140, bottom electrode layer 150, and reinforcing layer 160.

In the present preferred embodiment, an outside shape of opening 113 when viewed in a direction orthogonal or substantially orthogonal to one principal surface 111 is rectangular or substantially rectangular. However, the outside shape of opening 113 when viewed in a direction orthogonal or substantially orthogonal to one principal surface 111 is not limited to rectangular or substantially rectangular, and may be polygonal other than rectangular, substantially rectangular, circular or substantially circular.

By the above-described configuration, by application of a voltage between top electrode layer 140 and bottom electrode layer 150, membrane portion Mb vibrates up and down in a bending manner according to expansion and contraction of single crystal piezoelectric material layer 130.

As described above, membrane portion Mb is provided with through slot 180 that passes through membrane portion Mb in the up-down direction. The width of through slot 180 becomes narrower as through slot 180 extends downward in each of single crystal piezoelectric material layer 130 and reinforcing layer 160.

In single crystal piezoelectric material layer 130 and reinforcing layer 160, the maximum width of through slot 180 in a layer located on the bottom side is smaller than the minimum width of through slot 180 in a layer located on the top side. In the present preferred embodiment, reinforcing layer 160 is the layer located on the bottom side, and single crystal piezoelectric material layer 130 is the layer located on the top side. The maximum width of through slot 180 in reinforcing layer 160 is smaller than the minimum width of through slot 180 in single crystal piezoelectric material layer 130.

Specifically, single crystal piezoelectric material layer 130 has edge surfaces 138 that are in contact with through slot 180. Reinforcing layer 160 has edge surfaces 168 that are in contact with through slot 180. Bottom electrode layer 150 sandwiched between single crystal piezoelectric material layer 130 and reinforcing layer 160 has edge surfaces 158.

In the present preferred embodiment, edge surfaces 138 are top-side edge surfaces, edge surfaces 168 are bottom-side edge surfaces, and edge surfaces 158 are intermediate edge surfaces. The inclination angle of edge surfaces 138 which are the top-side edge surfaces is smaller than the inclination angle of edge surfaces 168 which are the bottom-side edge surfaces. Namely, the minimum width of through slot 180 in single crystal piezoelectric material layer 130 is the width of through slot 180 at the locations of bottom edges of edge surfaces 138 of single crystal piezoelectric material layer 130. The maximum width of through slot 180 in reinforcing layer 160 is the width of through slot 180 at the locations of top edges of edge surfaces 168 of reinforcing layer 160.

Edge surface 158 which is an intermediate edge surface is located on a plane extending from edge surface 168 which is a bottom-side edge surface, and continues with edge surface 168. A step is provided between edge surface 138 which is a top-side edge surface and edge surface 158 which is an intermediate edge surface. A bottom edge of edge surface 138 which is a top-side edge surface is located on a top surface of bottom electrode layer 150. A portion of the top surface of bottom electrode layer 150 adjacent to through slot 180 is exposed.

As shown in FIG. 2, the width of through slot 180 becomes narrower as through slot 180 extends from its top edge to bottom edge. The width of through slot 180 may gradually become narrower as through slot 180 extends from its top edge to bottom edge. Namely, through slot 180 may include a portion having the same or substantially the same width as through slot 180 extends from its top edge to bottom edge. In the present preferred embodiment, a portion of through slot 180 from the location of a top edge of top electrode layer 140 to the location of a bottom edge of top electrode layer 140 in the up-down direction has the same or substantially the same width. A portion of through slot 180 from the location of a top edge of bottom electrode layer 150 to the location of a bottom edge of bottom electrode layer 150 in the up-down direction may have the same or substantially the same width. In this case, the inclination angle of edge surfaces 158 of bottom electrode layer 150 is, for example, about 90°.

Through slot 180 is narrowest at its edge portion on an opening 113 side. Namely, through slot 180 is narrowest at the locations of bottom edges of edge surfaces 168 of reinforcing layer 160 in the up-down direction.

A non-limiting example of a method of manufacturing a piezoelectric device according to the first preferred embodiment of the present invention will be described below.

Figure 3:
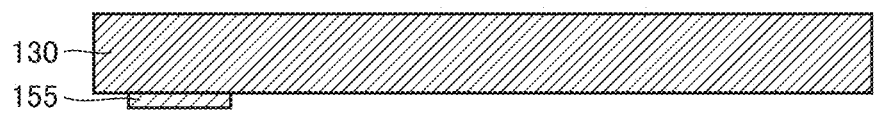
FIG. 3 is a cross-sectional view showing a state in which an adhesion layer is provided on a bottom surface of a single crystal piezoelectric material layer in a method of manufacturing a piezoelectric device according to the first preferred embodiment of the present invention.

FIG. 3 is a cross-sectional view showing a state in which an adhesion layer is provided on a bottom surface of a single crystal piezoelectric material layer in the method of manufacturing a piezoelectric device according to the first preferred embodiment of the present invention. The thickness of a single crystal piezoelectric material layer 130 upon formation is thicker than the thickness of single crystal piezoelectric material layer 130 that is finally included in a piezoelectric device 100 according to the present preferred embodiment.

As shown in FIG. 3, an adhesion layer 155 is provided on a bottom surface of single crystal piezoelectric material layer 130 by, for example, a lift-off process, a plating process, an etching process, or the like.

Figure 4:
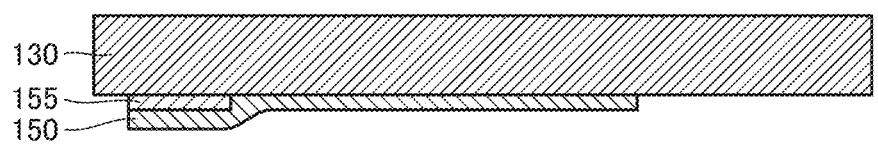
FIG. 4 is a cross-sectional view showing a state in which a bottom electrode layer is provided on a bottom surface of each of the adhesion layer and the single crystal piezoelectric material layer in the method of manufacturing a piezoelectric device according to the first preferred embodiment of the present invention.

FIG. 4 is a cross-sectional view showing a state in which a bottom electrode layer is provided on a bottom surface of each of the adhesion layer and the single crystal piezoelectric material layer in the method of manufacturing a piezoelectric device according to the first preferred embodiment of the present invention. As shown in FIG. 4, a bottom electrode layer 150 is provided on the entire or substantially the entire bottom surface of adhesion layer 155 and a portion of the bottom surface of the single crystal piezoelectric material layer 130 by, for example, a lift-off process, a plating process, an etching process, or the like.

Figure 5:
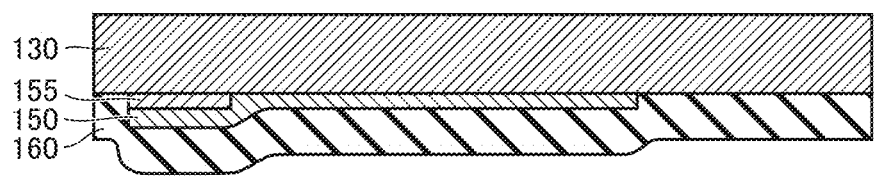
FIG. 5 is a cross-sectional view showing a state in which a reinforcing layer is provided on a bottom surface of each of the bottom electrode layer and the single crystal piezoelectric material layer in the method of manufacturing a piezoelectric device according to the first preferred embodiment of the present invention.

FIG. 5 is a cross-sectional view showing a state in which a reinforcing layer is provided on a bottom surface of each of the bottom electrode layer and the single crystal piezoelectric material layer in the method of manufacturing a piezoelectric device according to the first preferred embodiment of the present invention. As shown in FIG. 5, a reinforcing layer 160 is provided on a bottom surface of each of bottom electrode layer 150 and single crystal piezoelectric material layer 130 by, for example, a chemical vapor deposition (CVD) process, a physical vapor deposition (PVD) process, or the like.

Figure 6:
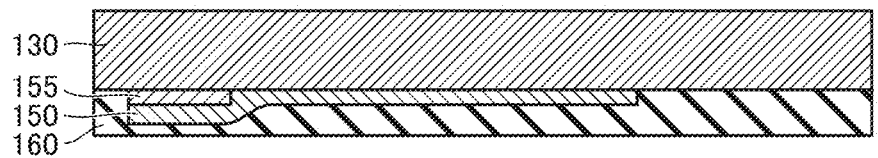
FIG. 6 is a cross-sectional view showing a state in which a bottom surface of the reinforcing layer is flattened in the method of manufacturing a piezoelectric device according to the first preferred embodiment of the present invention.

FIG. 6 is a cross-sectional view showing a state in which a bottom surface of the reinforcing layer is flattened in the method of manufacturing a piezoelectric device according to the first preferred embodiment of the present invention. As shown in FIG. 6, a bottom surface of reinforcing layer 160 is flattened by, for example, chemical mechanical polishing (CMP) or the like.

Figure 7:
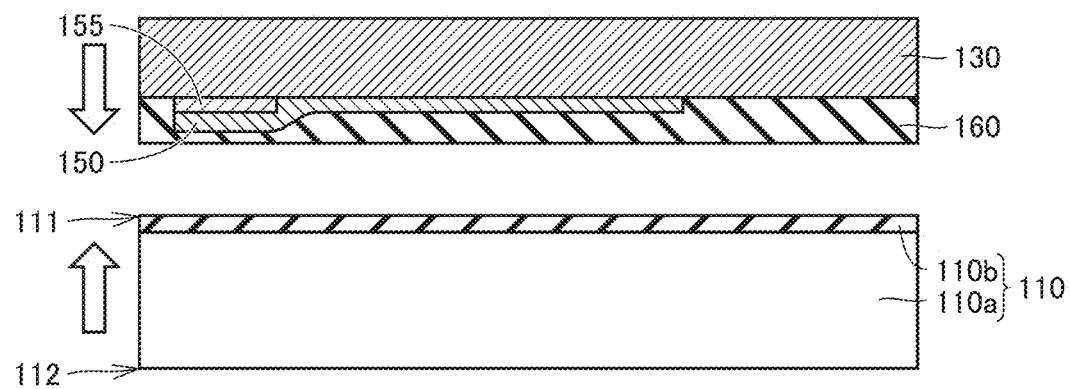
FIG. 7 is a cross-sectional view showing a state in which a base portion is to be bonded to the plurality of layers shown in FIG. 6 in the method of manufacturing a piezoelectric device according to the first preferred embodiment of the present invention.
Figure 8:
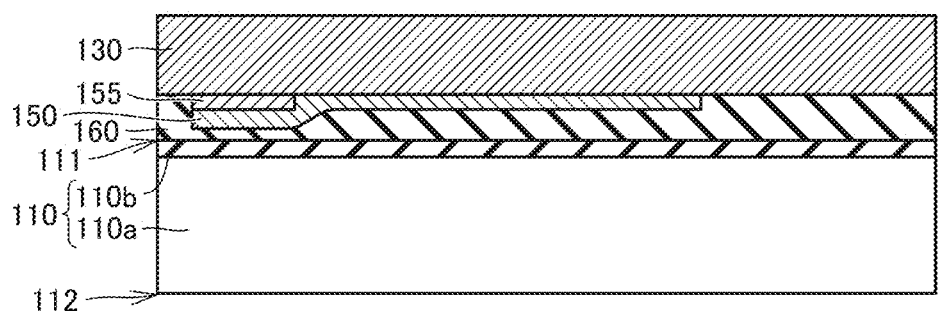
FIG. 8 is a cross-sectional view showing a state in which the base portion has been bonded to the bottom surface of the reinforcing layer in the method of manufacturing a piezoelectric device according to the first preferred embodiment of the present invention.

FIG. 7 is a cross-sectional view showing a state in which a base portion is to be bonded to the plurality of layers shown in FIG. 6 in the method of manufacturing a piezoelectric device according to the first preferred embodiment of the present invention. FIG. 8 is a cross-sectional view showing a state in which the base portion has been bonded to the bottom surface of the reinforcing layer in the method of manufacturing a piezoelectric device according to the first preferred embodiment of the present invention.

As shown in FIGS. 7 and 8, a base portion 110 includes a body base portion 110a and a surface base portion 110b that covers a top surface of body base portion 110a. Surface base portion 110b is formed by, for example, thermally oxidizing the top surface of body base portion 110a. A substrate which is base portion 110 and in which an opening 113 is not formed is bonded to the bottom surface of reinforcing layer 160 by, for example, surface activated bonding, atomic diffusion bonding, or the like.

Figure 9:
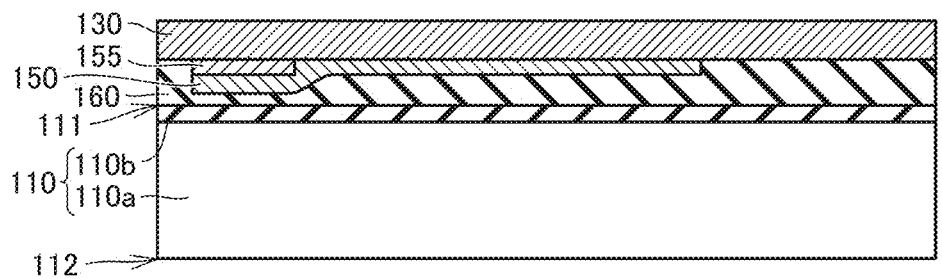
FIG. 9 is a cross-sectional view showing a state in which a top surface of the single crystal piezoelectric material layer is removed in the method of manufacturing a piezoelectric device according to the first preferred embodiment of the present invention.

FIG. 9 is a cross-sectional view showing a state in which a top surface of the single crystal piezoelectric material layer is removed in the method of manufacturing a piezoelectric device according to the first preferred embodiment of the present invention. As shown in FIG. 9, by removing a top surface of single crystal piezoelectric material layer 130 by, for example, CMP or the like, single crystal piezoelectric material layer 130 has a desired thickness. By implanting ions in advance onto a top surface side of single crystal piezoelectric material layer 130, a release layer may be formed. In this case, by peeling off the release layer before cutting or removing by, for example, CMP or the like the top surface of single crystal piezoelectric material layer 130, thickness adjustment of single crystal piezoelectric material layer 130 becomes easier. The thickness of single crystal piezoelectric material layer 130 is adjusted so that desired excitation of single crystal piezoelectric material layer 130 by application of a voltage can be obtained.

Figure 10:
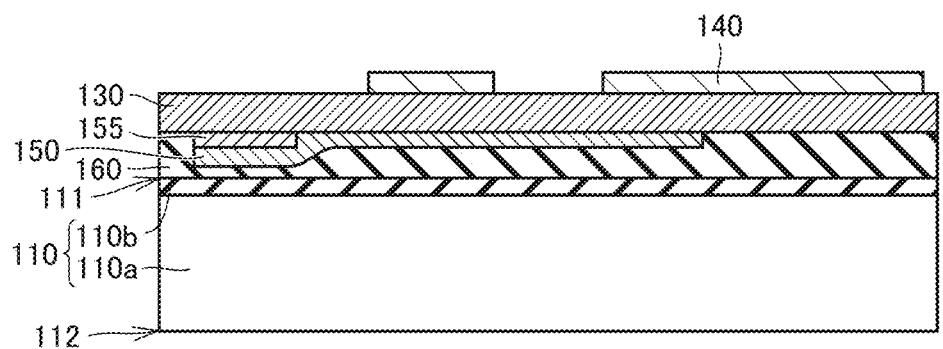
FIG. 10 is a cross-sectional view showing a state in which a top electrode layer is provided on the top surface of the single crystal piezoelectric material layer in the method of manufacturing a piezoelectric device according to the first preferred embodiment of the present invention.

FIG. 10 is a cross-sectional view showing a state in which a top electrode layer is provided on the top surface of the single crystal piezoelectric material layer in the method of manufacturing a piezoelectric device according to the first preferred embodiment of the present invention. As shown in FIG. 10, a top electrode layer 140 is provided on a portion of the top surface of single crystal piezoelectric material layer 130 by, for example, a lift-off process, a plating process, an etching process, or the like.

Figure 11:
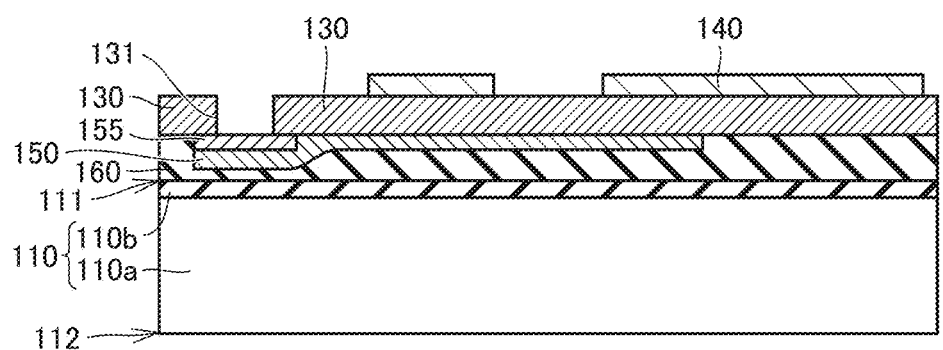
FIG. 11 is a cross-sectional view showing a state in which a hole is provided in the single crystal piezoelectric material layer in the method of manufacturing a piezoelectric device according to the first preferred embodiment of the present invention.

FIG. 11 is a cross-sectional view showing a state in which a hole is provided in the single crystal piezoelectric material layer in the method of manufacturing a piezoelectric device according to the first preferred embodiment of the present invention. As shown in FIG. 11, by etching a portion of single crystal piezoelectric material layer 130, a hole 131 is formed.

Figure 12:
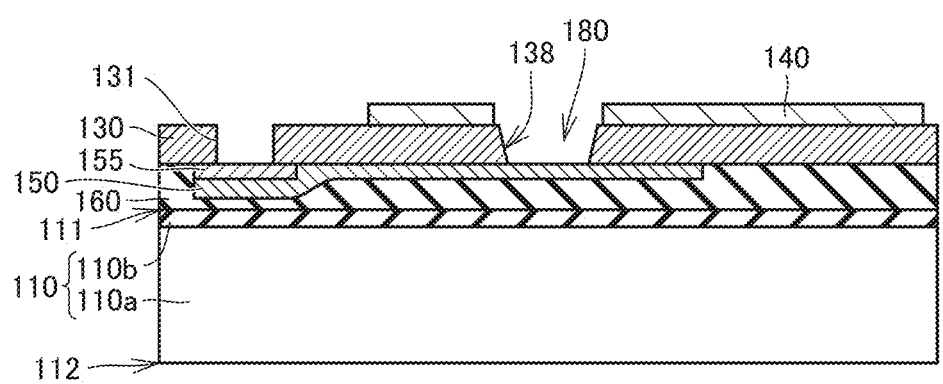
FIG. 12 is a cross-sectional view showing a state in which a through slot is provided in the single crystal piezoelectric material layer in the method of manufacturing a piezoelectric device according to the first preferred embodiment of the present invention.

FIG. 12 is a cross-sectional view showing a state in which a through slot is provided in the single crystal piezoelectric material layer in the method of manufacturing a piezoelectric device according to the first preferred embodiment of the present invention. As shown in FIG. 12, by etching single crystal piezoelectric material layer 130, a through slot 180 is formed in single crystal piezoelectric material layer 130. By this, edge surfaces 138 that are in contact with through slot 180 are formed in single crystal piezoelectric material layer 130.

Figure 13:
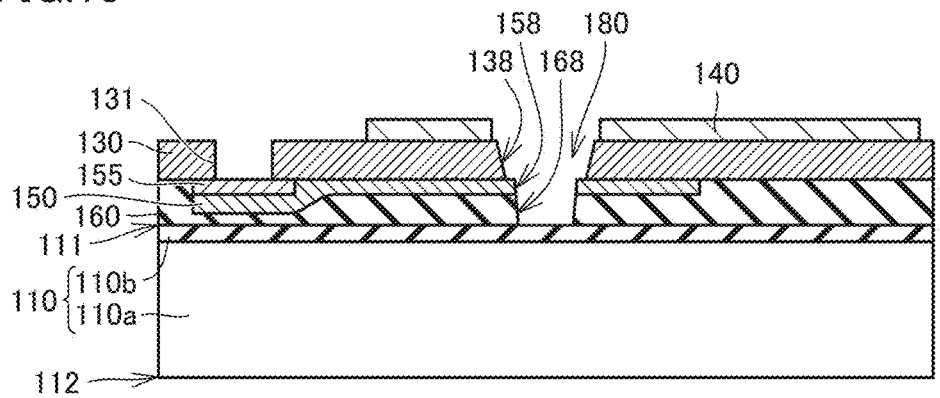
FIG. 13 is a cross-sectional view showing a state in which a through slot is provided so as to extend to the bottom surface of the reinforcing layer in the method of manufacturing a piezoelectric device according to the first preferred embodiment of the present invention.

FIG. 13 is a cross-sectional view showing a state in which a through slot is provided so as to extend to the bottom surface of the reinforcing layer in the method of manufacturing a piezoelectric device according to the first preferred embodiment of the present invention. As shown in FIG. 13, by etching bottom electrode layer 150 and reinforcing layer 160, a through slot 180 is formed in each of bottom electrode layer 150 and reinforcing layer 160. By this, edge surfaces 158 that are in contact with through slot 180 are formed in bottom electrode layer 150. Edge surfaces 168 that are in contact with through slot 180 are formed in reinforcing layer 160.

Figure 14:
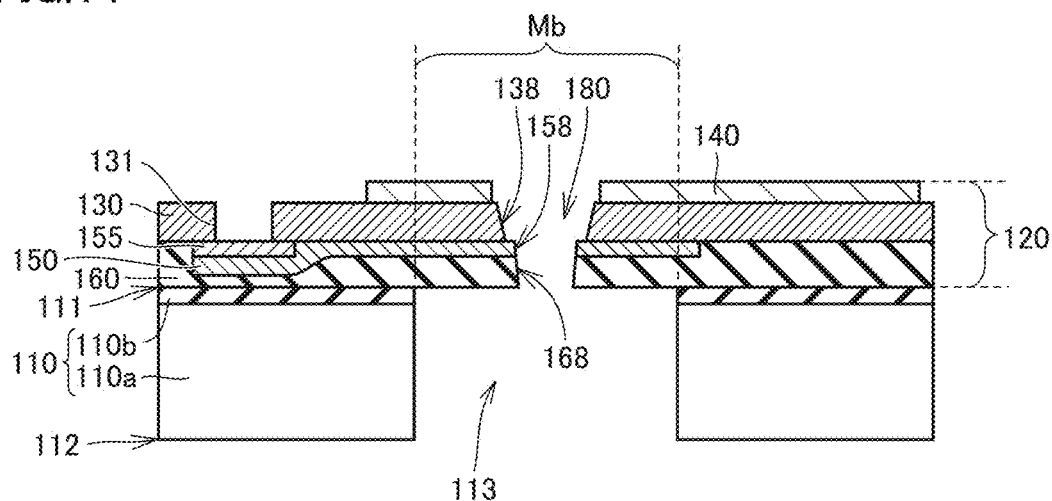
FIG. 14 is a cross-sectional view showing a state in which an opening is formed in the method of manufacturing a piezoelectric device according to the first preferred embodiment of the present invention.

FIG. 14 is a cross-sectional view showing a state in which an opening is formed in the method of manufacturing a piezoelectric device according to the first preferred embodiment of the present invention. As shown in FIG. 14, by performing, for example, deep reactive ion etching or the like on base portion 110 from another principal surface 112 side of base portion 110, an opening 113 is formed in base portion 110. By this, a membrane portion Mb is formed in piezoelectric device 100 according to the present preferred embodiment.

Finally, each of a first lead wiring line 171 and a second lead wiring line 172 is provided by, for example, a lift-off process, a plating process, an etching process, or the like. By the above-described processes, piezoelectric device 100 according to the first preferred embodiment of the present invention such as that shown in FIG. 2 is manufactured.

As described above, in piezoelectric device 100 according to the first preferred embodiment of the present invention, the width of through slot 180 becomes narrower as through slot 180 extends downward in each of single crystal piezoelectric material layer 130 and reinforcing layer 160. In single crystal piezoelectric material layer 130 and reinforcing layer 160, the maximum width of through slot 180 in a layer located on the bottom side is smaller than the minimum width of through slot 180 in a layer located on the top side.

By this, viscous drag of fluid passing through the through slot 180 that occurs upon up-and-down vibration of membrane portion Mb is reduced, enabling an increase in the excitation efficiency of piezoelectric device 100.

In the present preferred embodiment, while a wide width of a portion of through slot 180 in which single crystal piezoelectric material layer 130 is located is ensured, the width of a portion of through slot 180 in which reinforcing layer 160 is located can be narrowed. As a result, stress acting on single crystal piezoelectric material layer 130 when membrane portion Mb vibrates in a bending manner is reduced, enabling reduction or prevention of occurrence of interlayer peeling between single crystal piezoelectric material layer 130 and top electrode layer 140 and between single crystal piezoelectric material layer 130 and bottom electrode layer 150.

Furthermore, since the width of a portion of through slot 180 in which reinforcing layer 160 is located can be narrowed, it is possible to reduce or prevent occurrence of a reduction in characteristics of piezoelectric device 100 caused by the width of through slot 180 becoming too wide. For example, when piezoelectric device 100 is used as an acoustic device, it is possible to reduce or prevent a reduction in acoustic resistance caused by the width of through slot 180 becoming too wide.

In piezoelectric device 100 according to the present preferred embodiment, the inclination angle of edge surfaces 138 of single crystal piezoelectric material layer 130 which are top-side edge surfaces is smaller than the inclination angle of edge surfaces 168 of reinforcing layer 160 which are bottom-side edge surfaces. By this, viscous drag at edge surfaces 138 of single crystal piezoelectric material layer 130 can be effectively reduced.

In piezoelectric device 100 according to the present preferred embodiment, single crystal piezoelectric material layer 130 is made of, for example, lithium tantalate or lithium niobate. By this, the piezoelectric characteristics of piezoelectric device 100 can be improved.

Modifications of piezoelectric device 100 according to the first preferred embodiment of the present invention will be described below.

Figure 15:
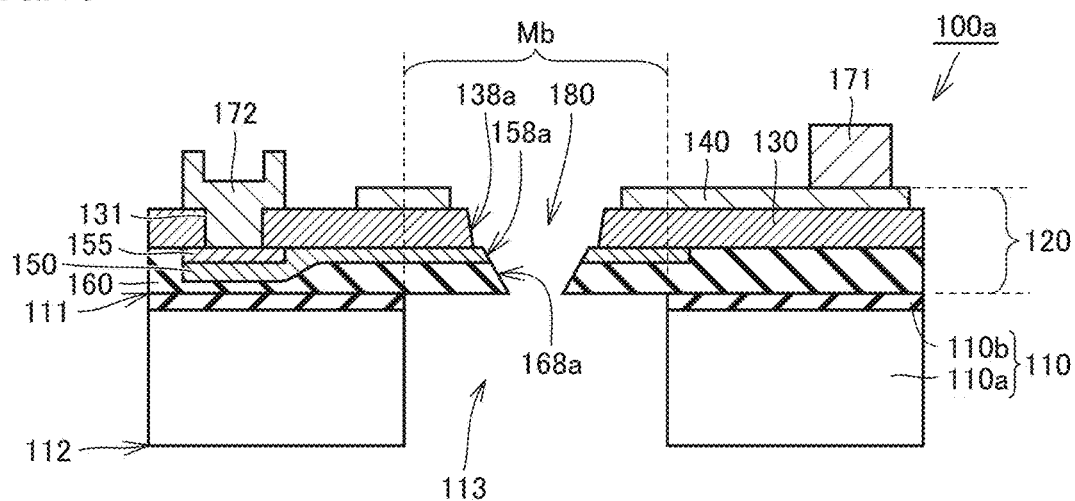
FIG. 15 is a cross-sectional view showing a configuration of a piezoelectric device according to a first modification of the first preferred embodiment of the present invention.

FIG. 15 is a cross-sectional view showing a configuration of a piezoelectric device according to a first modification of the first preferred embodiment of the present invention. FIG. 15 shows the same cross-sectional view as that of FIG. 2. As shown in FIG. 15, in a piezoelectric device 100a according to the first modification of the first preferred embodiment of the present invention, the inclination angle of edge surfaces 168a of reinforcing layer 160 which are bottom-side edge surfaces is smaller than the inclination angle of edge surfaces 138a of single crystal piezoelectric material layer 130 which are top-side edge surfaces. An edge surface 158a of bottom electrode layer 150 which is an intermediate edge surface is located on a plane extending from edge surface 168a which is a bottom-side edge surface, and continues with edge surface 168a. By this, viscous drag at edge surfaces 168a of reinforcing layer 160 can be effectively reduced.

Figure 16:
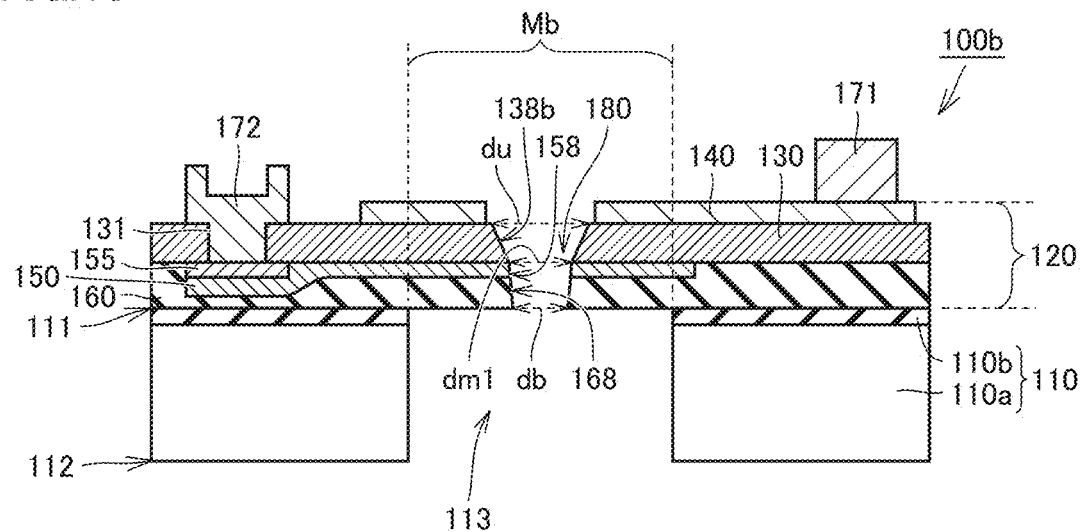
FIG. 16 is a cross-sectional view showing a configuration of a piezoelectric device according to a second modification of the first preferred embodiment of the present invention.

FIG. 16 is a cross-sectional view showing a configuration of a piezoelectric device according to a second modification of the first preferred embodiment of the present invention. FIG. 16 shows the same cross-sectional view as that of FIG. 2. As shown in FIG. 16, in a piezoelectric device 100b according to the second modification of the first preferred embodiment of the present invention, in single crystal piezoelectric material layer 130 and reinforcing layer 160, a bottom-side edge surface, which is in contact with through slot 180, of a layer located on the bottom side continues with a top-side edge surface, which is in contact with through slot 180, of a layer located on the top side, with an intermediate edge surface, which is in contact with through slot 180, of top electrode layer 140 or bottom electrode layer 150 interposed therebetween.

In the present modification, edge surface 168 of reinforcing layer 160 which is a bottom-side edge surface continues with an edge surface 138b of single crystal piezoelectric material layer 130 which is a top-side edge surface, with edge surface 158 of bottom electrode layer 150, which is an intermediate edge surface, interposed therebetween.

As shown in FIG. 16, in single crystal piezoelectric material layer 130 and reinforcing layer 160, the maximum width of through slot 180 in a layer located on the top side is du, the minimum width of through slot 180 in the layer located on the top side is dm1, and the minimum width of through slot 180 in a layer located on the bottom side is db. The inclination angle of the top-side edge surface is smaller than the inclination angle of the bottom-side edge surface. The relationship "du>dm1>db" is satisfied.

Figure 17:
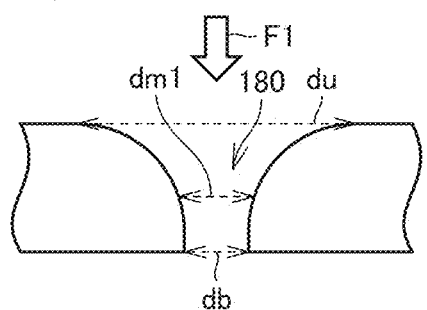
FIG. 17 is a schematic diagram of a shape of a longitudinal section of a through slot at a membrane portion of the piezoelectric device according to the second modification of the first preferred embodiment of the present invention.

FIG. 17 is a schematic diagram of a shape of a longitudinal section of the through slot at a membrane portion of the piezoelectric device according to the second modification of the first preferred embodiment of the present invention. As shown in FIG. 17, by the inclination angle of top-side edge surfaces being smaller than the inclination angle of bottom-side edge surfaces, viscous drag of fluid F1 that enters through slot 180 from the top side can be reduced.

By this, viscous drag of fluid passing through the through slot 180 that occurs upon up-and-down vibration of membrane portion Mb is effectively reduced, enabling an increase in the excitation efficiency of piezoelectric device 100b. Furthermore, stress concentration between single crystal piezoelectric material layer 130 and bottom electrode layer 150 is reduced, enabling reduction or prevention of occurrence of interlayer peeling between single crystal piezoelectric material layer 130 and bottom electrode layer 150.

Figure 18:
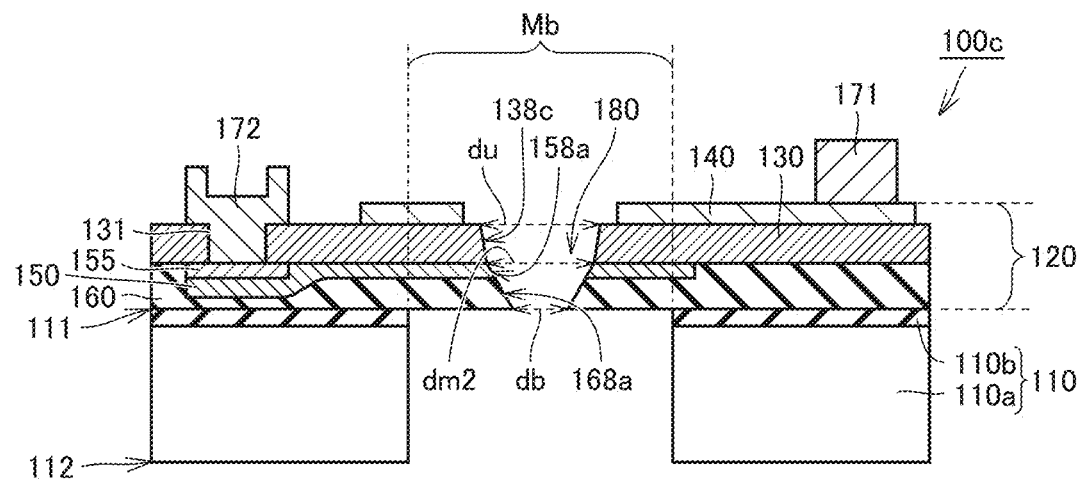
FIG. 18 is a cross-sectional view showing a configuration of a piezoelectric device according to a third modification of the first preferred embodiment of the present invention.

FIG. 18 is a cross-sectional view showing a configuration of a piezoelectric device according to a third modification of the first preferred embodiment of the present invention. FIG. 18 shows the same cross-sectional view as that of FIG. 2. As shown in FIG. 18, in a piezoelectric device 100c according to the third modification of the first preferred embodiment of the present invention, the inclination angle of edge surfaces 168a of reinforcing layer 160 which are bottom-side edge surfaces is smaller than the inclination angle of edge surfaces 138c of single crystal piezoelectric material layer 130 which are top-side edge surfaces. By this, viscous drag at edge surfaces 168a of reinforcing layer 160 can be effectively reduced.

In addition, edge surface 168a of reinforcing layer 160 which is a bottom-side edge surface continues with an edge surface 138c of single crystal piezoelectric material layer 130 which is a top-side edge surface, with edge surface 158a of bottom electrode layer 150, which is an intermediate edge surface, interposed therebetween.

As shown in FIG. 18, in single crystal piezoelectric material layer 130 and reinforcing layer 160, the maximum width of through slot 180 in a layer located on the top side is du, the minimum width of through slot 180 in the layer located on the top side is dm2, and the minimum width of through slot 180 in a layer located on the bottom side is db. The inclination angle of the bottom-side edge surface is smaller than the inclination angle of the top-side edge surface. The relationship "du>dm2>db" is satisfied.

Figure 19:
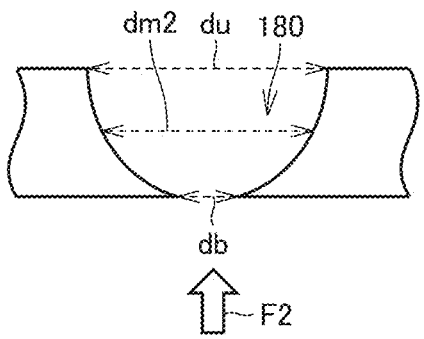
FIG. 19 is a schematic diagram of a shape of a longitudinal section of a through slot at a membrane portion of the piezoelectric device according to the third modification of the first preferred embodiment of the present invention.

FIG. 19 is a schematic diagram of a shape of a longitudinal section of the through slot at a membrane portion of the piezoelectric device according to the third modification of the first preferred embodiment of the present invention. As shown in FIG. 19, by the inclination angle of bottom-side edge surfaces being smaller than the inclination angle of top-side edge surfaces, viscous drag of fluid F2 that enters through slot 180 from the bottom side can be reduced.

By this, viscous drag of fluid passing through the through slot 180 that occurs upon up-and-down vibration of membrane portion Mb is effectively reduced, enabling an increase in the excitation efficiency of piezoelectric device 100c. Furthermore, stress concentration between single crystal piezoelectric material layer 130 and bottom electrode layer 150 is reduced, enabling reduction or prevention of occurrence of interlayer peeling between single crystal piezoelectric material layer 130 and bottom electrode layer 150.

As shown in FIGS. 17 and 19, when each of du which is the maximum width of through slot 180 in a layer located on the top side and db which is the minimum width of through slot 180 in a layer located on the bottom side is fixed at a certain dimension, the relationship "dm1<dm2" is satisfied. Namely, by adjusting the inclination angle of the top-side edge surfaces and the inclination angle of the bottom-side edge surfaces, a profile of a longitudinal section of through slot 180 can be controlled while a dimension between both edges in the up-down direction of through slot 180 is maintained. The dimension between both edges in the up-down direction of through slot 180 has a low degree of flexibility in terms of processing constraints and reduction or prevention of entry of foreign matter into through slot 180. Thus, by adjusting each of the inclination angle of the top-side edge surfaces and the inclination angle of the bottom-side edge surfaces while a dimension between both edges in the up-down direction of through slot 180 is maintained, viscous drag of fluid in through slot 180 can have a desired distribution while entry of foreign matter into through slot 180 is reduced or prevented.

Second Preferred Embodiment

A piezoelectric device according to a second preferred embodiment of the present invention will be described below with reference to drawings. The piezoelectric device according to the second preferred embodiment of the present invention differs from piezoelectric device 100 according to the first preferred embodiment of the present invention in configurations of a base portion and a reinforcing layer, and thus, description of the same or corresponding components as those of piezoelectric device 100 according to the first preferred embodiment of the present invention is not repeated.

Figure 20:
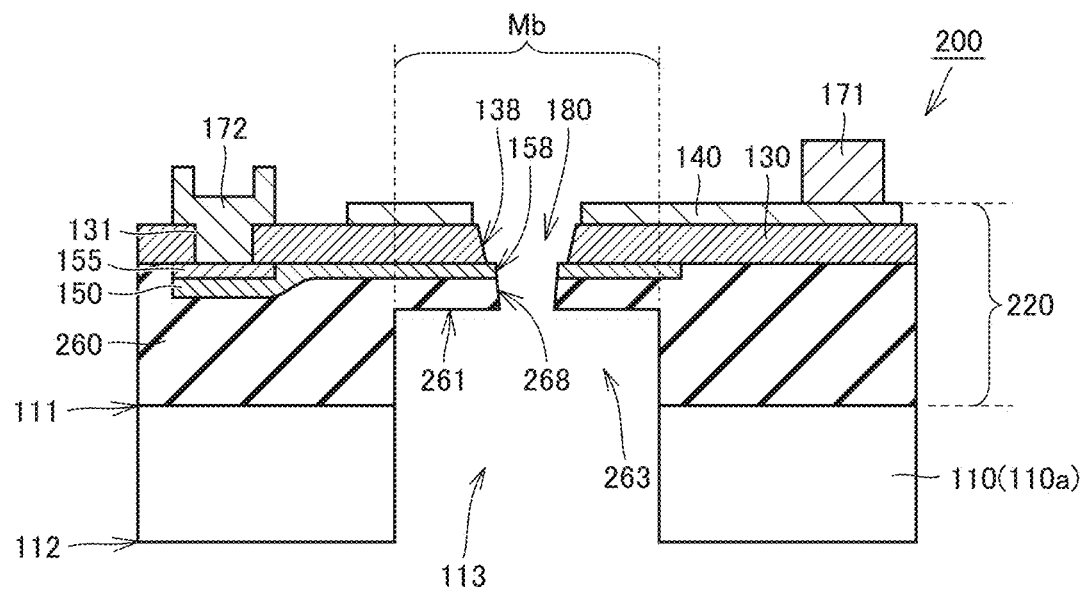
FIG. 20 is a cross-sectional view of a piezoelectric device according to a second preferred embodiment of the present invention.

FIG. 20 is a cross-sectional view of a piezoelectric device according to the second preferred embodiment of the present invention. FIG. 20 shows the same cross-sectional view as that of FIG. 2. As shown in FIG. 20, a piezoelectric device 200 according to the second preferred embodiment of the present invention includes a base portion 110 and a multilayer portion 220.

In the present preferred embodiment, base portion 110 includes only a body base portion 110a. An opening 113 of base portion 110 is covered from above with multilayer portion 220 laminated on a one principal surface 111 side of base portion 110.

Body base portion 110a is made of, for example, SiO$_2$. However, a material that makes up body base portion 110a is not limited to SiO$_2$.

Multilayer portion 220 includes, at least above opening 113, a single crystal piezoelectric material layer 130, a top electrode layer 140, a bottom electrode layer 150, and a reinforcing layer 260.

Multilayer portion 220 includes a membrane portion Mb which is a portion that covers opening 113. Membrane portion Mb is a portion of multilayer portion 220 located on an inner side of an opening edge of opening 113 when viewed in a direction orthogonal or substantially orthogonal to one principal surface 111. Membrane portion Mb is provided with a through slot 180 that passes through membrane portion Mb in the up-down direction.

Reinforcing layer 260 sandwiches bottom electrode layer 150 with single crystal piezoelectric material layer 130. A portion of reinforcing layer 260 is located above opening 113. An opening 263 that communicates with opening 113 of base portion 110 is provided in a bottom surface of reinforcing layer 260. Opening 263 is located above opening 113 and has an upper base 261. Upper base 261 of opening 263 defines a bottom surface of membrane portion Mb.

In the present preferred embodiment, reinforcing layer 260 is made of, for example, SiO$_2$. A material of reinforcing layer 260 is not limited to SiO$_2$ and may be any insulating material. For example, reinforcing layer 260 may be made of an organic material having electrical insulating properties and thermal insulation properties.

As such, multilayer portion 220 includes, at least above opening 113, single crystal piezoelectric material layer 130, top electrode layer 140, bottom electrode layer 150, and reinforcing layer 260.

As described above, membrane portion Mb is provided with through slot 180 that passes through membrane portion Mb in the up-down direction. The width of through slot 180 becomes narrower as through slot 180 extends downward in each of single crystal piezoelectric material layer 130 and reinforcing layer 260.

In single crystal piezoelectric material layer 130 and reinforcing layer 260, the maximum width of through slot 180 in a layer located on the bottom side is smaller than the minimum width of through slot 180 in a layer located on the top side. In the present preferred embodiment, reinforcing layer 260 is the layer located on the bottom side, and single crystal piezoelectric material layer 130 is the layer located on the top side. The maximum width of through slot 180 in reinforcing layer 260 is smaller than the minimum width of through slot 180 in single crystal piezoelectric material layer 130.

Specifically, single crystal piezoelectric material layer 130 includes edge surfaces 138 that are in contact with through slot 180. Reinforcing layer 260 includes edge surfaces 268 that are in contact with through slot 180. Bottom electrode layer 150 sandwiched between single crystal piezoelectric material layer 130 and reinforcing layer 260 has edge surfaces 158.

In the present preferred embodiment, edge surfaces 138 are top-side edge surfaces, edge surfaces 268 are bottom-side edge surfaces, and edge surfaces 158 are intermediate edge surfaces. The inclination angle of edge surfaces 138 which are the top-side edge surfaces is smaller than the inclination angle of edge surfaces 268 which are the bottom-side edge surfaces. Namely, the minimum width of through slot 180 in single crystal piezoelectric material layer 130 is the width of through slot 180 at the locations of bottom edges of edge surfaces 138 of single crystal piezoelectric material layer 130. The maximum width of through slot 180 in reinforcing layer 260 is the width of through slot 180 at the locations of top edges of edge surfaces 268 of reinforcing layer 260. Edge surface 158 which is an intermediate edge surface is located on a plane extending from edge surface 268 which is a bottom-side edge surface, and continues with edge surface 268.

Through slot 180 is narrowest at its edge portion on an opening 113 side. Namely, through slot 180 is narrowest at the locations of bottom edges of edge surfaces 268 of reinforcing layer 260 in the up-down direction.

A non-limiting example of a method of manufacturing a piezoelectric device according to the second preferred embodiment of the present invention will be described below.

Figure 21:
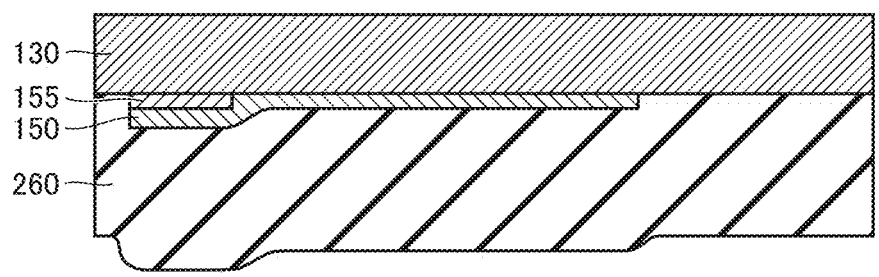
FIG. 21 is a cross-sectional view showing a state in which a reinforcing layer is provided on a bottom surface of each of a bottom electrode layer and a single crystal piezoelectric material layer in a method of manufacturing a piezoelectric device according to the second preferred embodiment of the present invention.

FIG. 21 is a cross-sectional view showing a state in which a reinforcing layer is provided on a bottom surface of each of a bottom electrode layer and a single crystal piezoelectric material layer in the method of manufacturing a piezoelectric device according to the second preferred embodiment of the present invention. First, as with the method of manufacturing piezoelectric device 100 according to the first preferred embodiment of the present invention, each of an adhesion layer 155 and a bottom electrode layer 150 is provided on a bottom side of a single crystal piezoelectric material layer 130. Then, as shown in FIG. 21, a reinforcing layer 260 is provided on a bottom surface of each of bottom electrode layer 150 and single crystal piezoelectric material layer 130 by, for example, a CVD process, a PVD process, or the like.

Figure 22:
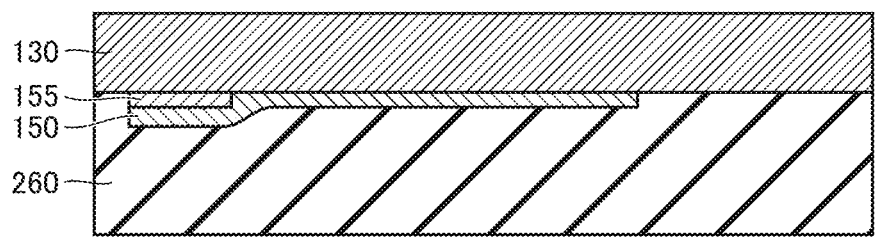
FIG. 22 is a cross-sectional view showing a state in which a bottom surface of the reinforcing layer is flattened in the method of manufacturing a piezoelectric device according to the second preferred embodiment of the present invention.

FIG. 22 is a cross-sectional view showing a state in which a bottom surface of the reinforcing layer is flattened in the method of manufacturing a piezoelectric device according to the second preferred embodiment of the present invention. As shown in FIG. 22, a bottom surface of reinforcing layer 260 is flattened by, for example, CMP or the like.

Figure 23:
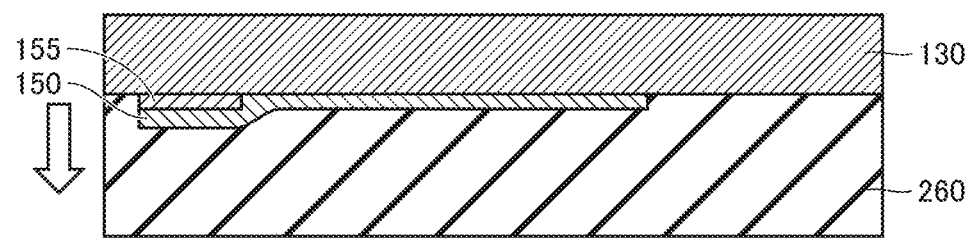
FIG. 23 is a cross-sectional view showing a state in which a base portion is to be bonded to the plurality of layers shown in FIG. 22 in the method of manufacturing a piezoelectric device according to the second preferred embodiment of the present invention.
Figure 23:
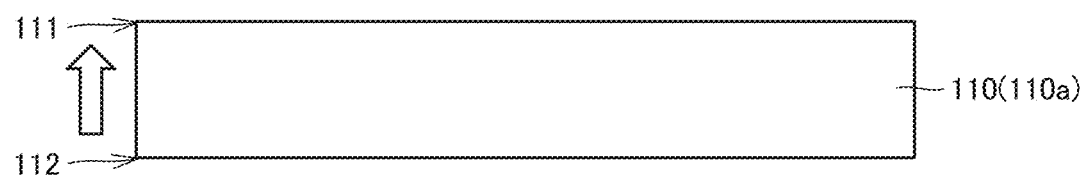
Figure 24:
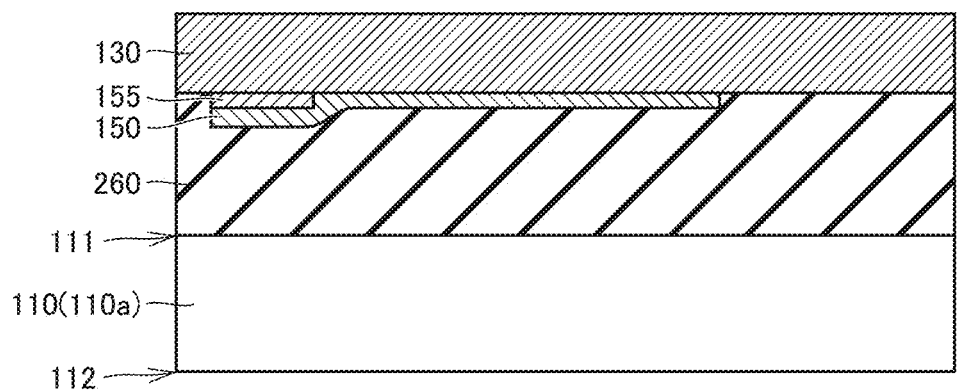
FIG. 24 is a cross-sectional view showing a state in which the base portion has been bonded to the bottom surface of the reinforcing layer in the method of manufacturing a piezoelectric device according to the second preferred embodiment of the present invention.

FIG. 23 is a cross-sectional view showing a state in which a base portion is to be bonded to the plurality of layers shown in FIG. 22 in the method of manufacturing a piezoelectric device according to the second preferred embodiment of the present invention. FIG. 24 is a cross-sectional view showing a state in which the base portion has been bonded to the bottom surface of the reinforcing layer in the method of manufacturing a piezoelectric device according to the second preferred embodiment of the present invention. As shown in FIGS. 23 and 24, a substrate which is a base portion 110 and in which an opening 113 is not formed is bonded to the bottom surface of reinforcing layer 260 by, for example, surface activated bonding, atomic diffusion bonding, or the like.

Figure 25:
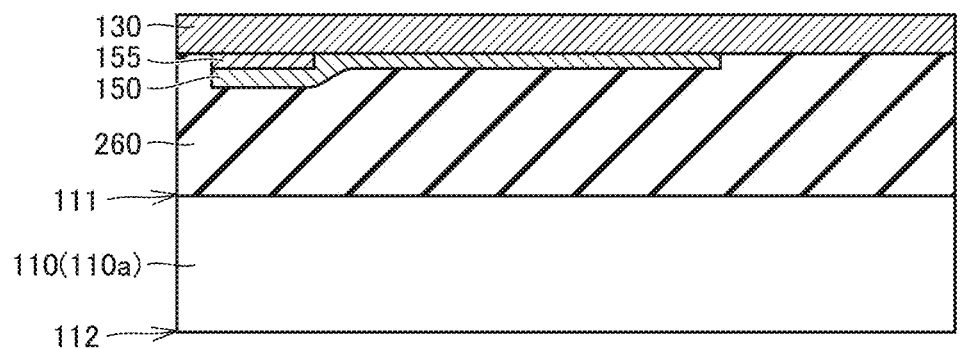
FIG. 25 is a cross-sectional view showing a state in which a top surface of the single crystal piezoelectric material layer is removed in the method of manufacturing a piezoelectric device according to the second preferred embodiment of the present invention.

FIG. 25 is a cross-sectional view showing a state in which a top surface of the single crystal piezoelectric material layer is removed in the method of manufacturing a piezoelectric device according to the second preferred embodiment of the present invention. As shown in FIG. 25, by removing a top surface of single crystal piezoelectric material layer 130 by, for example, CMP or the like, single crystal piezoelectric material layer 130 has a desired thickness.

Figure 26:
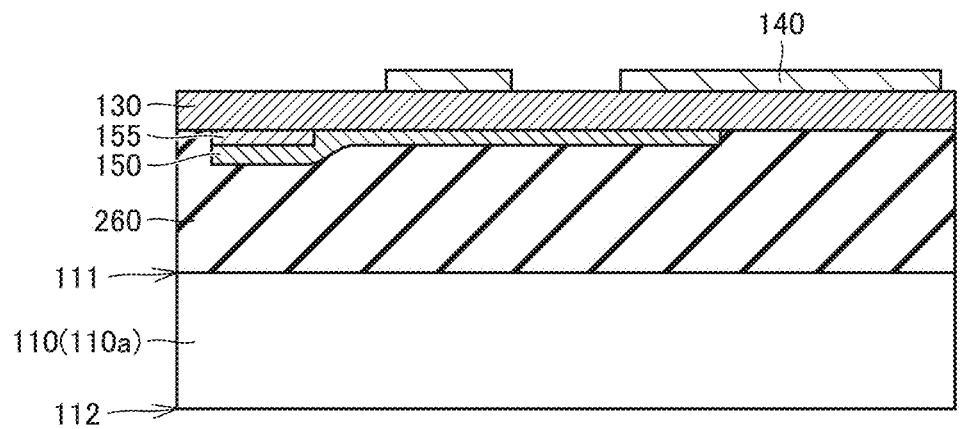
FIG. 26 is a cross-sectional view showing a state in which a top electrode layer is provided on the top surface of the single crystal piezoelectric material layer in the method of manufacturing a piezoelectric device according to the second preferred embodiment of the present invention.

FIG. 26 is a cross-sectional view showing a state in which a top electrode layer is provided on the top surface of the single crystal piezoelectric material layer in the method of manufacturing a piezoelectric device according to the second preferred embodiment of the present invention. As shown in FIG. 26, a top electrode layer 140 is provided on a portion of the top surface of single crystal piezoelectric material layer 130 by, for example, a lift-off process, a plating process, an etching process, or the like.

Figure 27:
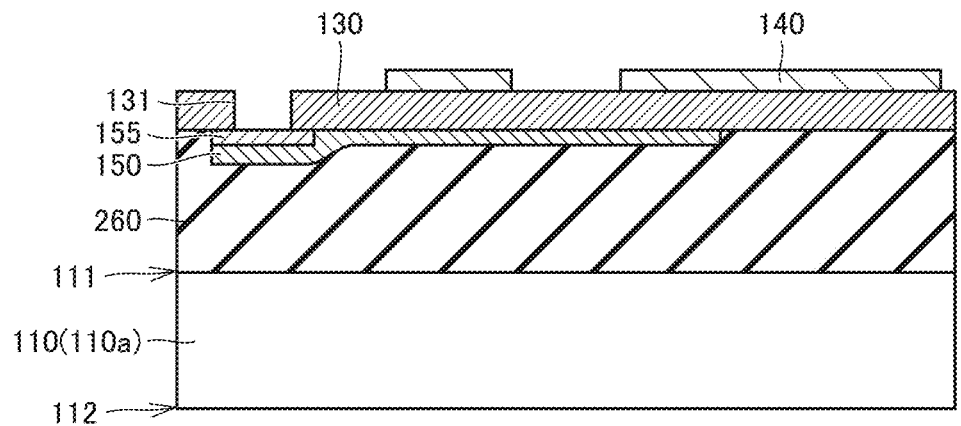
FIG. 27 is a cross-sectional view showing a state in which a hole is provided in the single crystal piezoelectric material layer in the method of manufacturing a piezoelectric device according to the second preferred embodiment of the present invention.

FIG. 27 is a cross-sectional view showing a state in which a hole is provided in the single crystal piezoelectric material layer in the method of manufacturing a piezoelectric device according to the second preferred embodiment of the present invention. As shown in FIG. 27, by etching a portion of single crystal piezoelectric material layer 130, a hole 131 is formed.

Figure 28:
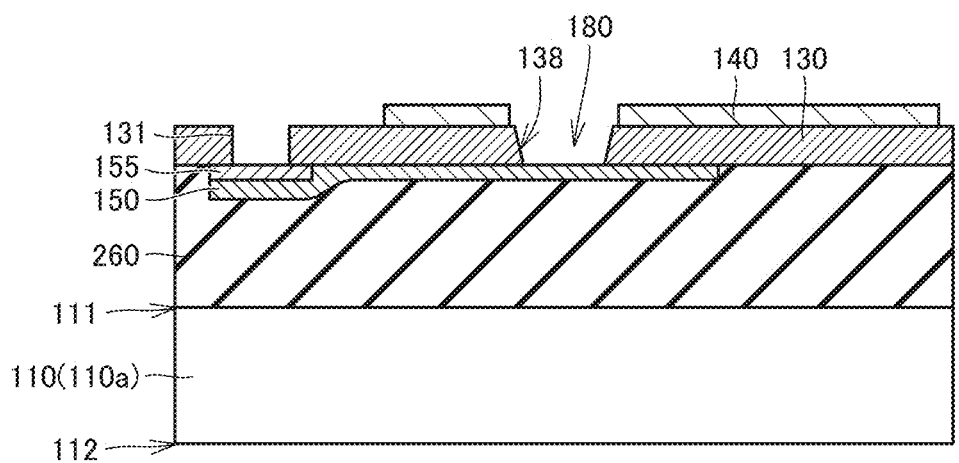
FIG. 28 is a cross-sectional view showing a state in which a through slot is provided in the single crystal piezoelectric material layer in the method of manufacturing a piezoelectric device according to the second preferred embodiment of the present invention.

FIG. 28 is a cross-sectional view showing a state in which a through slot is provided in the single crystal piezoelectric material layer in the method of manufacturing a piezoelectric device according to the second preferred embodiment of the present invention. As shown in FIG. 28, by etching single crystal piezoelectric material layer 130, a through slot 180 is formed in single crystal piezoelectric material layer 130. By this, edge surfaces 138 that are in contact with through slot 180 are formed in single crystal piezoelectric material layer 130.

Figure 29:
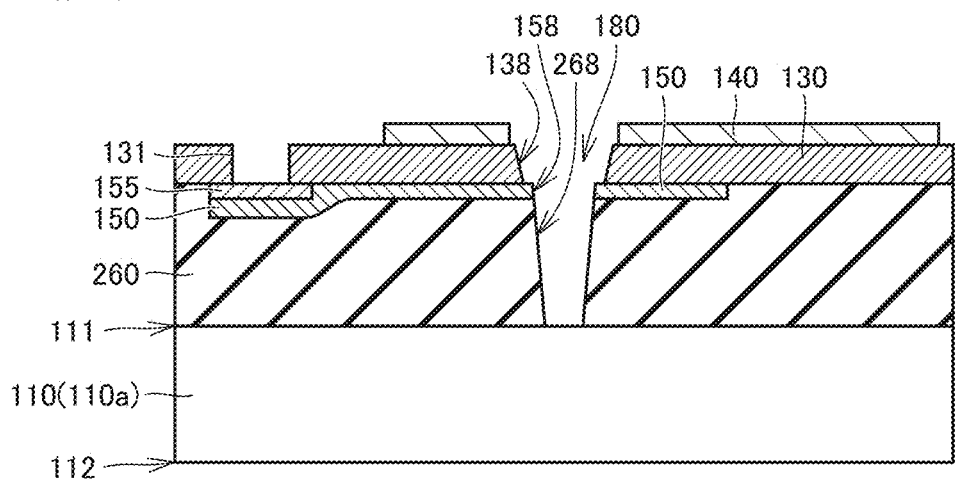
FIG. 29 is a cross-sectional view showing a state in which a through slot is provided so as to extend to the bottom surface of the reinforcing layer in the method of manufacturing a piezoelectric device according to the second preferred embodiment of the present invention.

FIG. 29 is a cross-sectional view showing a state in which a through slot is provided so as to extend to the bottom surface of the reinforcing layer in the method of manufacturing a piezoelectric device according to the second preferred embodiment of the present invention. As shown in FIG. 29, by etching bottom electrode layer 150 and reinforcing layer 260, a through slot 180 is formed in each of bottom electrode layer 150 and reinforcing layer 260. By this, edge surfaces 158 that are in contact with through slot 180 are formed in bottom electrode layer 150. Edge surfaces 268 that are in contact with through slot 180 are formed in reinforcing layer 260.

Figure 30:
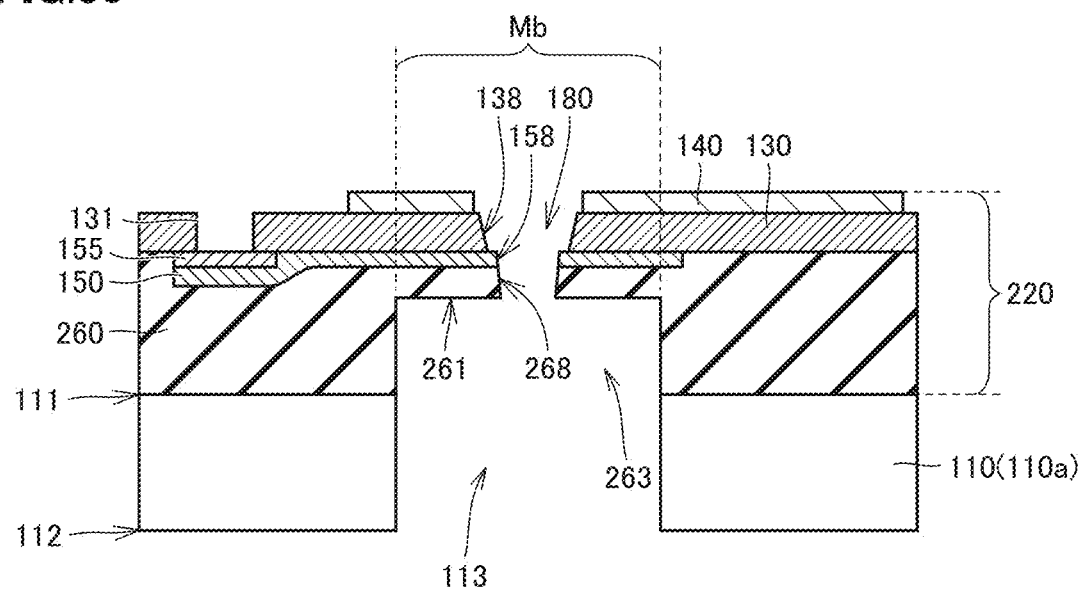
FIG. 30 is a cross-sectional view showing a state in which an opening is formed in the method of manufacturing a piezoelectric device according to the second preferred embodiment of the present invention.

FIG. 30 is a cross-sectional view showing a state in which an opening is formed in the method of manufacturing a piezoelectric device according to the second preferred embodiment of the present invention. As shown in FIG. 30, by performing, for example, deep reactive ion etching or the like from another principal surface 112 side of base portion 110, an opening 113 is formed in base portion 110 and an opening 263 is formed in reinforcing layer 260. By this, a membrane portion Mb is formed in a piezoelectric device 200 according to the present preferred embodiment.

Finally, each of a first lead wiring line 171 and a second lead wiring line 172 is provided by, for example, a lift-off process, a plating process, an etching process, or the like. By the above-described processes, piezoelectric device 200 according to the second preferred embodiment of the present invention such as that shown in FIG. 20 is manufactured.

As described above, in piezoelectric device 200 according to the second preferred embodiment of the present invention, the width of through slot 180 becomes narrower as through slot 180 extends downward in each of single crystal piezoelectric material layer 130 and reinforcing layer 260. In single crystal piezoelectric material layer 130 and reinforcing layer 260, the maximum width of through slot 180 in a layer located on the bottom side is smaller than the minimum width of through slot 180 in a layer located on the top side.

By this, viscous drag of fluid passing through the through slot 180 that occurs upon up-and-down vibration of membrane portion Mb is reduced, enabling an increase in the excitation efficiency of piezoelectric device 200.

In piezoelectric device 200 according to the present preferred embodiment, the inclination angle of edge surfaces 138 of single crystal piezoelectric material layer 130 which are top-side edge surfaces is smaller than the inclination angle of edge surfaces 268 of reinforcing layer 260 which are bottom-side edge surfaces. By this, viscous drag at edge surfaces 138 of single crystal piezoelectric material layer 130 can be effectively reduced.

Modifications of piezoelectric device 200 according to the second preferred embodiment of the present invention will be described below.

Figure 31:
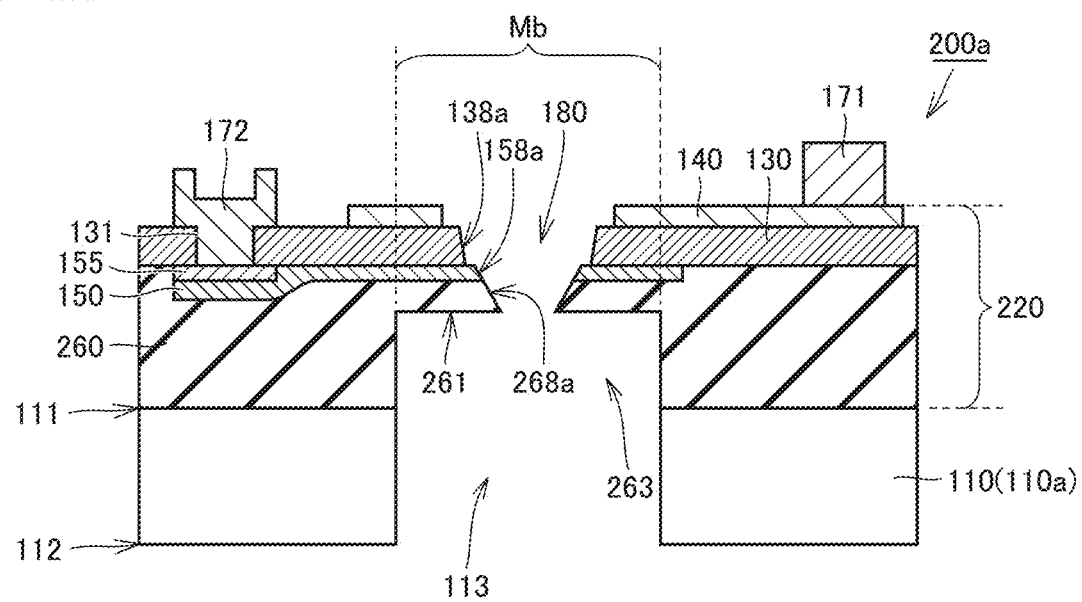
FIG. 31 is a cross-sectional view showing a configuration of a piezoelectric device according to a first modification of the second preferred embodiment of the present invention.

FIG. 31 is a cross-sectional view showing a configuration of a piezoelectric device according to a first modification of the second preferred embodiment of the present invention. FIG. 31 shows the same cross-sectional view as that of FIG. 20. As shown in FIG. 31, in a piezoelectric device 200a according to the first modification of the second preferred embodiment of the present invention, the inclination angle of edge surfaces 268a of reinforcing layer 260 which are bottom-side edge surfaces is smaller than the inclination angle of edge surfaces 138a of single crystal piezoelectric material layer 130 which are top-side edge surfaces. An edge surface 158a of bottom electrode layer 150 which is an intermediate edge surface is located on a plane extending from edge surface 268a which is a bottom-side edge surface, and continues with edge surface 268a. By this, viscous drag at edge surface 268a of reinforcing layer 260 can be effectively reduced.

Figure 32:
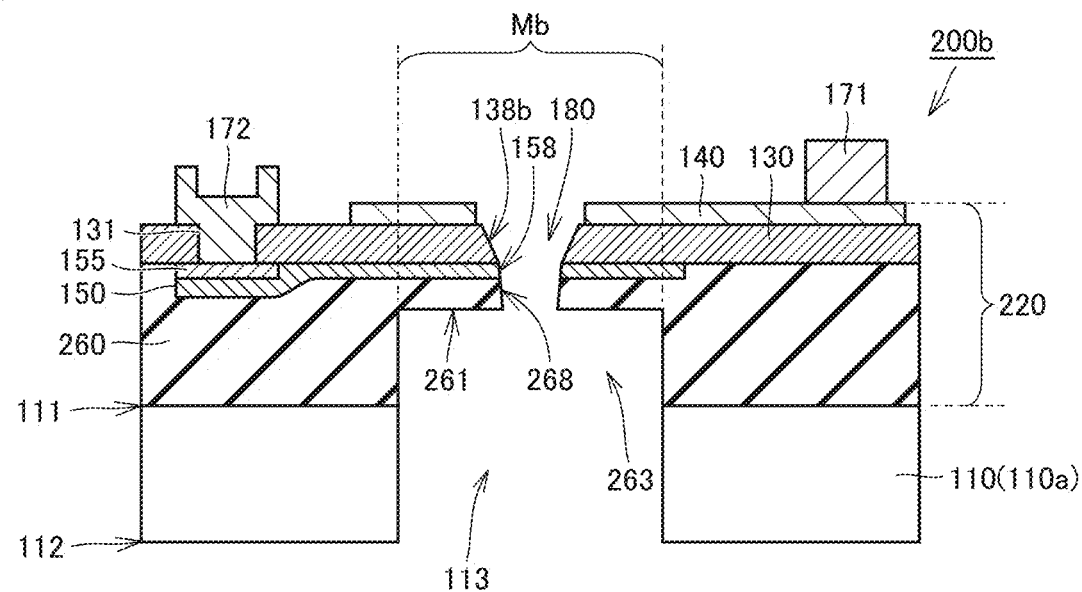
FIG. 32 is a cross-sectional view showing a configuration of a piezoelectric device according to a second modification of the second preferred embodiment of the present invention.

FIG. 32 is a cross-sectional view showing a configuration of a piezoelectric device according to a second modification of the second preferred embodiment of the present invention. FIG. 32 shows the same cross-sectional view as that of FIG. 20. As shown in FIG. 32, in a piezoelectric device 200b according to the second modification of the second preferred embodiment of the present invention, in single crystal piezoelectric material layer 130 and reinforcing layer 260, a bottom-side edge surface, which is in contact with through slot 180, of a layer located on the bottom side continues with a top-side edge surface, which is in contact with through slot 180, of a layer located on the top side, with an intermediate edge surface, which is in contact with through slot 180, of top electrode layer 140 or bottom electrode layer 150 interposed therebetween.

In the present modification, edge surface 268 of reinforcing layer 260 which is a bottom-side edge surface continues with an edge surface 138b of single crystal piezoelectric material layer 130 which is a top-side edge surface, with edge surface 158 of bottom electrode layer 150, which is an intermediate edge surface, interposed therebetween.

By this, viscous drag of fluid passing through the through slot 180 that occurs upon up-and-down vibration of membrane portion Mb is effectively reduced, enabling an increase in the excitation efficiency of piezoelectric device 200b. Furthermore, stress concentration between single crystal piezoelectric material layer 130 and bottom electrode layer 150 is reduced, enabling reduction or prevention of occurrence of interlayer peeling between single crystal piezoelectric material layer 130 and bottom electrode layer 150.

Figure 33:
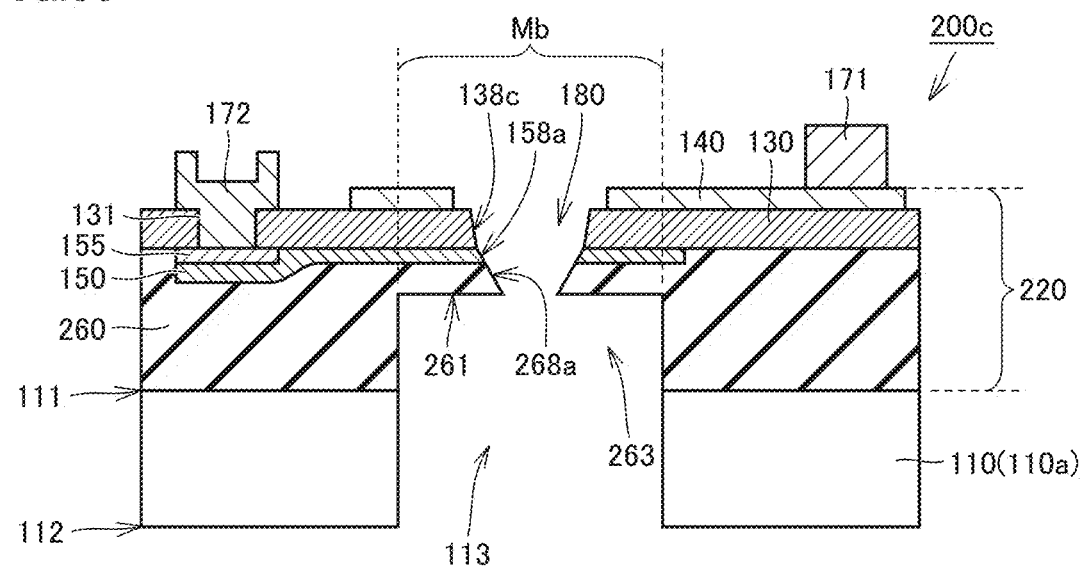
FIG. 33 is a cross-sectional view showing a configuration of a piezoelectric device according to a third modification of the second preferred embodiment of the present invention.

FIG. 33 is a cross-sectional view showing a configuration of a piezoelectric device according to a third modification of the second preferred embodiment of the present invention. FIG. 33 shows the same cross-sectional view as that of FIG. 20. As shown in FIG. 33, in a piezoelectric device 200c according to the third modification of the second preferred embodiment of the present invention, the inclination angle of edge surfaces 268a of reinforcing layer 260 which are bottom-side edge surfaces is smaller than the inclination angle of edge surfaces 138c of single crystal piezoelectric material layer 130 which are top-side edge surfaces. By this, viscous drag at edge surfaces 268a of reinforcing layer 260 can be effectively reduced.

In addition, edge surface 268a of reinforcing layer 260 which is a bottom-side edge surface continues with edge surface 138c of single crystal piezoelectric material layer 130 which is a top-side edge surface, with an edge surface 158a of bottom electrode layer 150, which is an intermediate edge surface, interposed therebetween.

By this, viscous drag of fluid passing through the through slot 180 that occurs upon up-and-down vibration of membrane portion Mb is effectively reduced, enabling an increase in the excitation efficiency of piezoelectric device 200c. Furthermore, stress concentration between single crystal piezoelectric material layer 130 and bottom electrode layer 150 is reduced, enabling reduction or prevention of occurrence of interlayer peeling between single crystal piezoelectric material layer 130 and bottom electrode layer 150.

Third Preferred Embodiment

A piezoelectric device according to a third preferred embodiment of the present invention will be described below with reference to drawings. The piezoelectric device according to the third preferred embodiment of the present invention differs from piezoelectric device 100 according to the first preferred embodiment of the present invention in that the piezoelectric device includes a plurality of reinforcing layers, and thus, description of the same components as those of piezoelectric device 100 according to the first preferred embodiment of the present invention is not repeated.

Figure 34:
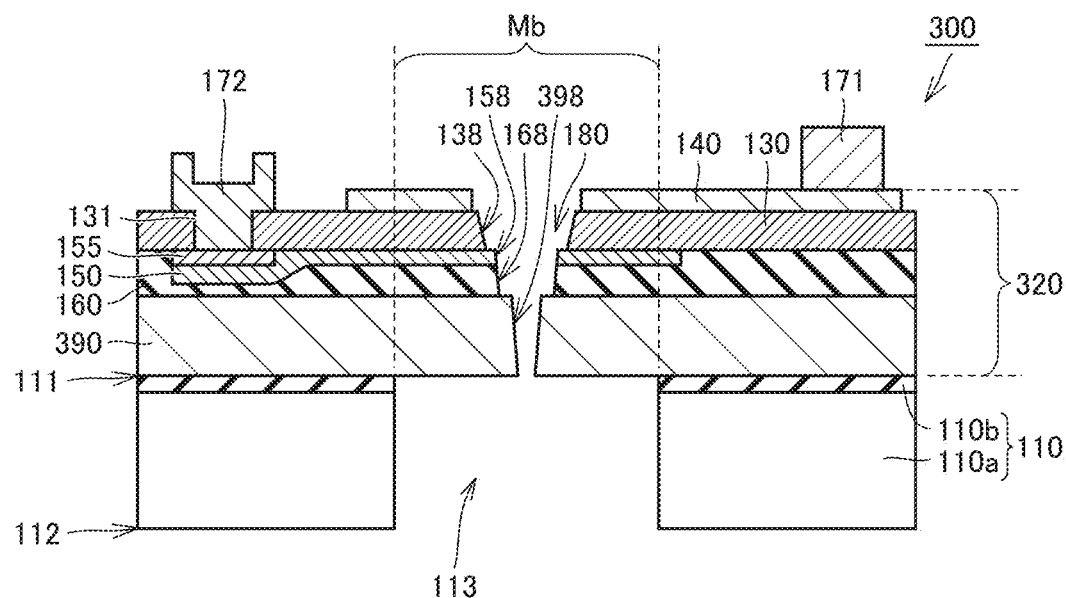
FIG. 34 is a cross-sectional view of a piezoelectric device according to a third preferred embodiment of the present invention.

FIG. 34 is a cross-sectional view of a piezoelectric device according to the third preferred embodiment of the present invention. FIG. 34 shows the same cross-sectional view as that of FIG. 2. As shown in FIG. 34, a piezoelectric device 300 according to the third preferred embodiment of the present invention includes a base portion 110 and a multilayer portion 320.

Multilayer portion 320 includes, at least above an opening 113, a single crystal piezoelectric material layer 130, a top electrode layer 140, a bottom electrode layer 150, a reinforcing layer 160, and an additional reinforcing layer 390. In the present preferred embodiment, the reinforcing layers include two layers, reinforcing layer 160 and additional reinforcing layer 390.

Multilayer portion 320 includes a membrane portion Mb which is a portion that covers opening 113. Membrane portion Mb is a portion of multilayer portion 320 located on an inner side of an opening edge of opening 113 when viewed in a direction orthogonal to one principal surface 111. Membrane portion Mb is provided with a through slot 180 that passes through membrane portion Mb in the up-down direction.

Additional reinforcing layer 390 is laminated so as to cover reinforcing layer 160 from below. In the present preferred embodiment, additional reinforcing layer 390 is provided so as to come into contact with a bottom surface of reinforcing layer 160. A portion of a bottom surface of additional reinforcing layer 390 is in contact with one principal surface 111 of base portion 110.

A portion of additional reinforcing layer 390 is located above opening 113. The portion of additional reinforcing layer 390 covers opening 113. A portion of additional reinforcing layer 390 that does not cover opening 113 and base portion 110 are directly connected to each other. The portion of additional reinforcing layer 390 that does not cover opening 113 and base portion 110 may not be directly connected to each other. The portion of additional reinforcing layer 390 that does not cover opening 113 and base portion 110 may be connected to each other with a metal layer interposed therebetween.

In the present preferred embodiment, additional reinforcing layer 390 is made of, for example, Si. Base portion 110 and additional reinforcing layer 390 are, for example, a silicon on insulator (SOI) substrate. A material of additional reinforcing layer 390 is not limited to Si and may be an insulating material. For example, additional reinforcing layer 390 may be made of an organic material having electrical insulating properties and thermal insulation properties.

As such, multilayer portion 320 includes, at least above opening 113, single crystal piezoelectric material layer 130, top electrode layer 140, bottom electrode layer 150, reinforcing layer 160, and additional reinforcing layer 390.

As described above, membrane portion Mb is provided with through slot 180 that passes through membrane portion Mb in the up-down direction. The width of through slot 180 becomes narrower as through slot 180 extends downward in each of single crystal piezoelectric material layer 130 and the reinforcing layers.

In single crystal piezoelectric material layer 130 and the reinforcing layers, the maximum width of through slot 180 in a layer located on the bottom side is smaller than the minimum width of through slot 180 in a layer located on the top side. In the present preferred embodiment, the reinforcing layers are layers located on the bottom side, and single crystal piezoelectric material layer 130 is the layer located on the top side. The maximum width of through slot 180 in the reinforcing layers is smaller than the minimum width of through slot 180 in single crystal piezoelectric material layer 130.

Specifically, additional reinforcing layer 390 includes edge surfaces 398 that are in contact with through slot 180. In the present preferred embodiment, edge surfaces 138 are top-side edge surfaces, each of edge surfaces 168 and edge surfaces 398 is a bottom-side edge surface, and edge surfaces 158 are intermediate edge surfaces. The inclination angle of edge surfaces 138 which are the top-side edge surfaces is smaller than the inclination angle of each of edge surfaces 168 and edge surfaces 398 which are the bottom-side edge surfaces. The inclination angle decreases in the order of edge surfaces 398, edge surfaces 168, and edge surfaces 138. Namely, the minimum width of through slot 180 in single crystal piezoelectric material layer 130 is the width of through slot 180 at the locations of bottom edges of edge surfaces 138 of single crystal piezoelectric material layer 130. The maximum width of through slot 180 in the reinforcing layers is the width of through slot 180 at the locations of top edges of edge surfaces 168 of reinforcing layer 160.

The inclination angle of edge surfaces 168 of reinforcing layer 160 is smaller than the inclination angle of edge surfaces 398 of additional reinforcing layer 390. A step is provided between edge surface 168 of reinforcing layer 160 and edge surface 398 of additional reinforcing layer 390. A bottom edge of edge surface 168 of reinforcing layer 160 is located on a top surface of additional reinforcing layer 390. A portion of the top surface of additional reinforcing layer 390 adjacent to through slot 180 is exposed.

Through slot 180 is narrowest at its edge portion on an opening 113 side. Namely, through slot 180 is narrowest at the locations of bottom edges of edge surfaces 398 of additional reinforcing layer 390 in the up-down direction.

A non-limiting example of a method of manufacturing a piezoelectric device according to the third preferred embodiment of the present invention will be described below.

Figure 35:
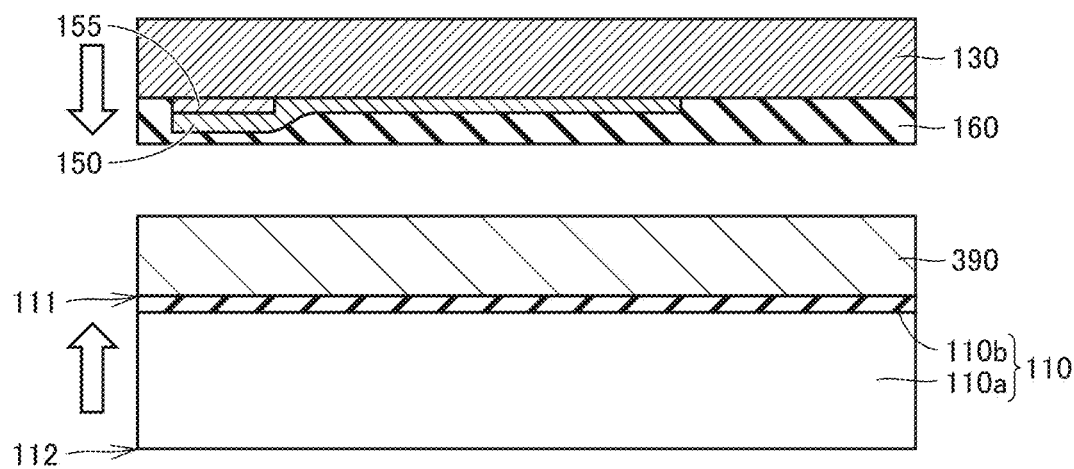
FIG. 35 is a cross-sectional view showing a state in which the plurality of layers shown in FIG. 6 and a base portion with an additional reinforcing layer laminated thereon are to be bonded together in a method of manufacturing a piezoelectric device according to the third preferred embodiment of the present invention.
Figure 36:
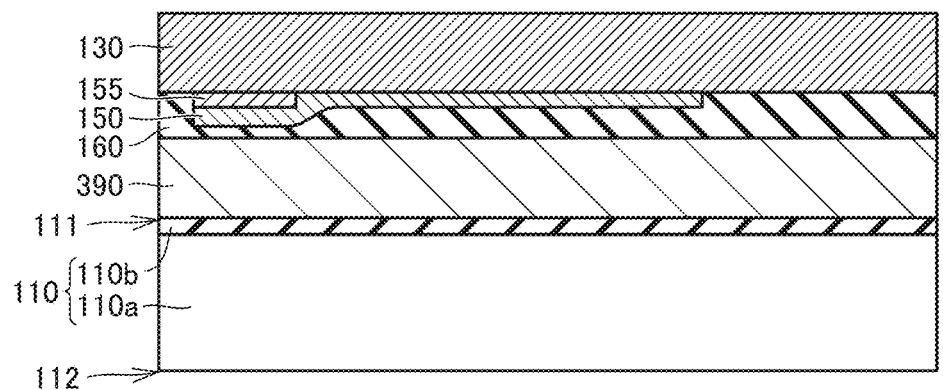
FIG. 36 is a cross-sectional view showing a state in which the additional reinforcing layer has been bonded to a bottom surface of a reinforcing layer in the method of manufacturing a piezoelectric device according to the third preferred embodiment of the present invention.

FIG. 35 is a cross-sectional view showing a state in which the plurality of layers shown in FIG. 6 and a base portion having an additional reinforcing layer laminated thereon are to be bonded together in the method of manufacturing a piezoelectric device according to the third preferred embodiment of the present invention. FIG. 36 is a cross-sectional view showing a state in which the additional reinforcing layer has been bonded to a bottom surface of a reinforcing layer in the method of manufacturing a piezoelectric device according to the third preferred embodiment of the present invention.

First, as with the method of manufacturing piezoelectric device 100 according to the first preferred embodiment of the present invention, each of an adhesion layer 155 and a bottom electrode layer 150 is provided on a bottom side of a single crystal piezoelectric material layer 130. Furthermore, a reinforcing layer 160 is provided on a bottom surface of each of bottom electrode layer 150 and single crystal piezoelectric material layer 130, and a bottom surface of reinforcing layer 160 is flattened.

Then, as shown in FIG. 35, an additional reinforcing layer 390 is bonded to one principal surface 111 of a base portion 110 by, for example, surface activated bonding, atomic diffusion bonding, or the like.

As shown in FIGS. 35 and 36, a substrate which is base portion 110 having additional reinforcing layer 390 bonded thereto is bonded to the bottom surface of reinforcing layer 160 by, for example, surface activated bonding, atomic diffusion bonding, or the like.

Figure 37:
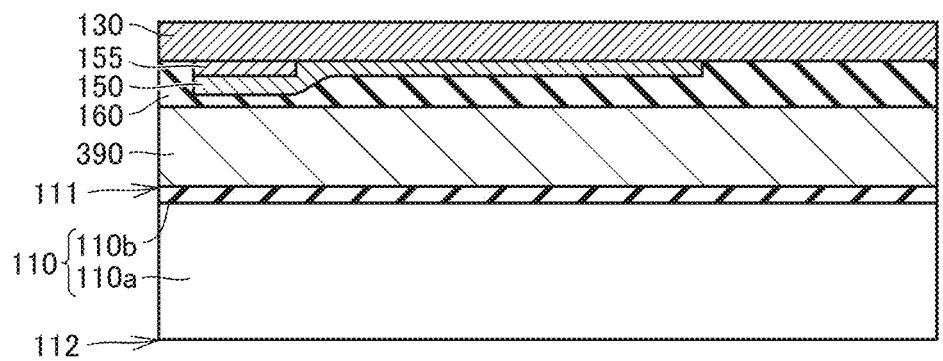
FIG. 37 is a cross-sectional view showing a state in which a top surface of a single crystal piezoelectric material layer is removed in the method of manufacturing a piezoelectric device according to the third preferred embodiment of the present invention.

FIG. 37 is a cross-sectional view showing a state in which a top surface of the single crystal piezoelectric material layer is removed in the method of manufacturing a piezoelectric device according to the third preferred embodiment of the present invention. As shown in FIG. 37, by removing a top surface of single crystal piezoelectric material layer 130 by, for example, CMP or the like, single crystal piezoelectric material layer 130 has a desired thickness.

Figure 38:
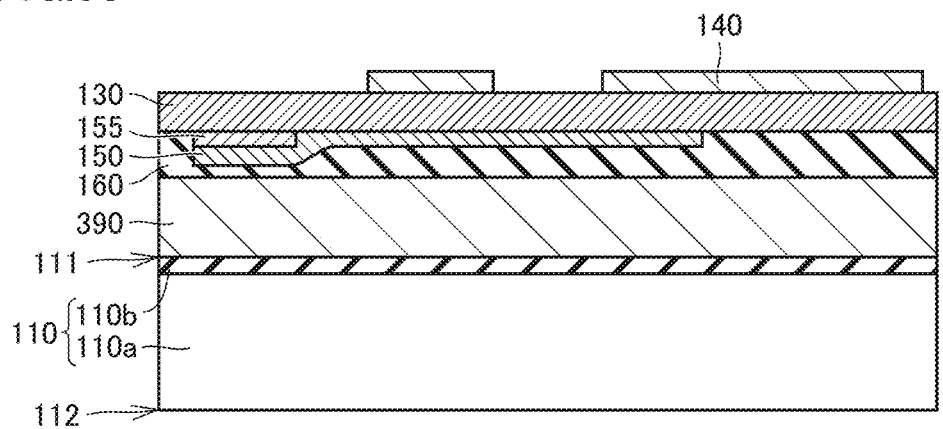
FIG. 38 is a cross-sectional view showing a state in which a top electrode layer is provided on the top surface of the single crystal piezoelectric material layer in the method of manufacturing a piezoelectric device according to the third preferred embodiment of the present invention.

FIG. 38 is a cross-sectional view showing a state in which a top electrode layer is provided on the top surface of the single crystal piezoelectric material layer in the method of manufacturing a piezoelectric device according to the third preferred embodiment of the present invention. As shown in FIG. 38, a top electrode layer 140 is provided on a portion of the top surface of single crystal piezoelectric material layer 130 by, for example, a lift-off process, a plating process, an etching process, or the like.

Figure 39:
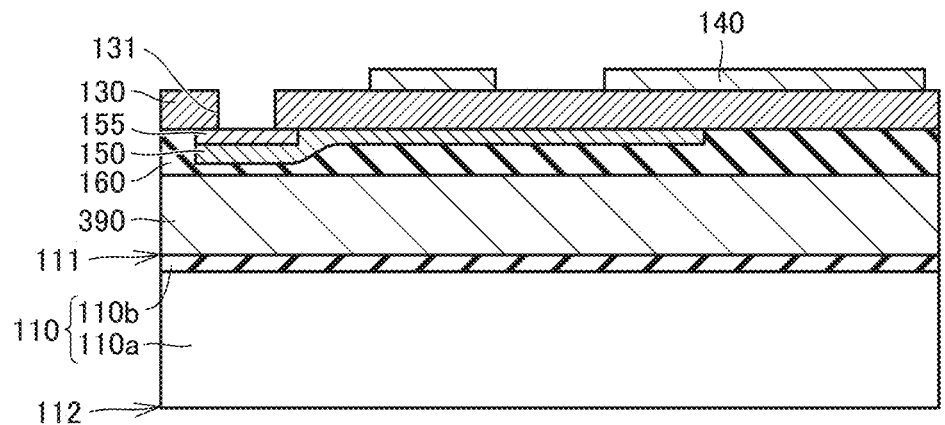
FIG. 39 is a cross-sectional view showing a state in which a hole is provided in the single crystal piezoelectric material layer in the method of manufacturing a piezoelectric device according to the third preferred embodiment of the present invention.

FIG. 39 is a cross-sectional view showing a state in which a hole is provided in the single crystal piezoelectric material layer in the method of manufacturing a piezoelectric device according to the third preferred embodiment of the present invention. As shown in FIG. 39, by etching a portion of single crystal piezoelectric material layer 130, a hole 131 is formed.

Figure 40:
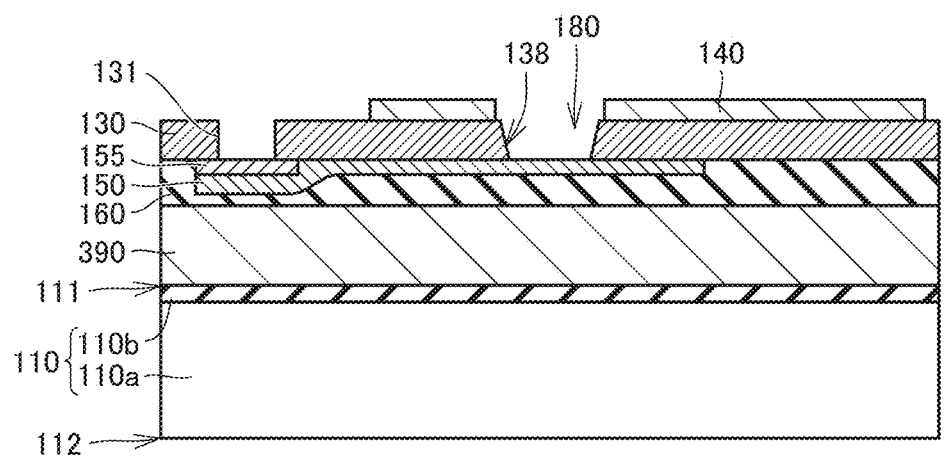
FIG. 40 is a cross-sectional view showing a state in which a through slot is provided in the single crystal piezoelectric material layer in the method of manufacturing a piezoelectric device according to the third preferred embodiment of the present invention.

FIG. 40 is a cross-sectional view showing a state in which a through slot is provided in the single crystal piezoelectric material layer in the method of manufacturing a piezoelectric device according to the third preferred embodiment of the present invention. As shown in FIG. 40, by etching single crystal piezoelectric material layer 130, a through slot 180 is formed in single crystal piezoelectric material layer 130. By this, edge surfaces 138 that are in contact with through slot 180 are formed in single crystal piezoelectric material layer 130.

Figure 41:
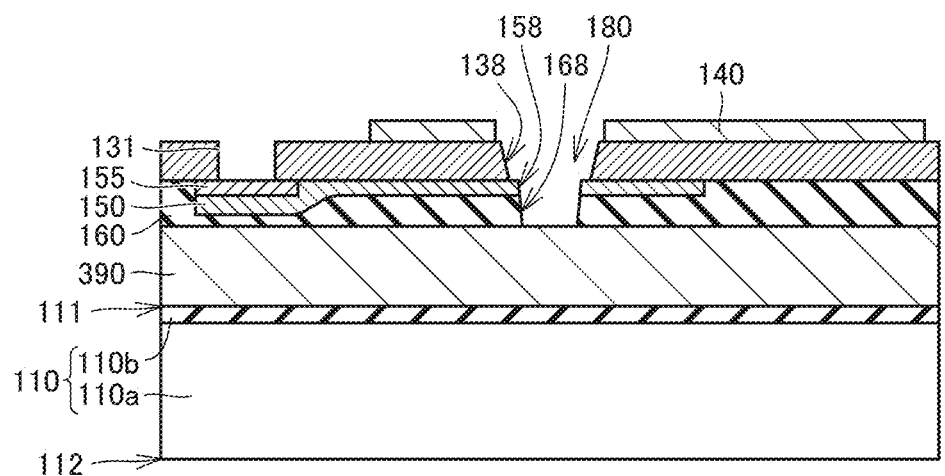
FIG. 41 is a cross-sectional view showing a state in which a through slot is provided so as to extend to the bottom surface of the reinforcing layer in the method of manufacturing a piezoelectric device according to the third preferred embodiment of the present invention.

FIG. 41 is a cross-sectional view showing a state in which a through slot is provided so as to extend to the bottom surface of the reinforcing layer in the method of manufacturing a piezoelectric device according to the third preferred embodiment of the present invention. As shown in FIG. 41, by etching bottom electrode layer 150 and reinforcing layer 160, a through slot 180 is formed in each of bottom electrode layer 150 and reinforcing layer 160. By this, edge surfaces 158 that are in contact with through slot 180 are formed in bottom electrode layer 150. Edge surfaces 168 that are in contact with through slot 180 are formed in reinforcing layer 160.

Figure 42:
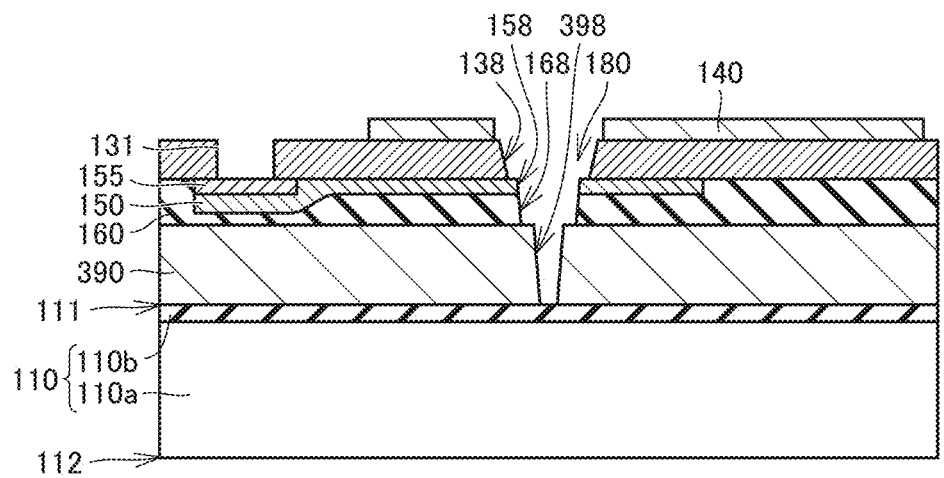
FIG. 42 is a cross-sectional view showing a state in which a through slot is provided so as to extend to a bottom surface of the additional reinforcing layer in the method of manufacturing a piezoelectric device according to the third preferred embodiment of the present invention.

FIG. 42 is a cross-sectional view showing a state in which a through slot is provided so as to extend to a bottom surface of the additional reinforcing layer in the method of manufacturing a piezoelectric device according to the third preferred embodiment of the present invention. As shown in FIG. 42, by etching additional reinforcing layer 390, a through slot 180 is formed in additional reinforcing layer 390. By this, edge surfaces 398 that are in contact with through slot 180 are formed in additional reinforcing layer 390.

Figure 43:
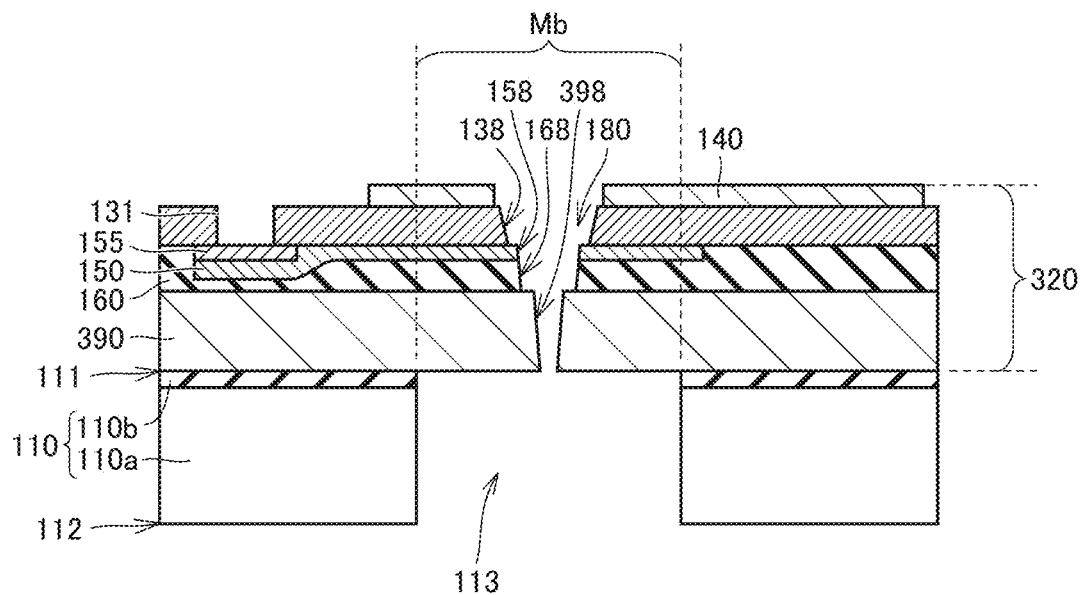
FIG. 43 is a cross-sectional view showing a state in which an opening is formed in the method of manufacturing a piezoelectric device according to the third preferred embodiment of the present invention.

FIG. 43 is a cross-sectional view showing a state in which an opening is formed in the method of manufacturing a piezoelectric device according to the third preferred embodiment of the present invention. As shown in FIG. 43, by performing, for example, deep reactive ion etching or the like from another principal surface 112 side of base portion 110, an opening 113 is formed in base portion 110. By this, a membrane portion Mb is formed in a piezoelectric device 300 according to the present preferred embodiment.

Finally, each of a first lead wiring line 171 and a second lead wiring line 172 is provided by, for example, a lift-off process, a plating process, an etching process, or the like. By the above-described processes, piezoelectric device 300 according to the third preferred embodiment of the present invention such as that shown in FIG. 34 is manufactured.

As described above, in piezoelectric device 300 according to the third preferred embodiment of the present invention, the width of through slot 180 becomes narrower as through slot 180 extends downward in each of single crystal piezoelectric material layer 130 and the reinforcing layers. In single crystal piezoelectric material layer 130 and the reinforcing layers, the maximum width of through slot 180 in a layer located on the bottom side is smaller than the minimum width of through slot 180 in a layer located on the top side.

By this, viscous drag of fluid passing through the through slot 180 that occurs upon up-and-down vibration of membrane portion Mb is reduced, enabling an increase in the excitation efficiency of piezoelectric device 300.

In piezoelectric device 300 according to the present preferred embodiment, the inclination angle of edge surfaces 138 of single crystal piezoelectric material layer 130 which are top-side edge surfaces is smaller than the inclination angle of each of edge surfaces 168 of reinforcing layer 160 and edge surfaces 398 of additional reinforcing layer 390 which are bottom-side edge surfaces. By this, viscous drag at edge surfaces 138 of single crystal piezoelectric material layer 130 can be effectively reduced.

Modifications of piezoelectric device 300 according to the third preferred embodiment of the present invention will be described below.

Figure 44:
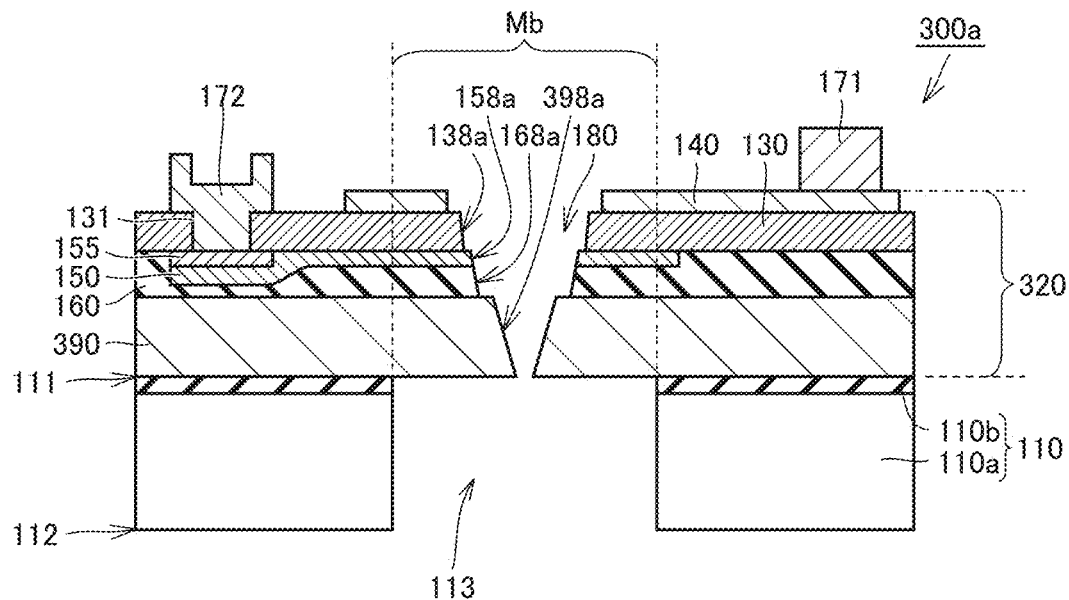
FIG. 44 is a cross-sectional view showing a configuration of a piezoelectric device according to a first modification of the third preferred embodiment of the present invention.

FIG. 44 is a cross-sectional view showing a configuration of a piezoelectric device according to a first modification of the third preferred embodiment of the present invention. FIG. 44 shows the same cross-sectional view as that of FIG. 34. As shown in FIG. 44, in a piezoelectric device 300*a* according to the first modification of the third preferred embodiment of the present invention, the inclination angle of each of edge surfaces 168*a* of reinforcing layer 160 and edge surfaces 398*a* of additional reinforcing layer 390 which are bottom-side edge surfaces is smaller than the inclination angle of edge surfaces 138*a* of single crystal piezoelectric material layer 130 which are top-side edge surfaces. The inclination angle decreases in the order of edge surfaces 138*a*, edge surfaces 168*a*, and edge surfaces 398*a*. An edge surface 158*a* of bottom electrode layer 150 which is an intermediate edge surface is located on a plane extending from edge surface 168*a* which is a bottom-side edge surface, and continues with edge surface 168*a*. By this, viscous drag at each of edge surfaces 168*a* of reinforcing layer 160 and edge surfaces 398*a* of additional reinforcing layer 390 can be effectively reduced.

Figure 45:
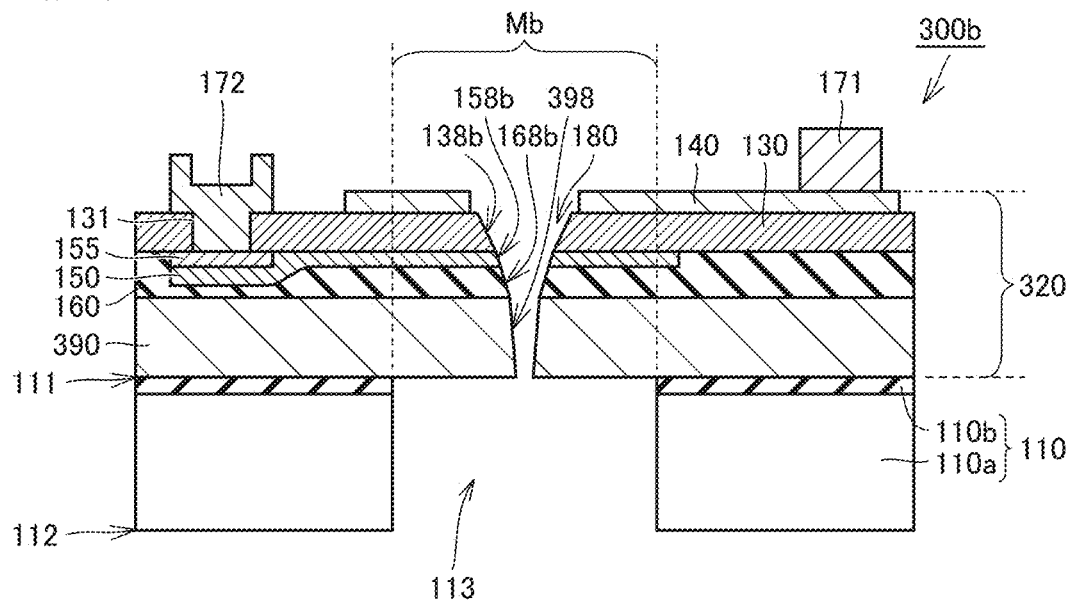
FIG. 45 is a cross-sectional view showing a configuration of a piezoelectric device according to a second modification of the third preferred embodiment of the present invention.

FIG. 45 is a cross-sectional view showing a configuration of a piezoelectric device according to a second modification of the third preferred embodiment of the present invention. FIG. 45 shows the same cross-sectional view as that of FIG. 34. As shown in FIG. 45, in a piezoelectric device 300*b* according to the second modification of the third preferred embodiment of the present invention, the inclination angle of edge surfaces 138*b* of single crystal piezoelectric material layer 130 which are top-side edge surfaces is smaller than the inclination angle of each of edge surfaces 168*b* of reinforcing layer 160 and edge surfaces 398 of additional reinforcing layer 390 which are bottom-side edge surfaces. The inclination angle decreases in the order of edge surfaces 398, edge surfaces 168*b*, and edge surfaces 138*b*. In single crystal piezoelectric material layer 130 and the reinforcing layers, a bottom-side edge surface, which is in contact with through slot 180, of a layer located on the bottom side continues with a top-side edge surface, which is in contact with through slot 180, of a layer located on the top side, with an intermediate edge surface, which is in contact with through slot 180, of top electrode layer 140 or bottom electrode layer 150 interposed therebetween.

In the present modification, edge surface 168*b* of reinforcing layer 160 which is a bottom-side edge surface continues with edge surface 138*b* of single crystal piezoelectric material layer 130 which is a top-side edge surface, with an edge surface 158*b* of bottom electrode layer 150, which is an intermediate edge surface, interposed therebetween.

By this, viscous drag of fluid passing through the through slot 180 that occurs upon up-and-down vibration of membrane portion Mb is effectively reduced, enabling an increase in the excitation efficiency of piezoelectric device 300*b*. Furthermore, stress concentration between single crystal piezoelectric material layer 130 and bottom electrode layer 150 is reduced, enabling reduction or prevention of occurrence of interlayer peeling between single crystal piezoelectric material layer 130 and bottom electrode layer 150.

Figure 46:
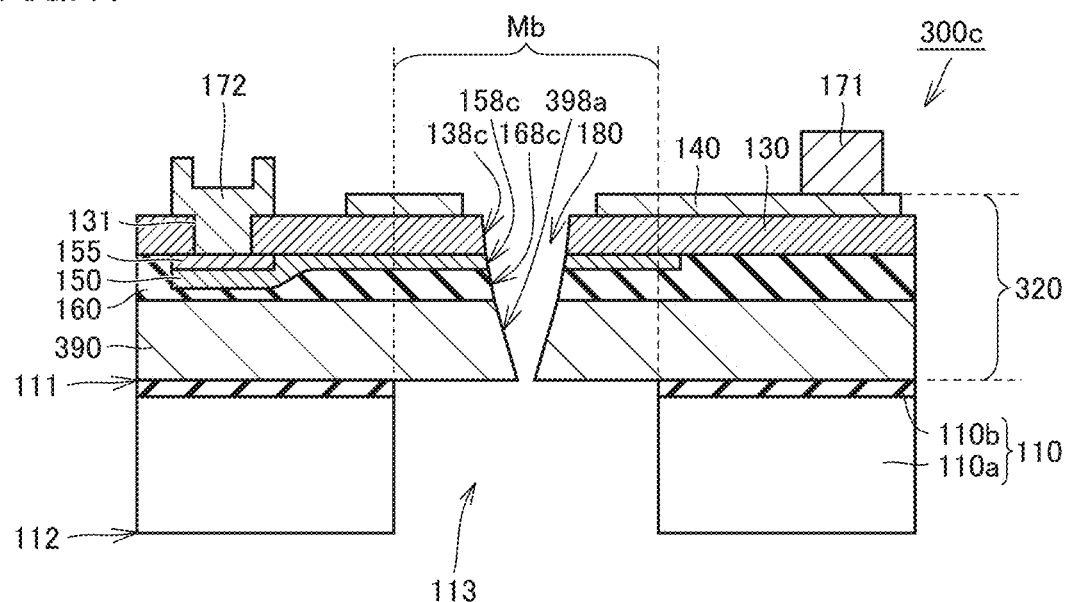
FIG. 46 is a cross-sectional view showing a configuration of a piezoelectric device according to a third modification of the third preferred embodiment of the present invention.

FIG. 46 is a cross-sectional view showing a configuration of a piezoelectric device according to a third modification of the third preferred embodiment of the present invention. FIG. 46 shows the same cross-sectional view as that of FIG. 34. As shown in FIG. 46, in a piezoelectric device 300*c* according to the third modification of the third preferred embodiment of the present invention, the inclination angle of each of edge surfaces 168*c* of reinforcing layer 160 and edge surfaces 398*a* of additional reinforcing layer 390 which are bottom-side edge surfaces is smaller than the inclination angle of edge surfaces 138*c* of single crystal piezoelectric material layer 130 which are top-side edge surfaces. The inclination angle decreases in the order of edge surfaces 138*c*, edge surfaces 168*c*, and edge surfaces 398*a*. By this, viscous drag at each of edge surfaces 168*c* of reinforcing layer 160 and edge surfaces 398*a* of additional reinforcing layer 390 can be effectively reduced.

In addition, edge surface 168*c* of reinforcing layer 160 which is a bottom-side edge surface continues with edge surface 138*c* of single crystal piezoelectric material layer 130 which is a top-side edge surface, with an edge surface 158*c* of bottom electrode layer 150, which is an intermediate edge surface, interposed therebetween.

By this, viscous drag of fluid passing through the through slot 180 that occurs upon up-and-down vibration of membrane portion Mb is effectively reduced, enabling an increase in the excitation efficiency of piezoelectric device 300*c*. Furthermore, stress concentration between single crystal piezoelectric material layer 130 and bottom electrode layer 150 is reduced, enabling reduction or prevention of occurrence of interlayer peeling between single crystal piezoelectric material layer 130 and bottom electrode layer 150.

Fourth Preferred Embodiment

A piezoelectric device according to a fourth preferred embodiment of the present invention will be described below with reference to drawings. The piezoelectric device according to the fourth preferred embodiment of the present invention differs from piezoelectric device 100 according to the first preferred embodiment of the present invention mainly in configurations of a base portion and a reinforcing layer, and thus, description of the same or corresponding components as those of piezoelectric device 100 according to the first preferred embodiment of the present invention is not repeated.

Figure 47:
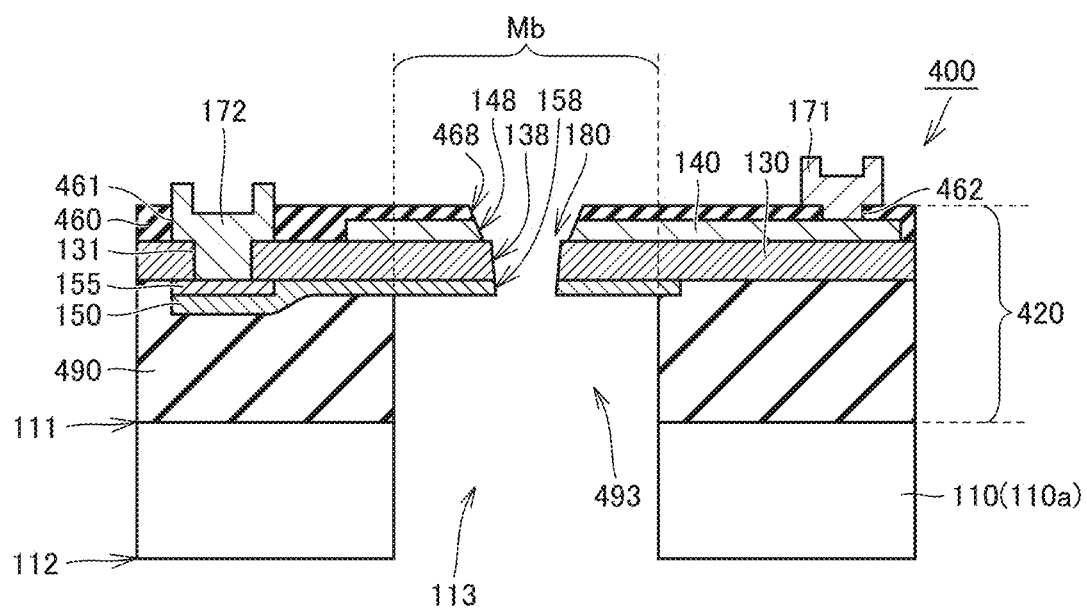
FIG. 47 is a cross-sectional view of a piezoelectric device according to a fourth preferred embodiment of the present invention.

FIG. 47 is a cross-sectional view of a piezoelectric device according to the fourth preferred embodiment of the present invention. FIG. 47 shows the same cross-sectional view as that of FIG. 2. As shown in FIG. 47, a piezoelectric device 400 according to the fourth preferred embodiment of the present invention includes a base portion 110 and a multilayer portion 420.

In the present preferred embodiment, base portion 110 includes only a body base portion 110a. An opening 113 of base portion 110 is covered from above with multilayer portion 420 laminated on a one principal surface 111 side of base portion 110.

Multilayer portion 420 includes, at least above opening 113, a single crystal piezoelectric material layer 130, a top electrode layer 140, a bottom electrode layer 150, and a reinforcing layer 460. Multilayer portion 420 further includes an intermediate layer 490.

Multilayer portion 420 includes a membrane portion Mb which is a portion that covers opening 113. Membrane portion Mb is a portion of multilayer portion 420 located on an inner side of an opening edge of opening 113 when viewed in a direction orthogonal or substantially orthogonal to one principal surface 111. Membrane portion Mb is provided with a through slot 180 that passes through membrane portion Mb in the up-down direction.

Reinforcing layer 460 sandwiches top electrode layer 140 with single crystal piezoelectric material layer 130. A portion of reinforcing layer 460 is located above opening 113.

In the present preferred embodiment, reinforcing layer 460 is made of, for example, $Si_3N_4$. A material of reinforcing layer 460 is not limited to $Si_3N_4$ and may be other insulating materials. For example, reinforcing layer 460 may be made of an organic material having electrical insulating properties and thermal insulation properties. When reinforcing layer 460 is made of Si with low electrical resistivity, without providing top electrode layer 140, reinforcing layer 460 can define and function as a top electrode layer.

As such, multilayer portion 420 includes, at least above opening 113, single crystal piezoelectric material layer 130, top electrode layer 140, bottom electrode layer 150, and reinforcing layer 460.

Intermediate layer 490 sandwiches bottom electrode layer 150 with single crystal piezoelectric material layer 130. An opening 493 that communicates with opening 113 of base portion 110 is provided in a bottom surface of intermediate layer 490. Opening 493 is located above opening 113. By opening 493, a portion of a bottom surface of bottom electrode layer 150 is exposed. The portion of the bottom surface of bottom electrode layer 150 exposed by opening 493 forms a bottom surface of membrane portion Mb.

Intermediate layer 490 is made of, for example, $SiO_2$. A material of intermediate layer 490 is not limited to $SiO_2$ and may be any insulating material. For example, intermediate layer 490 may be made of an organic material having electrical insulating properties and thermal insulation properties.

As described above, membrane portion Mb is provided with through slot 180 that passes through membrane portion Mb in the up-down direction. The width of through slot 180 becomes narrower as through slot 180 extends downward in each of single crystal piezoelectric material layer 130 and reinforcing layer 460.

In single crystal piezoelectric material layer 130 and reinforcing layer 460, the maximum width of through slot 180 in a layer located on the bottom side is smaller than the minimum width of through slot 180 in a layer located on the top side. In the present preferred embodiment, single crystal piezoelectric material layer 130 is the layer located on the bottom side, and reinforcing layer 460 is the layer located on the top side. The maximum width of through slot 180 in single crystal piezoelectric material layer 130 is smaller than the minimum width of through slot 180 in reinforcing layer 460.

Specifically, single crystal piezoelectric material layer 130 includes edge surfaces 138 that are in contact with through slot 180. Reinforcing layer 460 includes edge surfaces 468 that are in contact with through slot 180. Top electrode layer 140 sandwiched between single crystal piezoelectric material layer 130 and reinforcing layer 460 has edge surfaces 148.

In the present preferred embodiment, edge surfaces 468 are top-side edge surfaces, edge surfaces 138 are bottom-side edge surfaces, and edge surfaces 148 are intermediate edge surfaces. The inclination angle of edge surfaces 468 which are the top-side edge surfaces is smaller than the inclination angle of edge surfaces 138 which are the bottom-side edge surfaces. Namely, the minimum width of through slot 180 in single crystal piezoelectric material layer 130 is the width of through slot 180 at the locations of bottom edges of edge surfaces 138 of single crystal piezoelectric material layer 130. The maximum width of through slot 180 in reinforcing layer 460 is the width of through slot 180 at the locations of top edges of edge surfaces 468 of reinforcing layer 460. Edge surface 148 which is an intermediate edge surface is located on a plane extending from edge surface 468 which is a top-side edge surface, and continues with edge surface 468.

Through slot 180 is narrowest at its edge portion on an opening 113 side. Namely, through slot 180 is narrowest at the locations of bottom edges of edge surfaces 158 of bottom electrode layer 150 in the up-down direction.

A non-limiting example of a method of manufacturing a piezoelectric device according to the fourth preferred embodiment of the present invention will be described below.

Figure 48:
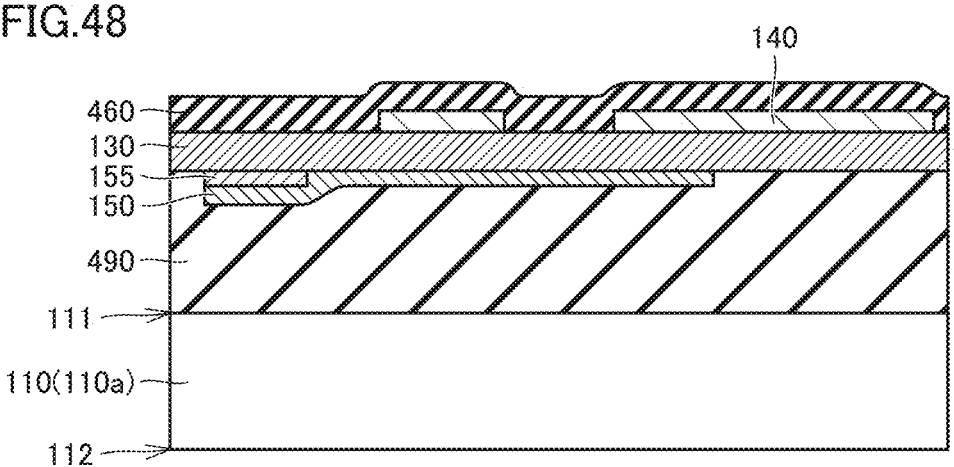
FIG. 48 is a cross-sectional view showing a state in which a reinforcing layer is provided on a top surface of each of a top electrode layer and a single crystal piezoelectric material layer in a method of manufacturing a piezoelectric device according to the fourth preferred embodiment of the present invention.

FIG. 48 is a cross-sectional view showing a state in which a reinforcing layer is provided on a top surface of each of a top electrode layer and a single crystal piezoelectric material layer in the method of manufacturing a piezoelectric device according to the fourth preferred embodiment of the present invention. First, the method of manufacturing a piezoelectric device according to the fourth preferred embodiment of the present invention is the same or substantially the same as the method of manufacturing piezoelectric device 200 according to the second preferred embodiment of the present invention up to the process shown in FIG. 26 in the method of manufacturing piezoelectric device 200 according to the second preferred embodiment of the present invention, except that an intermediate layer 490 is formed instead of reinforcing layer 260.

Then, as shown in FIG. 48, a reinforcing layer 460 is provided on a top surface of each of a top electrode layer 140 and a single crystal piezoelectric material layer 130 by, for example, a CVD process, a PVD process, or the like.

Figure 49:
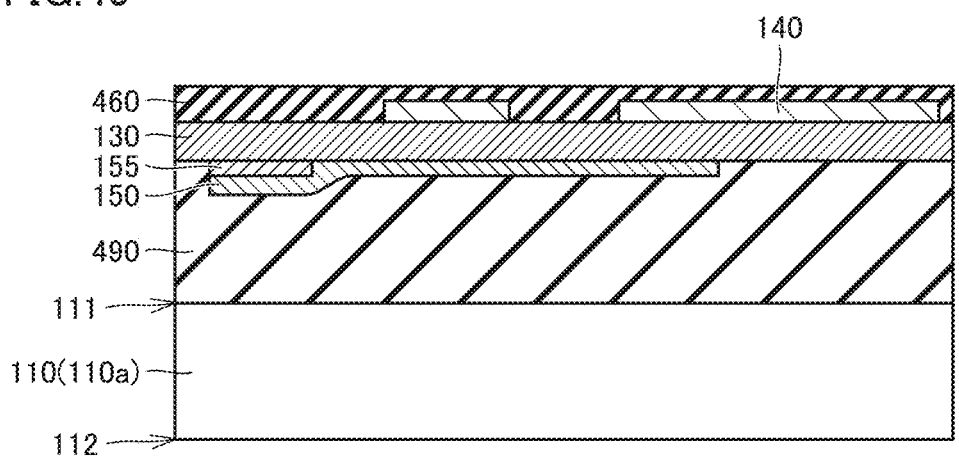
FIG. 49 is a cross-sectional view showing a state in which a top surface of the reinforcing layer is flattened in the method of manufacturing a piezoelectric device according to the fourth preferred embodiment of the present invention.

FIG. 49 is a cross-sectional view showing a state in which a top surface of the reinforcing layer is flattened in the method of manufacturing a piezoelectric device according to the fourth preferred embodiment of the present invention. As shown in FIG. 49, the top surface of reinforcing layer 460 is flattened by, for example, CMP or the like.

Figure 50:
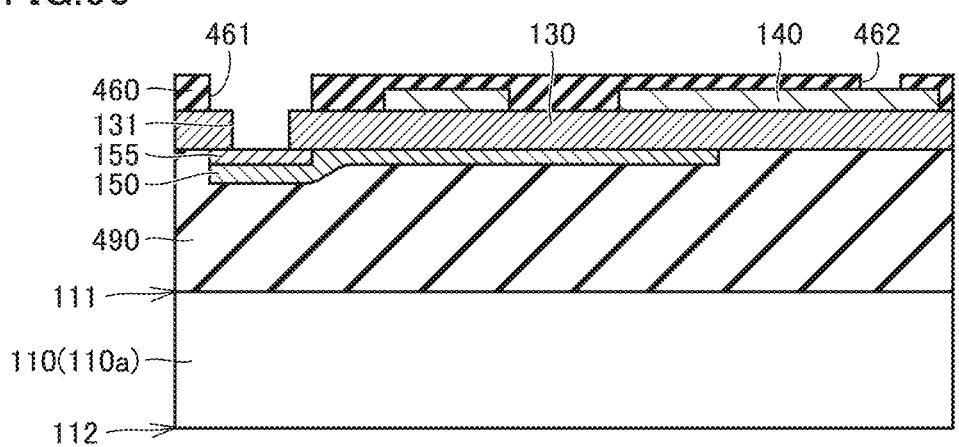
FIG. 50 is a cross-sectional view showing a state in which a hole is provided in each of the single crystal piezoelectric material layer and the reinforcing layer in the method of manufacturing a piezoelectric device according to the fourth preferred embodiment of the present invention.

FIG. 50 is a cross-sectional view showing a state in which a hole is provided in each of the single crystal piezoelectric material layer and the reinforcing layer in the method of manufacturing a piezoelectric device according to the fourth preferred embodiment of the present invention. As shown in FIG. 50, by etching a portion of each of single crystal piezoelectric material layer 130 and reinforcing layer 460, a hole 131 is formed in single crystal piezoelectric material layer 130 and each of a hole 461 and a hole 462 is formed in reinforcing layer 460.

Figure 51:
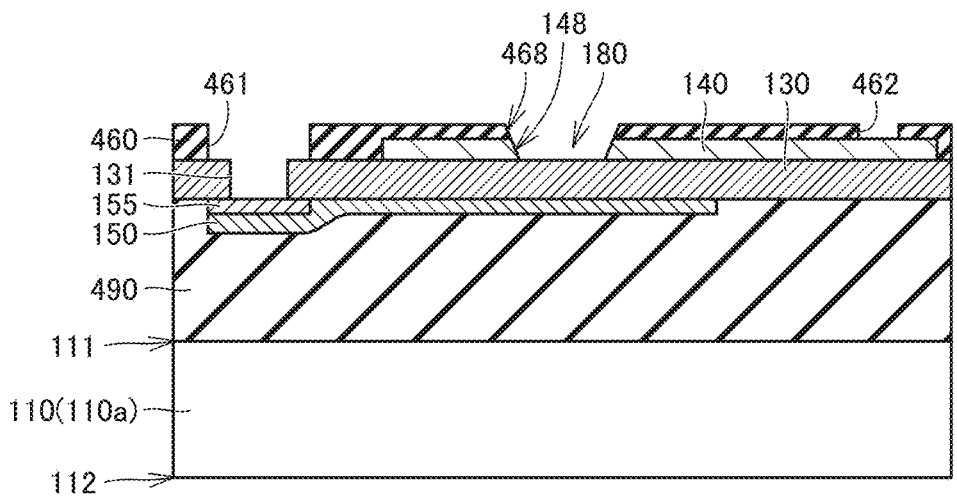
FIG. 51 is a cross-sectional view showing a state in which a through slot is provided in each of the reinforcing layer and the top electrode layer in the method of manufacturing a piezoelectric device according to the fourth preferred embodiment of the present invention.

FIG. 51 is a cross-sectional view showing a state in which a through slot is provided in each of the reinforcing layer and the top electrode layer in the method of manufacturing a piezoelectric device according to the fourth preferred embodiment of the present invention. As shown in FIG. 51, by etching reinforcing layer 460 and top electrode layer 140, a through slot 180 is formed in each of reinforcing layer 460 and top electrode layer 140. By this, edge surfaces 468 that are in contact with through slot 180 are formed in reinforcing layer 460. Edge surfaces 148 that are in contact with through slot 180 are formed in top electrode layer 140.

Figure 52:
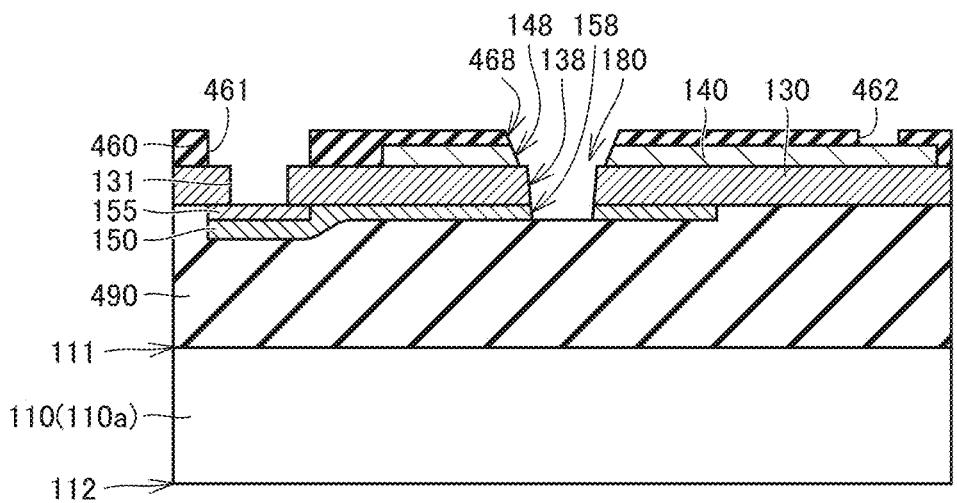
FIG. 52 is a cross-sectional view showing a state in which a through slot is provided so as to extend to a bottom surface of a bottom electrode layer in the method of manufacturing a piezoelectric device according to the fourth preferred embodiment of the present invention.

FIG. 52 is a cross-sectional view showing a state in which a through slot is provided so as to extend to a bottom surface of a bottom electrode layer in the method of manufacturing a piezoelectric device according to the fourth preferred embodiment of the present invention. As shown in FIG. 52, by etching single crystal piezoelectric material layer 130 and a bottom electrode layer 150, a through slot 180 is formed in each of single crystal piezoelectric material layer 130 and bottom electrode layer 150. By this, edge surfaces 138 that are in contact with through slot 180 are formed in single crystal piezoelectric material layer 130. Edge surfaces 158 that are in contact with through slot 180 are formed in bottom electrode layer 150.

Figure 53:
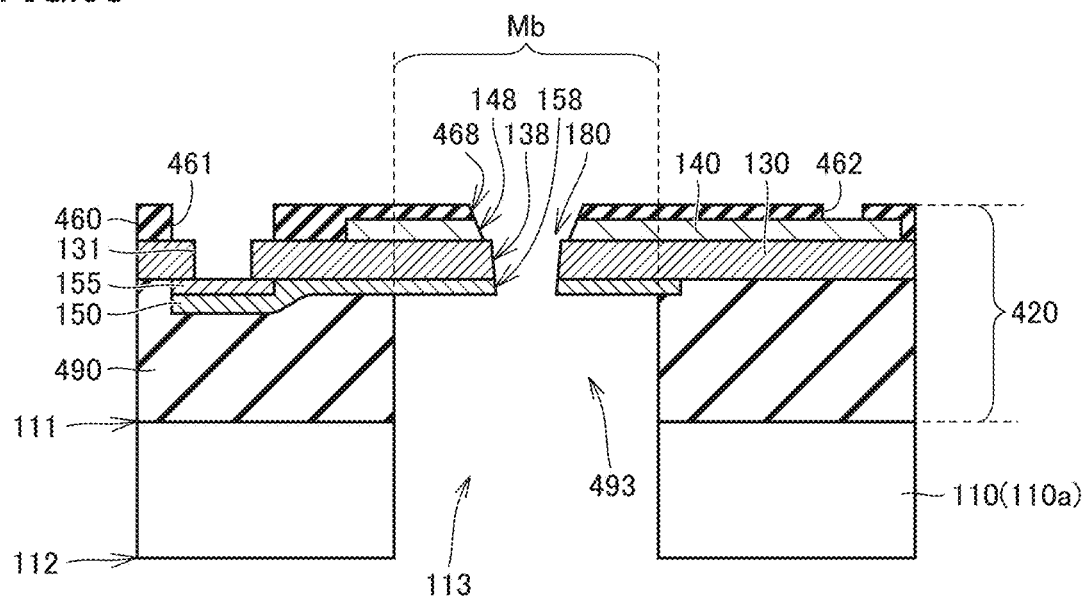
FIG. 53 is a cross-sectional view showing a state in which an opening is formed in the method of manufacturing a piezoelectric device according to the fourth preferred embodiment of the present invention.

FIG. 53 is a cross-sectional view showing a state in which an opening is formed in the method of manufacturing a piezoelectric device according to the fourth preferred embodiment of the present invention. As shown in FIG. 53, by performing, for example, deep reactive ion etching or the like from another principal surface 112 side of a base portion 110, an opening 113 is formed in base portion 110 and an opening 493 is formed in intermediate layer 490. By this, a membrane portion Mb is formed in a piezoelectric device 400 according to the present preferred embodiment.

Finally, each of a first lead wiring line 171 and a second lead wiring line 172 is provided by, for example, a lift-off process, a plating process, an etching process, or the like. By the above-described processes, piezoelectric device 400 according to the fourth preferred embodiment of the present invention such as that shown in FIG. 47 is manufactured.

As described above, in piezoelectric device 400 according to the fourth preferred embodiment of the present invention, the width of through slot 180 becomes narrower as through slot 180 extends downward in each of single crystal piezoelectric material layer 130 and reinforcing layer 460. In single crystal piezoelectric material layer 130 and reinforcing layer 460, the maximum width of through slot 180 in a layer located on the bottom side is smaller than the minimum width of through slot 180 in a layer located on the top side.

By this, viscous drag of fluid passing through the through slot 180 that occurs upon up-and-down vibration of membrane portion Mb is reduced, enabling an increase in the excitation efficiency of piezoelectric device 400.

In piezoelectric device 400 according to the present preferred embodiment, the inclination angle of edge surfaces 468 of reinforcing layer 460 which are top-side edge surfaces is smaller than the inclination angle of edge surfaces 138 of single crystal piezoelectric material layer 130 which are bottom-side edge surfaces. By this, viscous drag at edge surfaces 468 of reinforcing layer 460 can be effectively reduced.

Modifications of piezoelectric device 400 according to the fourth preferred embodiment of the present invention will be described below.

Figure 54:
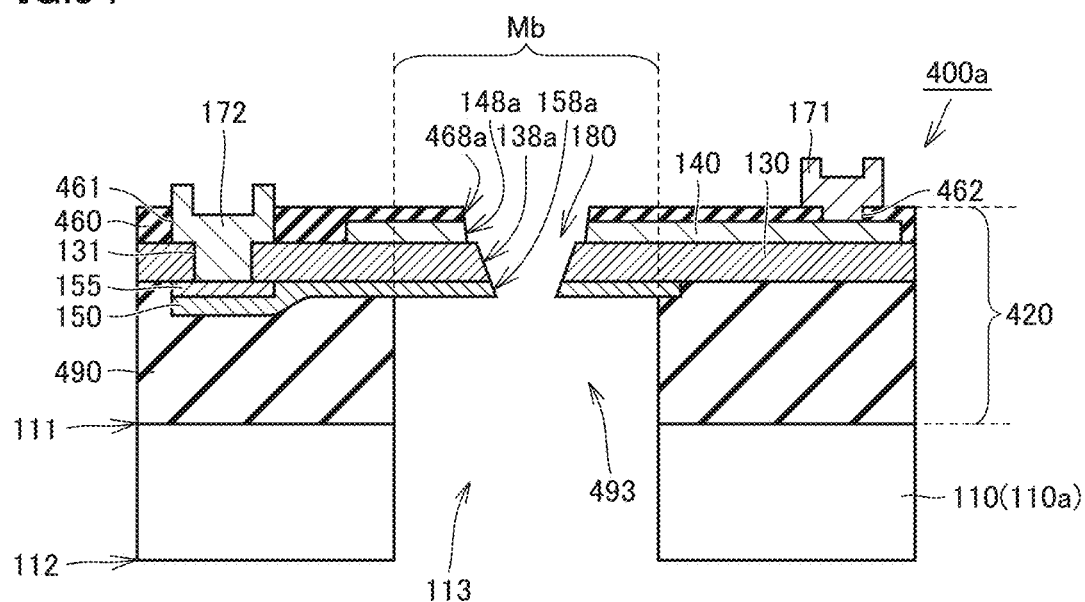
FIG. 54 is a cross-sectional view showing a configuration of a piezoelectric device according to a first modification of the fourth preferred embodiment of the present invention.

FIG. 54 is a cross-sectional view showing a configuration of a piezoelectric device according to a first modification of the fourth preferred embodiment of the present invention. FIG. 54 shows the same cross-sectional view as that of FIG. 47.

As shown in FIG. 54, in a piezoelectric device 400a according to the first modification of the fourth preferred embodiment of the present invention, the inclination angle of edge surfaces 138a of single crystal piezoelectric material layer 130 which are bottom-side edge surfaces is smaller than the inclination angle of edge surfaces 468a of reinforcing layer 460 which are top-side edge surfaces. An edge surface 148a of top electrode layer 140 which is an intermediate edge surface is located on a plane extending from edge surface 468a which is a top-side edge surface, and continues with edge surface 468a. An edge surface 158a of bottom electrode layer 150 is located on a plane extending from edge surface 138a which is a bottom-side edge surface, and continues with edge surface 138a. By this, viscous drag at edge surface 138a of single crystal piezoelectric material layer 130 can be effectively reduced.

Figure 55:
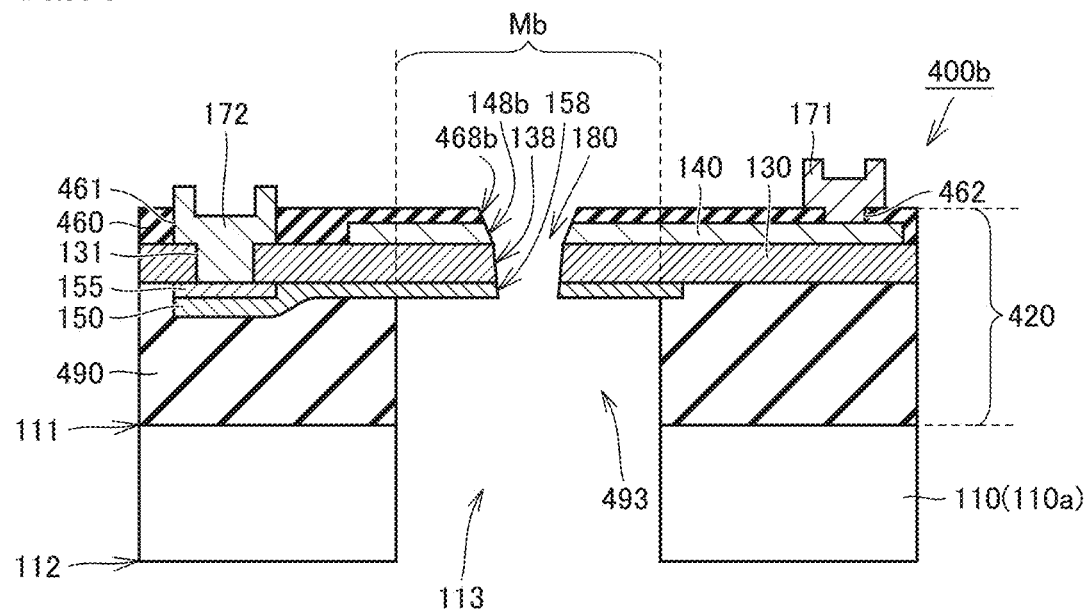
FIG. 55 is a cross-sectional view showing a configuration of a piezoelectric device according to a second modification of the fourth preferred embodiment of the present invention.

FIG. 55 is a cross-sectional view showing a configuration of a piezoelectric device according to a second modification of the fourth preferred embodiment of the present invention. FIG. 55 shows the same cross-sectional view as that of FIG. 47. As shown in FIG. 55, in a piezoelectric device 400b according to the second modification of the fourth preferred embodiment of the present invention, in single crystal piezoelectric material layer 130 and reinforcing layer 460, a bottom-side edge surface, which is in contact with through slot 180, of a layer located on the bottom side continues with a top-side edge surface, which is in contact with through slot 180, of a layer located on the top side, with an intermediate edge surface, which is in contact with through slot 180, of top electrode layer 140 or bottom electrode layer 150 interposed therebetween.

In the present modification, edge surface 138 of single crystal piezoelectric material layer 130 which is a bottom-side edge surface continues with an edge surface 468b of reinforcing layer 460 which is a top-side edge surface, with an edge surface 148b of top electrode layer 140, which is an intermediate edge surface, interposed therebetween.

By this, viscous drag of fluid passing through the through slot 180 that occurs upon up-and-down vibration of membrane portion Mb is effectively reduced, enabling an increase in the excitation efficiency of piezoelectric device 400b. Furthermore, stress concentration between single crystal piezoelectric material layer 130 and top electrode layer 140 is reduced, enabling reduction or prevention of occurrence of interlayer peeling between single crystal piezoelectric material layer 130 and top electrode layer 140.

Figure 56:
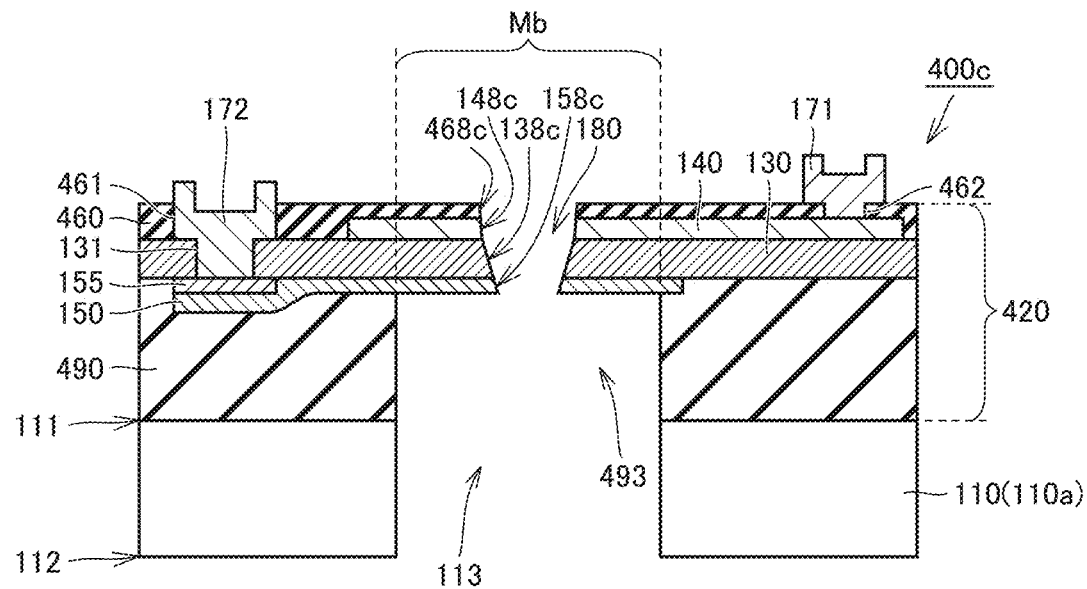
FIG. 56 is a cross-sectional view showing a configuration of a piezoelectric device according to a third modification of the fourth preferred embodiment of the present invention.

FIG. 56 is a cross-sectional view showing a configuration of a piezoelectric device according to a third modification of the fourth preferred embodiment of the present invention. FIG. 56 shows the same cross-sectional view as that of FIG. 47. As shown in FIG. 56, in a piezoelectric device 400c according to the third modification of the fourth preferred embodiment of the present invention, the inclination angle of edge surfaces 138c of single crystal piezoelectric material layer 130 which are bottom-side edge surfaces is smaller than the inclination angle of edge surfaces 468c of reinforcing layer 460 which are top-side edge surfaces. By this, viscous drag at edge surfaces 138c of single crystal piezoelectric material layer 130 can be effectively reduced.

In addition, edge surface 138c of single crystal piezoelectric material layer 130 which is a bottom-side edge surface continues with edge surface 468c of reinforcing layer 460 which is a top-side edge surface, with an edge surface 148c of top electrode layer 140, which is an intermediate edge surface, interposed therebetween. An edge surface 158c of bottom electrode layer 150 is located on a plane extending from edge surface 138c which is a bottom-side edge surface, and continues with edge surface 138c.

By this, viscous drag of fluid passing through the through slot 180 that occurs upon up-and-down vibration of membrane portion Mb is effectively reduced, enabling an increase in the excitation efficiency of piezoelectric device 400c. Furthermore, stress concentration between single crystal piezoelectric material layer 130 and top electrode layer 140 is reduced, enabling reduction or prevention of occurrence of interlayer peeling between single crystal piezoelectric material layer 130 and top electrode layer 140.

Fifth Preferred Embodiment

A piezoelectric device according to a fifth preferred embodiment of the present invention will be described below with reference to drawings. The piezoelectric device according to the fifth preferred embodiment of the present invention differs from piezoelectric device 100 according to the first preferred embodiment of the present invention in that a reinforcing layer also serves as a bottom electrode layer, and thus, description of the same or corresponding components as those of piezoelectric device 100 according to the first preferred embodiment of the present invention is not repeated.

Figure 57:
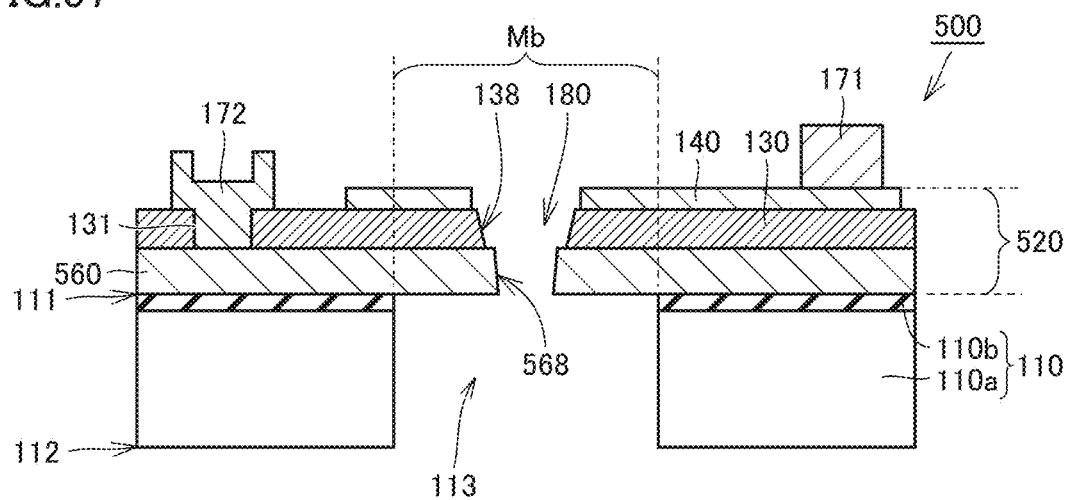
FIG. 57 is a cross-sectional view of a piezoelectric device according to a fifth preferred embodiment of the present invention.

FIG. 57 is a cross-sectional view of a piezoelectric device according to the fifth preferred embodiment of the present invention. FIG. 57 shows the same cross-sectional view as that of FIG. 2. As shown in FIG. 57, a piezoelectric device 500 according to the fifth preferred embodiment of the present invention includes a base portion 110 and a multilayer portion 520.

Multilayer portion 520 includes, at least above an opening 113, a single crystal piezoelectric material layer 130, a top electrode layer 140, and a reinforcing layer 560.

Multilayer portion 520 includes a membrane portion Mb which is a portion that covers opening 113. Membrane portion Mb is a portion of multilayer portion 520 located on an inner side of an opening edge of opening 113 when viewed in a direction orthogonal to one principal surface 111. Membrane portion Mb is provided with a through slot 180 that passes through membrane portion Mb in the up-down direction.

Top electrode layer 140 is disposed adjacent to single crystal piezoelectric material layer 130. Top electrode layer 140 is disposed on a top side of single crystal piezoelectric material layer 130.

Reinforcing layer 560 faces at least a portion of top electrode layer 140 with single crystal piezoelectric material layer 130 sandwiched therebetween. Reinforcing layer 560 is adjacent to a bottom surface of single crystal piezoelectric material layer 130.

A portion of reinforcing layer 560 is located above opening 113. The portion of reinforcing layer 560 covers opening 113. A portion of reinforcing layer 560 that does not cover opening 113 and base portion 110 are directly connected to each other. The portion of reinforcing layer 560 that does not cover opening 113 and base portion 110 may not be directly connected to each other. The portion of reinforcing layer 560 that does not cover opening 113 and base portion 110 may be connected to each other with a metal layer interposed therebetween.

Reinforcing layer 560 is made of, for example, Si. Base portion 110 and reinforcing layer 560 are, for example, a SOI substrate. A material of reinforcing layer 560 is not limited to Si and may be any material having conductivity.

The width of through slot 180 becomes narrower as through slot 180 extends downward in each of single crystal piezoelectric material layer 130 and reinforcing layer 560. In single crystal piezoelectric material layer 130 and reinforcing layer 560, the maximum width of through slot 180 in a layer located on the bottom side is smaller than the minimum width of through slot 180 in a layer located on the top side. In the present preferred embodiment, reinforcing layer 560 is the layer located on the bottom side, and single crystal piezoelectric material layer 130 is the layer located on the top side. The maximum width of through slot 180 in reinforcing layer 560 is smaller than the minimum width of through slot 180 in single crystal piezoelectric material layer 130.

Reinforcing layer 560 includes edge surfaces 568 that are in contact with through slot 180. In the present preferred embodiment, edge surfaces 138 are top-side edge surfaces, and edge surfaces 568 are bottom-side edge surfaces. The inclination angle of edge surfaces 138 which are the top-side edge surfaces is smaller than the inclination angle of edge surfaces 568 which are the bottom-side edge surfaces. The inclination angle of edge surfaces 568 which are the bottom-side edge surfaces may be smaller than the inclination angle of edge surfaces 138 which are the top-side edge surfaces.

The minimum width of through slot 180 in single crystal piezoelectric material layer 130 is the width of through slot 180 at the locations of bottom edges of edge surfaces 138 of single crystal piezoelectric material layer 130. The maximum width of through slot 180 in reinforcing layer 560 is the width of through slot 180 at the locations of top edges of edge surfaces 568 of reinforcing layer 560. As shown in FIG. 57, the width of through slot 180 becomes narrower as through slot 180 extends from its top edge to bottom edge.

Through slot 180 is narrowest at its edge portion on an opening 113 side. Namely, through slot 180 is narrowest at the locations of bottom edges of edge surfaces 568 of reinforcing layer 560 in the up-down direction.

Figure 58:
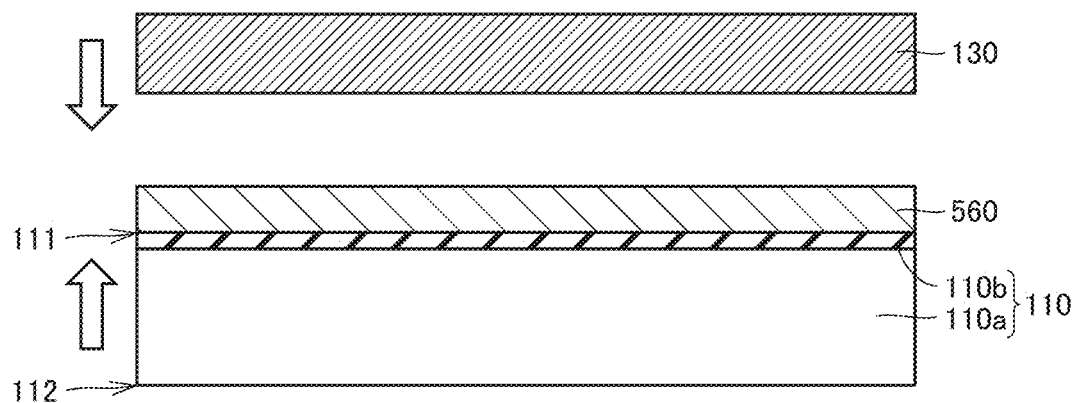
FIG. 58 is a cross-sectional view showing a state in which a single crystal piezoelectric material layer is to be bonded to a SOI substrate in a method of manufacturing a piezoelectric device according to the fifth preferred embodiment of the present invention.

A non-limiting example of a method of manufacturing a piezoelectric device according to the fifth preferred embodiment of the present invention will be described below. FIG. 58 is a cross-sectional view showing a state in which a single crystal piezoelectric material layer is to be bonded to a SOI substrate in the method of manufacturing a piezoelectric device according to the fifth preferred embodiment of the present invention. As shown in FIG. 58, a SOI substrate is bonded to a bottom surface of a single crystal piezoelectric material layer 130 by, for example, surface activated bonding, atomic diffusion bonding, or the like.

Figure 59:
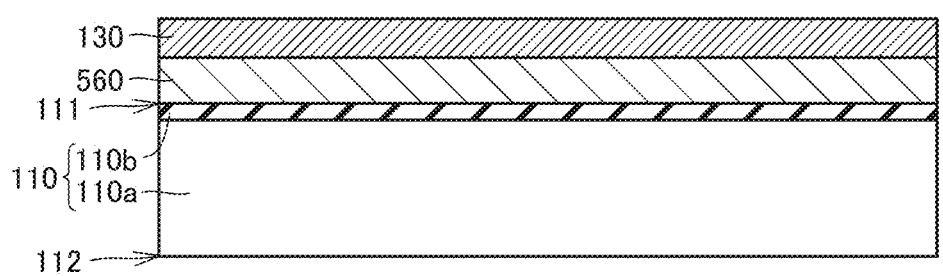
FIG. 59 is a cross-sectional view showing a state in which a top surface of the single crystal piezoelectric material layer is removed in the method of manufacturing a piezoelectric device according to the fifth preferred embodiment of the present invention.

FIG. 59 is a cross-sectional view showing a state in which a top surface of the single crystal piezoelectric material layer is removed in the method of manufacturing a piezoelectric device according to the fifth preferred embodiment of the present invention. As shown in FIG. 59, by removing a top surface of single crystal piezoelectric material layer 130 by, for example, CMP or the like, single crystal piezoelectric material layer 130 has a desired thickness. By implanting ions in advance onto a top surface side of single crystal piezoelectric material layer 130, a release layer may be formed. In this case, by peeling off the release layer before cutting or removing by, for example, CMP or the like the top surface of single crystal piezoelectric material layer 130, thickness adjustment of single crystal piezoelectric material layer 130 becomes easier. The thickness of single crystal piezoelectric material layer 130 is adjusted so that desired excitation of single crystal piezoelectric material layer 130 by application of a voltage can be obtained.

Figure 60:
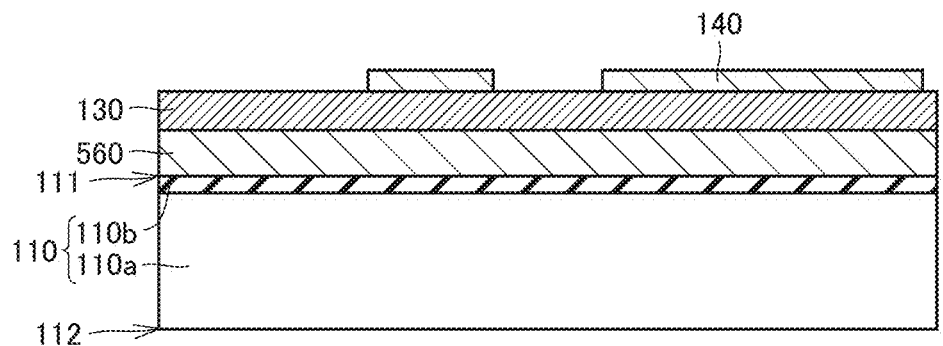
FIG. 60 is a cross-sectional view showing a state in which a top electrode layer is provided on the top surface of the single crystal piezoelectric material layer in the method of manufacturing a piezoelectric device according to the fifth preferred embodiment of the present invention.

FIG. 60 is a cross-sectional view showing a state in which a top electrode layer is provided on the top surface of the single crystal piezoelectric material layer in the method of manufacturing a piezoelectric device according to the fifth preferred embodiment of the present invention. As shown in FIG. 60, a top electrode layer 140 is provided on a portion of the top surface of single crystal piezoelectric material layer 130 by, for example, a lift-off process, a plating process, an etching process, or the like.

Figure 61:
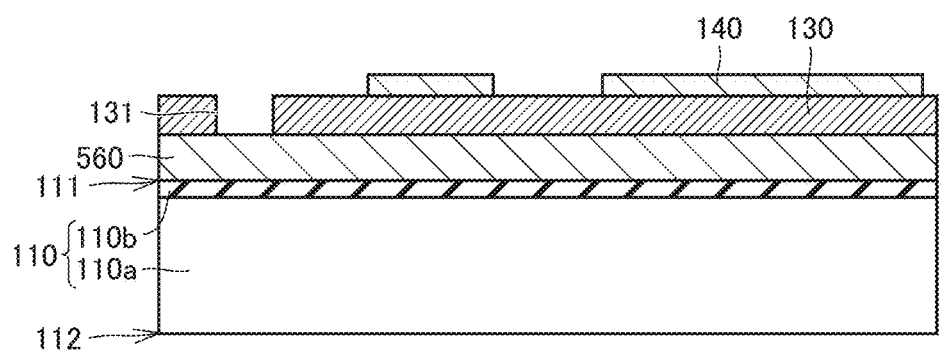
FIG. 61 is a cross-sectional view showing a state in which a hole is provided in the single crystal piezoelectric material layer in the method of manufacturing a piezoelectric device according to the fifth preferred embodiment of the present invention.

FIG. 61 is a cross-sectional view showing a state in which a hole is provided in the single crystal piezoelectric material layer in the method of manufacturing a piezoelectric device according to the fifth preferred embodiment of the present invention. As shown in FIG. 61, by etching a portion of single crystal piezoelectric material layer 130, a hole 131 is formed.

Figure 62:
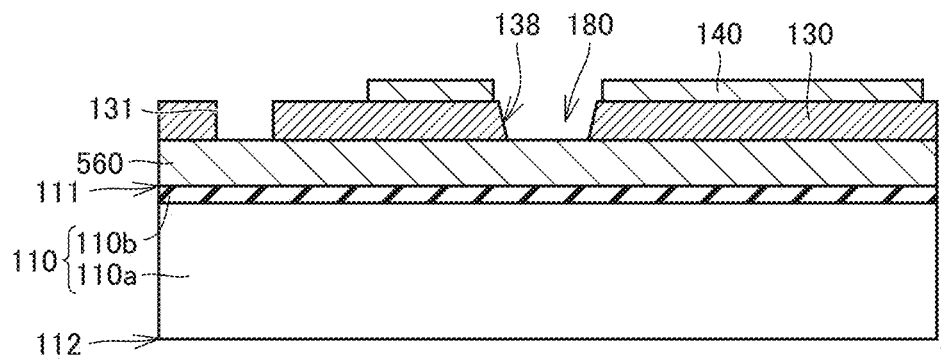
FIG. 62 is a cross-sectional view showing a state in which a through slot is provided in the single crystal piezoelectric material layer in the method of manufacturing a piezoelectric device according to the fifth preferred embodiment of the present invention.

FIG. 62 is a cross-sectional view showing a state in which a through slot is provided in the single crystal piezoelectric material layer in the method of manufacturing a piezoelectric device according to the fifth preferred embodiment of the present invention. As shown in FIG. 62, by etching single crystal piezoelectric material layer 130, a through slot 180 is formed in single crystal piezoelectric material layer 130. By this, edge surfaces 138 that are in contact with through slot 180 are formed in single crystal piezoelectric material layer 130.

Figure 63:
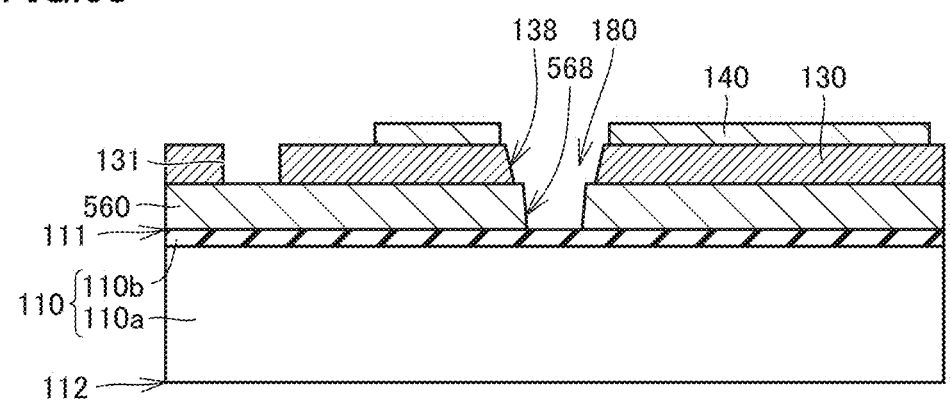
FIG. 63 is a cross-sectional view showing a state in which a through slot is provided so as to extend to a bottom surface of a reinforcing layer in the method of manufacturing a piezoelectric device according to the fifth preferred embodiment of the present invention.

FIG. 63 is a cross-sectional view showing a state in which a through slot is provided so as to extend to a bottom surface of a reinforcing layer in the method of manufacturing a piezoelectric device according to the fifth preferred embodiment of the present invention. As shown in FIG. 63, by etching a reinforcing layer 560, a through slot 180 is formed in reinforcing layer 560. By this, edge surfaces 568 that are in contact with through slot 180 are formed in reinforcing layer 560.

Figure 64:
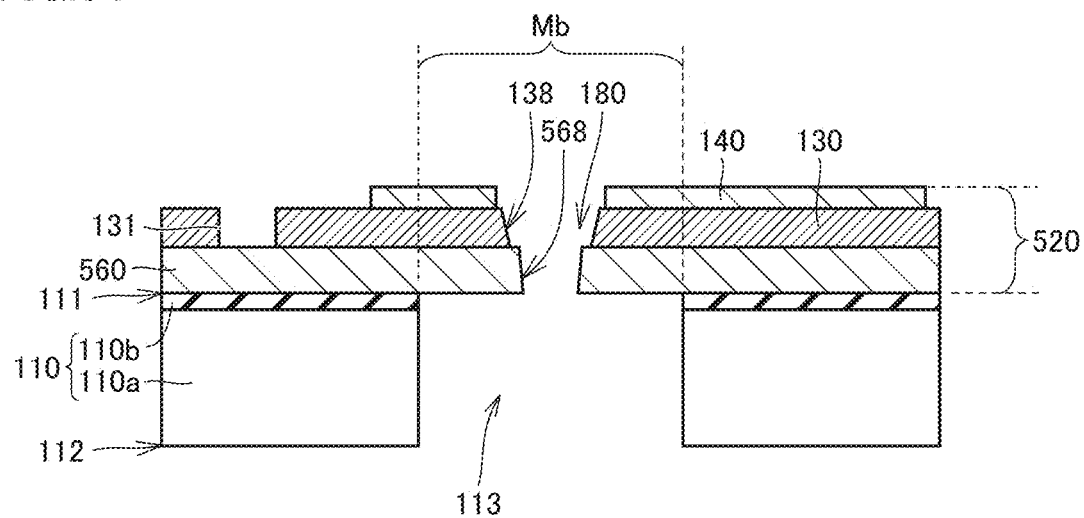
FIG. 64 is a cross-sectional view showing a state in which an opening is formed in the method of manufacturing a piezoelectric device according to the fifth preferred embodiment of the present invention.

FIG. 64 is a cross-sectional view showing a state in which an opening is formed in the method of manufacturing a piezoelectric device according to the fifth preferred embodiment of the present invention. As shown in FIG. 64, by performing deep reactive ion etching or the like on a base portion 110 from another principal surface 112 side of base portion 110, an opening 113 is formed in base portion 110. By this, a membrane portion Mb is formed in a piezoelectric device 500 according to the present preferred embodiment.

Finally, each of a first lead wiring line 171 and a second lead wiring line 172 is provided by, for example, a lift-off process, a plating process, an etching process, or the like. By the above-described processes, piezoelectric device 500 according to the fifth preferred embodiment of the present invention such as that shown in FIG. 57 is manufactured.

As described above, in piezoelectric device 500 according to the fifth preferred embodiment of the present invention, the width of through slot 180 becomes narrower as through slot 180 extends downward in each of single crystal piezoelectric material layer 130 and reinforcing layer 560. In single crystal piezoelectric material layer 130 and reinforcing layer 560, the maximum width of through slot 180 in a layer located on the bottom side is smaller than the minimum width of through slot 180 in a layer located on the top side.

By this, viscous drag of fluid passing through the through slot 180 that occurs upon up-and-down vibration of membrane portion Mb is reduced, enabling an increase in the excitation efficiency of piezoelectric device 500.

In piezoelectric device 500 according to the present preferred embodiment, the inclination angle of edge surfaces 138 of single crystal piezoelectric material layer 130 which are top-side edge surfaces is smaller than the inclination angle of edge surfaces 568 of reinforcing layer 560 which are bottom-side edge surfaces. By this, viscous drag at edge surfaces 138 of single crystal piezoelectric material layer 130 can be effectively reduced. In addition, by allowing reinforcing layer 560 to function as a bottom electrode layer, a configuration of piezoelectric device 500 can be simplified.

Sixth Preferred Embodiment

A piezoelectric device according to a sixth preferred embodiment of the present invention will be described below with reference to drawings. The piezoelectric device according to the sixth preferred embodiment of the present invention differs from piezoelectric device 400 according to the fourth preferred embodiment of the present invention in that a reinforcing layer also serves as a top electrode layer, and thus, description of the same or corresponding components as those of piezoelectric device 400 according to the fourth preferred embodiment of the present invention is not repeated.

Figure 65:
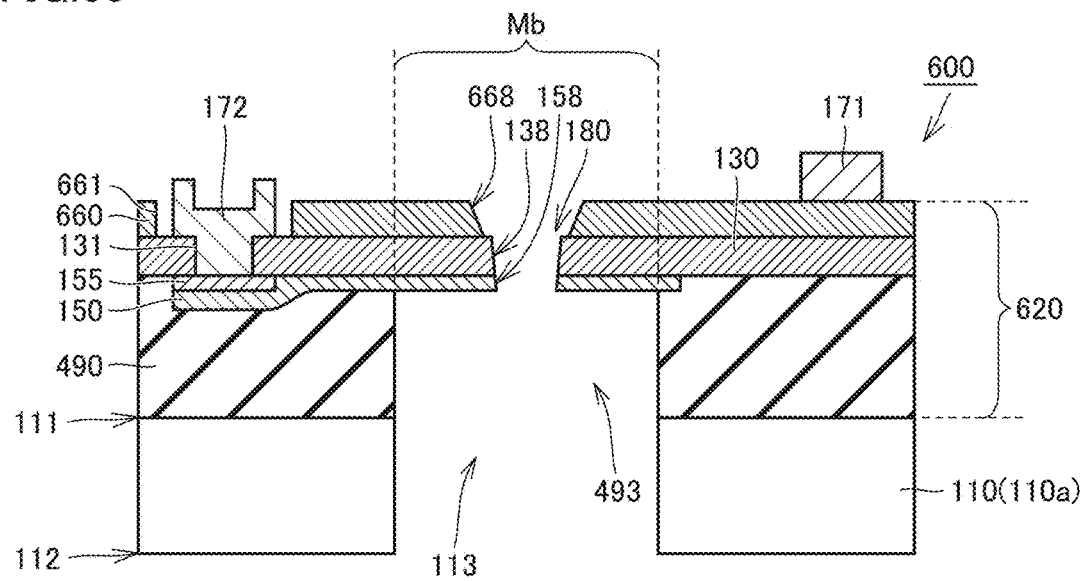
FIG. 65 is a cross-sectional view of a piezoelectric device according to a sixth preferred embodiment of the present invention.

FIG. 65 is a cross-sectional view of a piezoelectric device according to the sixth preferred embodiment of the present invention. FIG. 65 shows the same cross-sectional view as that of FIG. 2. As shown in FIG. 65, a piezoelectric device 600 according to the sixth preferred embodiment of the present invention includes a base portion 110 and a multilayer portion 620.

In the present preferred embodiment, base portion 110 includes only a body base portion 110*a*. An opening 113 of base portion 110 is covered from above with multilayer portion 620 laminated on a one principal surface 111 side of base portion 110.

Multilayer portion 620 includes, at least above opening 113, a single crystal piezoelectric material layer 130, a bottom electrode layer 150, and a reinforcing layer 660. Multilayer portion 620 further includes an intermediate layer 490.

Multilayer portion 620 includes a membrane portion Mb which is a portion that covers opening 113. Membrane portion Mb is a portion of multilayer portion 620 located on an inner side of an opening edge of opening 113 when viewed in a direction orthogonal to one principal surface 111. Membrane portion Mb is provided with a through slot 180 that passes through membrane portion Mb in the up-down direction.

Bottom electrode layer 150 is disposed adjacent to single crystal piezoelectric material layer 130. Bottom electrode layer 150 is disposed on a bottom side of single crystal piezoelectric material layer 130.

Reinforcing layer 660 faces at least a portion of bottom electrode layer 150 with single crystal piezoelectric material layer 130 sandwiched therebetween. Reinforcing layer 660 is adjacent to a top surface of single crystal piezoelectric material layer 130. A portion of reinforcing layer 660 is located above opening 113. The portion of reinforcing layer 660 covers opening 113.

Reinforcing layer 660 is made of, for example, Si. A material of reinforcing layer 660 is not limited to Si and may be any material having conductivity.

The width of through slot 180 becomes narrower as through slot 180 extends downward in each of single crystal piezoelectric material layer 130 and reinforcing layer 660. In single crystal piezoelectric material layer 130 and reinforcing layer 660, the maximum width of through slot 180 in a layer located on the bottom side is smaller than the minimum width of through slot 180 in a layer located on the top side. In the present preferred embodiment, single crystal piezoelectric material layer 130 is the layer located on the bottom side, and reinforcing layer 660 is the layer located on the top side. The maximum width of through slot 180 in single crystal piezoelectric material layer 130 is smaller than the minimum width of through slot 180 in reinforcing layer 660.

Reinforcing layer 660 includes edge surfaces 668 that are in contact with through slot 180. In the present preferred embodiment, edge surfaces 668 are top-side edge surfaces, and edge surfaces 138 are bottom-side edge surfaces. The inclination angle of edge surfaces 668 which are the top-side edge surfaces is smaller than the inclination angle of edge surfaces 138 which are the bottom-side edge surfaces. Note that the inclination angle of edge surfaces 138 which are the bottom-side edge surfaces may be smaller than the inclination angle of edge surfaces 668 which are the top-side edge surfaces.

The minimum width of through slot 180 in single crystal piezoelectric material layer 130 is the width of through slot 180 at the locations of bottom edges of edge surfaces 138 of single crystal piezoelectric material layer 130. The maximum width of through slot 180 in reinforcing layer 660 is the width of through slot 180 at the locations of top edges of edge surfaces 668 of reinforcing layer 660. As shown in FIG. 65, the width of through slot 180 becomes narrower as through slot 180 extends from its top edge to bottom edge.

Through slot 180 is narrowest at its edge portion on an opening 113 side. Namely, through slot 180 is narrowest at the locations of bottom edges of edge surfaces 158 of bottom electrode layer 150 in the up-down direction.

A non-limiting example of a method of manufacturing a piezoelectric device according to the sixth preferred embodiment of the present invention will be described below.

Figure 66:
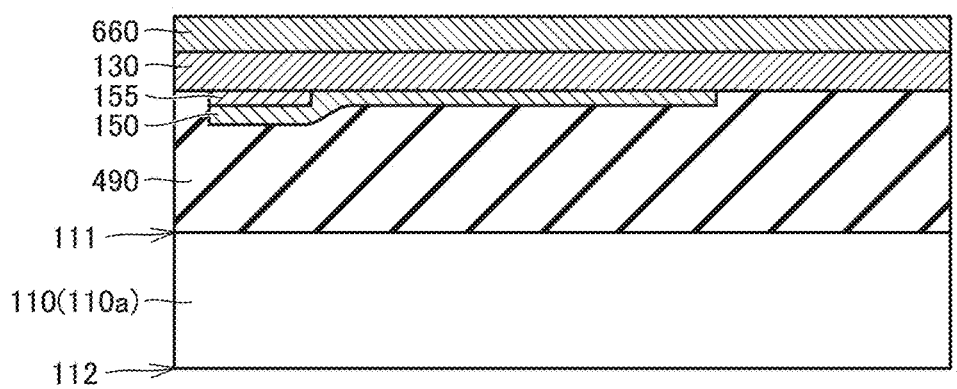
FIG. 66 is a cross-sectional view showing a state in which a reinforcing layer is provided on a top surface of a single crystal piezoelectric material layer in a method of manufacturing a piezoelectric device according to the sixth preferred embodiment of the present invention.

FIG. 66 is a cross-sectional view showing a state in which a reinforcing layer is provided on a top surface of a single crystal piezoelectric material layer in the method of manufacturing a piezoelectric device according to the sixth preferred embodiment of the present invention. First, the method of manufacturing a piezoelectric device according to the sixth preferred embodiment of the present invention is the same or substantially the same as the method of manufacturing piezoelectric device 200 according to the second preferred embodiment of the present invention up to the process shown in FIG. 25 in the method of manufacturing piezoelectric device 200 according to the second preferred embodiment of the present invention, except that an intermediate layer 490 is formed instead of reinforcing layer 260.

Then, as shown in FIG. 66, a reinforcing layer 660 is provided on a top surface of a single crystal piezoelectric material layer 130 by, for example, a CVD process, a PVD process, or the like.

Figure 67:
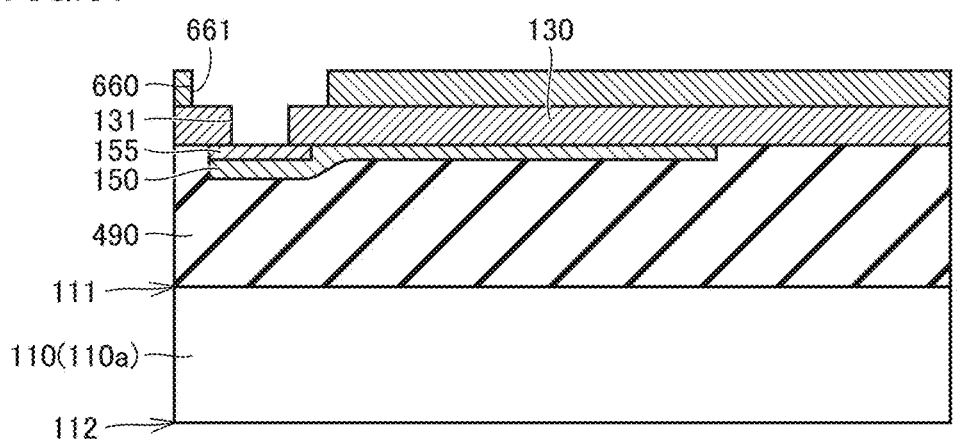
FIG. 67 is a cross-sectional view showing a state in which a hole is provided in each of the single crystal piezoelectric material layer and the reinforcing layer in the method of manufacturing a piezoelectric device according to the sixth preferred embodiment of the present invention.

FIG. 67 is a cross-sectional view showing a state in which a hole is provided in each of the single crystal piezoelectric material layer and the reinforcing layer in the method of manufacturing a piezoelectric device according to the sixth preferred embodiment of the present invention. As shown in FIG. 67, by etching a portion of each of single crystal piezoelectric material layer 130 and reinforcing layer 660, a hole 131 is made in single crystal piezoelectric material layer 130 and a hole 661 is formed in reinforcing layer 660.

Figure 68:
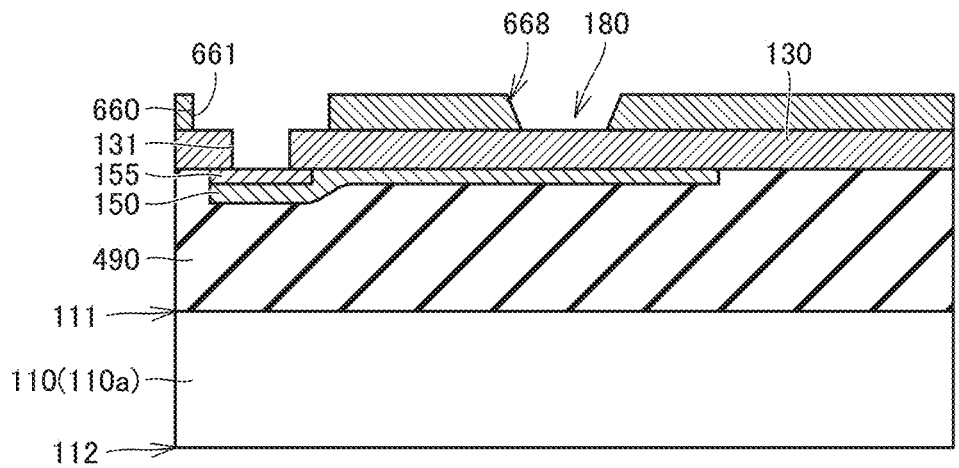
FIG. 68 is a cross-sectional view showing a state in which a through slot is provided in the reinforcing layer in the method of manufacturing a piezoelectric device according to the sixth preferred embodiment of the present invention.

FIG. 68 is a cross-sectional view showing a state in which a through slot is provided in the reinforcing layer in the method of manufacturing a piezoelectric device according to the sixth preferred embodiment of the present invention. As shown in FIG. 68, by etching reinforcing layer 660, a through slot 180 is formed in reinforcing layer 660. By this, edge surfaces 668 that are in contact with through slot 180 are formed in reinforcing layer 660.

Figure 69:
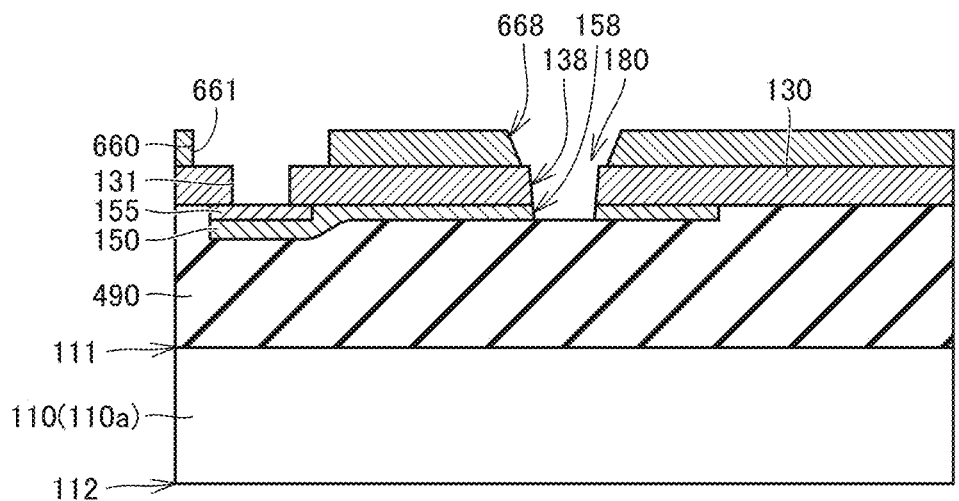
FIG. 69 is a cross-sectional view showing a state in which a through slot is provided so as to extend to a bottom surface of a bottom electrode layer in the method of manufacturing a piezoelectric device according to the sixth preferred embodiment of the present invention.

FIG. 69 is a cross-sectional view showing a state in which a through slot is provided so as to extend to a bottom surface of a bottom electrode layer in the method of manufacturing a piezoelectric device according to the sixth preferred embodiment of the present invention. As shown in FIG. 69, by etching single crystal piezoelectric material layer 130 and a bottom electrode layer 150, a through slot 180 is formed in each of single crystal piezoelectric material layer 130 and bottom electrode layer 150. By this, edge surfaces 138 that are in contact with through slot 180 are formed in single crystal piezoelectric material layer 130. Edge surfaces 158 that are in contact with through slot 180 are formed in bottom electrode layer 150.

Figure 70:
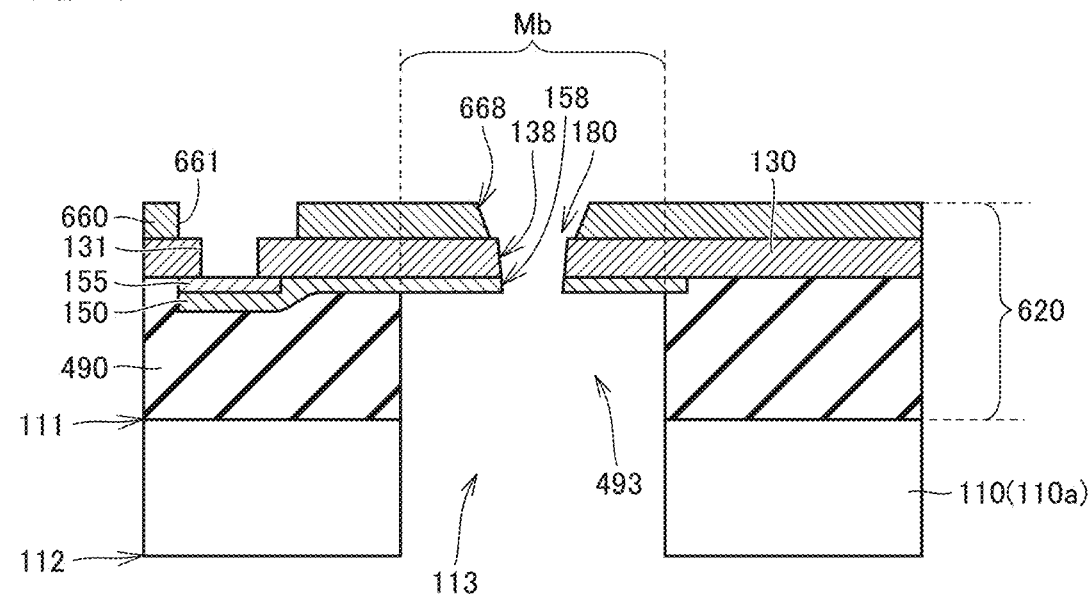
FIG. 70 is a cross-sectional view showing a state in which an opening is formed in the method of manufacturing a piezoelectric device according to the sixth preferred embodiment of the present invention.

FIG. 70 is a cross-sectional view showing a state in which an opening is formed in the method of manufacturing a piezoelectric device according to the sixth preferred embodiment of the present invention. As shown in FIG. 70, by performing, for example, deep reactive ion etching or the like from another principal surface 112 side of a base portion 110, an opening 113 is formed in base portion 110 and an opening 493 is formed in intermediate layer 490. By this, a membrane portion Mb is formed in a piezoelectric device 600 according to the present preferred embodiment.

Finally, each of a first lead wiring line 171 and a second lead wiring line 172 is provided by, for example, a lift-off process, a plating process, an etching process, or the like. By the above-described processes, piezoelectric device 600 according to the sixth preferred embodiment of the present invention such as that shown in FIG. 65 is manufactured.

As described above, in piezoelectric device 600 according to the sixth preferred embodiment of the present invention, the width of through slot 180 becomes narrower as through slot 180 extends downward in each of single crystal piezoelectric material layer 130 and reinforcing layer 660. In single crystal piezoelectric material layer 130 and reinforcing layer 660, the maximum width of through slot 180 in a layer located on the bottom side is smaller than the minimum width of through slot 180 in a layer located on the top side.

By this, viscous drag of fluid passing through the through slot 180 that occurs upon up-and-down vibration of membrane portion Mb is reduced, enabling an increase in the excitation efficiency of piezoelectric device 600.

In piezoelectric device 600 according to the present preferred embodiment, the inclination angle of edge surfaces 668 of reinforcing layer 660 which are top-side edge surfaces is smaller than the inclination angle of edge surfaces 138 of single crystal piezoelectric material layer 130 which are bottom-side edge surfaces. By this, viscous drag at edge surfaces 668 of reinforcing layer 660 can be effectively reduced. In addition, by allowing reinforcing layer 660 to function as a top electrode layer, a configuration of piezoelectric device 600 can be simplified.

Seventh Preferred Embodiment

A piezoelectric device according to a seventh preferred embodiment of the present invention will be described below with reference to drawings. The piezoelectric device according to the seventh preferred embodiment of the present invention differs from piezoelectric device 100 according to the first preferred embodiment of the present invention in that the width of a through slot in a reinforcing layer becomes wider as the through slot extends downward, and thus, description of the same components as those of piezoelectric device 100 according to the first preferred embodiment of the present invention is not repeated.

Figure 71:
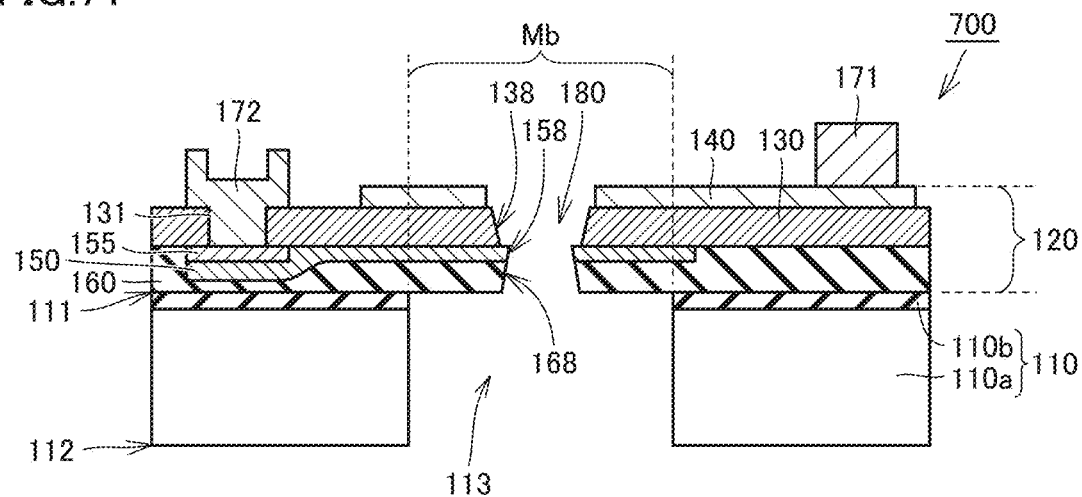
FIG. 71 is a cross-sectional view of a piezoelectric device according to a seventh preferred embodiment of the present invention.

FIG. 71 is a cross-sectional view of a piezoelectric device according to the seventh preferred embodiment of the present invention. FIG. 71 shows the same cross-sectional view as that of FIG. 2. As shown in FIG. 71, a piezoelectric device 700 according to the seventh preferred embodiment of the present invention includes a base portion 110 and a multilayer portion 120.

In the present preferred embodiment, the width of a through slot 180 in a single crystal piezoelectric material layer 130 becomes narrower as through slot 180 extends downward. The width of through slot 180 in a reinforcing layer 160 becomes wider as through slot 180 extends downward.

In single crystal piezoelectric material layer 130 and reinforcing layer 160, the maximum width of through slot 180 in a layer located on the bottom side is smaller than the minimum width of through slot 180 in a layer located on the top side. In the present preferred embodiment, reinforcing layer 160 is the layer located on the bottom side, and single crystal piezoelectric material layer 130 is the layer located on the top side. The maximum width of through slot 180 in reinforcing layer 160 is smaller than the minimum width of through slot 180 in single crystal piezoelectric material layer 130.

Through slot 180 is narrowest in a bottom electrode layer 150. Specifically, through slot 180 is narrowest at the locations of top edges of edge surfaces 158 of bottom electrode layer 150 in the up-down direction.

A non-limiting example of a method of manufacturing a piezoelectric device according to the seventh preferred embodiment of the present invention will be described below.

Figure 72:
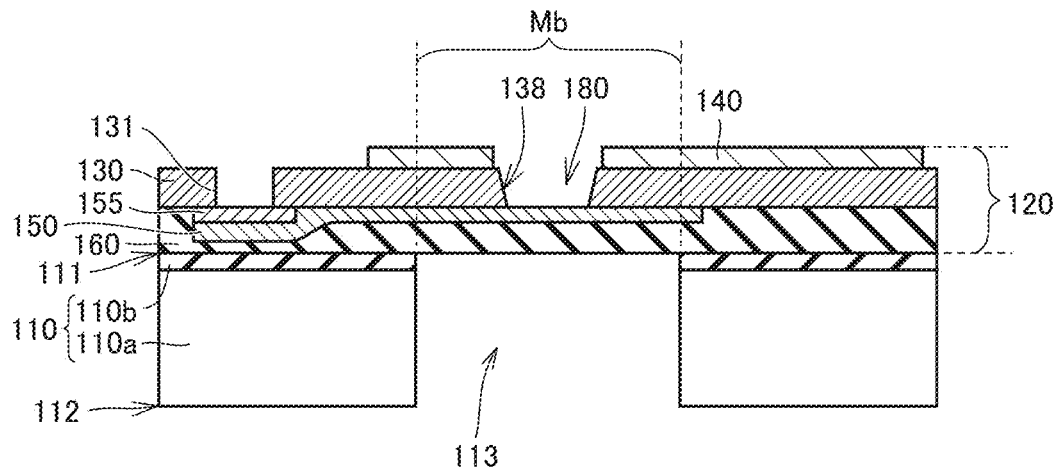
FIG. 72 is a cross-sectional view showing a state in which an opening is formed in a method of manufacturing a piezoelectric device according to the seventh preferred embodiment of the present invention.

FIG. 72 is a cross-sectional view showing a state in which an opening is formed in the method of manufacturing a piezoelectric device according to the seventh preferred embodiment of the present invention. First, the method of manufacturing a piezoelectric device according to the seventh preferred embodiment of the present invention is the same or substantially the same as the method of manufacturing piezoelectric device 100 according to the first preferred embodiment of the present invention up to the process shown in FIG. 12 in the method of manufacturing piezoelectric device 100 according to the first preferred embodiment of the present invention.

As shown in FIG. 72, by performing, for example, deep reactive ion etching or the like on a base portion 110 from another principal surface 112 side of base portion 110, an opening 113 is formed in base portion 110. By this, a membrane portion Mb is formed in a piezoelectric device 700 according to the present preferred embodiment.

Figure 73:
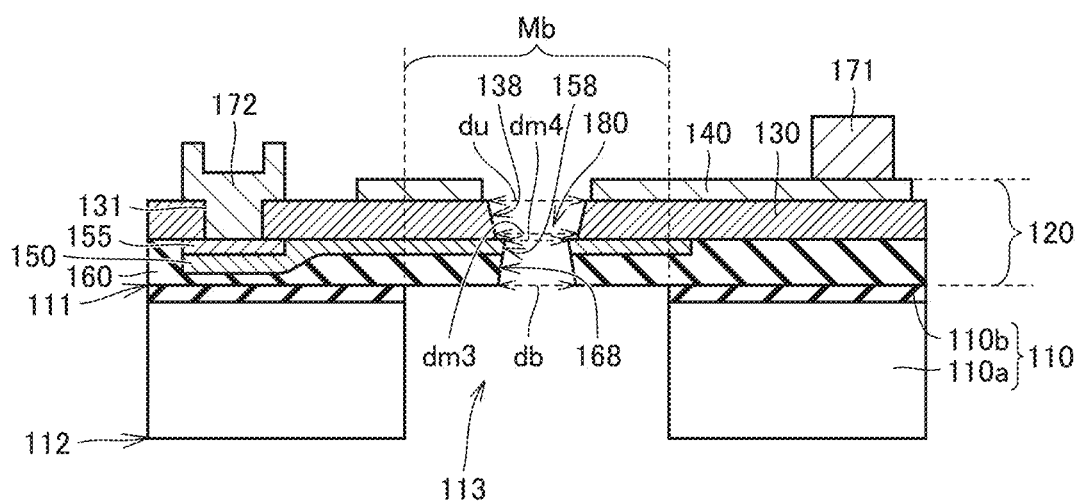
FIG. 73 is a cross-sectional view showing a state in which a through slot is provided so as to extend to a top surface of a bottom electrode layer from an opening side in the method of manufacturing a piezoelectric device according to the seventh preferred embodiment of the present invention.

FIG. 73 is a cross-sectional view showing a state in which a through slot is provided so as to extend to a top surface of a bottom electrode layer from an opening side in the method of manufacturing a piezoelectric device according to the seventh preferred embodiment of the present invention. As shown in FIG. 73, by etching a bottom electrode layer 150 and a reinforcing layer 160 from an opening 113 side, a through slot 180 is formed in each of bottom electrode layer 150 and reinforcing layer 160. By this, edge surfaces 158 that are in contact with through slot 180 are formed in bottom electrode layer 150. Edge surfaces 168 that are in contact with through slot 180 are formed in reinforcing layer 160.

As shown in FIG. 73, in a single crystal piezoelectric material layer 130 and reinforcing layer 160, the maximum width of through slot 180 in a layer located on the top side is du, the minimum width of through slot 180 in the layer located on the top side is dm3, and the maximum width of through slot 180 in a layer located on the bottom side is db. The relationship "du>dm3>db" is satisfied. The minimum width of through slot 180 in bottom electrode layer 150 is dm4. The relationship "db>dm4" is satisfied.

Finally, each of a first lead wiring line 171 and a second lead wiring line 172 is provided by a lift-off process, a plating process, an etching process, or the like. By the above-described processes, piezoelectric device 700 according to the seventh preferred embodiment of the present invention such as that shown in FIG. 73 is manufactured.

Figure 74:
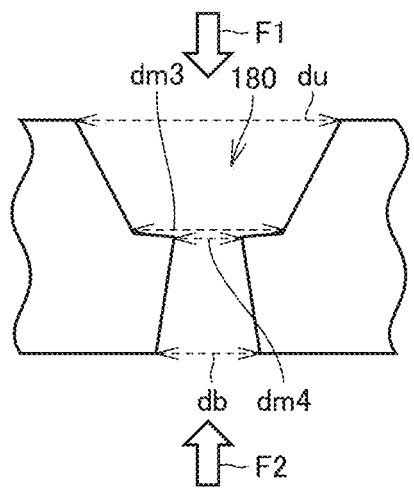
FIG. 74 is a schematic diagram of a shape of a longitudinal section of the through slot at a membrane portion of the piezoelectric device according to the seventh preferred embodiment of the present invention.

FIG. 74 is a schematic diagram of a shape of a longitudinal section of the through slot at the membrane portion of the piezoelectric device according to the seventh preferred embodiment of the present invention. As shown in FIG. 74, by the relationship "du>dm3>db>dm4" being satisfied, each of viscous drag of fluid F1 that enters through slot 180 from the top side and viscous drag of fluid F2 that enters through slot 180 from the bottom side can be reduced.

By this, viscous drag of fluid passing through the through slot 180 that occurs upon up-and-down vibration of membrane portion Mb is effectively reduced, enabling an increase in the excitation efficiency of piezoelectric device 700.

Components that can be combined together in the description of the above-described preferred embodiments may be combined together.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A piezoelectric device comprising:
a base portion including a first principal surface and a second principal surface opposed to the first principal surface, and including an opening extending through the base portion from the first principal surface to the second principal surface; and
a multilayer portion laminated on a side of the first principal surface of the base portion, and covering the opening from above; wherein
the multilayer portion includes at least above the opening, a single crystal piezoelectric material layer, a top electrode layer on a top side of the single crystal piezoelectric material layer, a bottom electrode layer facing at least a portion of the top electrode layer with the single crystal piezoelectric material layer sandwiched between the bottom electrode layer and the top electrode layer, and a reinforcing layer sandwiching the top electrode layer or the bottom electrode layer with the single crystal piezoelectric material layer, and includes a membrane portion covering the opening;
the membrane portion includes a through slot extending through the membrane portion in an up-down direction;

a width of the through slot in the single crystal piezoelectric material layer becomes narrower as the through slot extends downward; and in the single crystal piezoelectric material layer and the reinforcing layer, a maximum width of the through slot in a layer located on a bottom side is smaller than a minimum width of the through slot in a layer located on a top side.

2. The piezoelectric device according to claim 1, wherein a width of the through slot in the reinforcing layer becomes narrower as the through slot extends downward.

3. The piezoelectric device according to claim 1, wherein in the single crystal piezoelectric material layer and the reinforcing layer, a bottom-side edge surface of the layer on the bottom side continues with a top-side edge surface of the layer on the top side, with an intermediate edge surface of the top electrode layer or the bottom electrode layer interposed between the bottom-side edge surface and the top-side edge surface, the bottom-side edge surface, the top-side edge surface, and the intermediate edge surface being in contact with the through slot.

4. The piezoelectric device according to claim 3, wherein an inclination angle of the bottom-side edge surface is smaller than an inclination angle of the top-side edge surface.

5. The piezoelectric device according to claim 3, wherein an inclination angle of the top-side edge surface is smaller than an inclination angle of the bottom-side edge surface.

6. The piezoelectric device according to claim 1, wherein the single crystal piezoelectric material layer is made of lithium tantalate or lithium niobate.

7. The piezoelectric device according to claim 1, wherein the top side and the bottom side of the single crystal piezoelectric material layer is flat.

8. The piezoelectric device according to claim 1, wherein the top electrode layer is made of Al or Pt.

9. The piezoelectric device according to claim 1, wherein an adhesive layer made of Ti is provided between the top electrode layer and the single crystal piezoelectric material layer.

10. The piezoelectric device according to claim 1, wherein the single crystal material layer includes a hole extending through the single crystal material layer from top to bottom.

11. The piezoelectric device according to claim 10, wherein the hole is not located above the opening.

12. The piezoelectric device according to claim 10, wherein a portion of the bottom electrode layer is located above the opening and another portion of the bottom electrode layer is not located above the opening.

13. The piezoelectric device according to claim 1, wherein the bottom electrode layer is made of Al or Pt.

14. The piezoelectric device according to claim 1, wherein the reinforcing layer is made of $Si_3N_4$.

15. A piezoelectric device comprising:

a base portion including a first principal surface and a second principal surface opposed to the first principal surface, and including an opening extending through the base portion from the first principal surface to the second principal surface; and a multilayer portion laminated on a side of the first principal surface of the base portion, and covering the opening from above; wherein the multilayer portion includes, at least above the opening, a single crystal piezoelectric material layer, an electrode layer adjacent to the single crystal piezoelectric material layer, and a reinforcing layer facing at least a portion of the electrode layer with the single crystal piezoelectric material layer located between the reinforcing layer and the electrode layer, and that has conductivity, and includes a membrane portion covering the opening;

the membrane portion includes a through slot extending through the membrane portion in an up-down direction, in each of the single crystal piezoelectric material layer and the reinforcing layer, a width of the through slot becomes narrower as the through slot extends downward; and in the single crystal piezoelectric material layer and the reinforcing layer, a maximum width of the through slot in a layer located on a bottom side is smaller than a minimum width of the through slot in a layer located on a top side.

16. The piezoelectric device according to claim 15, wherein in the single crystal piezoelectric material layer and the reinforcing layer, an inclination angle of a bottom-side edge surface of the layer on the bottom side is smaller than an inclination angle of a top-side edge surface of the layer on the top side, the bottom-side edge surface and the top-side edge surface being in contact with the through slot.

17. The piezoelectric device according to claim 15, wherein in the single crystal piezoelectric material layer and the reinforcing layer, an inclination angle of a top-side edge surface of the layer located on the top side is smaller than an inclination angle of a bottom-side edge surface of the layer located on the bottom side, the top-side edge surface and the bottom-side edge surface being in contact with the through slot.

18. The piezoelectric device according to claim 15, wherein the single crystal piezoelectric material layer is made of lithium tantalate or lithium niobate.

19. The piezoelectric device according to claim 15, wherein the reinforcing layer is made of $SiO_2$.

20. The piezoelectric device according to claim 15, wherein the electrode layer is made of Al or Pt.

* * * * *